United States Patent
Lee et al.

(10) Patent No.: US 9,390,961 B2
(45) Date of Patent: Jul. 12, 2016

(54) SEMICONDUCTOR DEVICES HAVING PLUG INSULATORS

(71) Applicant: Samsung Electronics Co., Ltd., Suwon-si, Gyeonggi-do (KR)

(72) Inventors: Mong-Sup Lee, Hwaseong-si (KR); Byoung-Yong Gwak, Suwon-si (KR); Byung-Ho Kwak, Hwaseong-si (KR); Yoon-Kyung Kim, Hwaseong-si (KR); Tae-Joon Park, Hwaseong-si (KR); Byung-Sul Ryu, Hwaseong-si (KR); In-Seak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/481,932

(22) Filed: Sep. 10, 2014

(65) Prior Publication Data
US 2015/0171163 A1 Jun. 18, 2015

(30) Foreign Application Priority Data
Dec. 13, 2013 (KR) .................. 10-2013-0155763

(51) Int. Cl.
*H01L 21/70* (2006.01)
*H01L 21/762* (2006.01)
*H01L 27/108* (2006.01)

(52) U.S. Cl.
CPC ........ *H01L 21/762* (2013.01); *H01L 27/10855* (2013.01); *H01L 27/10885* (2013.01); *H01L 27/10888* (2013.01)

(58) Field of Classification Search
CPC ................. H01L 21/823468; H01L 27/10885
See application file for complete search history.

(56) References Cited

U.S. PATENT DOCUMENTS

| | | | |
|---|---|---|---|
| 5,742,078 A * | 4/1998 | Lee et al. ........................ | 257/202 |
| 6,251,723 B1 | 6/2001 | Takaishi | |
| 6,911,382 B2 | 6/2005 | Jung et al. | |
| 8,133,777 B1 * | 3/2012 | Chiang et al. ................. | 438/199 |
| 2002/0024093 A1 * | 2/2002 | Ahn et al. ....................... | 257/332 |
| 2002/0070392 A1 * | 6/2002 | Ohkubo ............ | H01L 27/10897 257/207 |
| 2004/0099957 A1 * | 5/2004 | Jin ................................ | 257/774 |
| 2005/0079673 A1 * | 4/2005 | Seo et al. ....................... | 438/257 |
| 2009/0004849 A1 * | 1/2009 | Eun ................................ | 438/654 |
| 2010/0285662 A1 * | 11/2010 | Kim ..................... | H01L 21/7682 438/675 |
| 2012/0112339 A1 * | 5/2012 | Park .................. | H01L 21/76834 257/734 |
| 2013/0320549 A1 * | 12/2013 | Lee ..................... | H01L 23/4821 257/773 |

FOREIGN PATENT DOCUMENTS

| | | |
|---|---|---|
| JP | 2000-114481 | 4/2000 |
| JP | 2010-087158 | 4/2010 |
| KR | 1020070079807 A | 8/2007 |
| KR | 1020090066912 A | 6/2009 |

\* cited by examiner

*Primary Examiner* — Thao X Le
*Assistant Examiner* — Laura Dykes
(74) *Attorney, Agent, or Firm* — Myers Bigel & Sibley

(57) ABSTRACT

Provided are a semiconductor device and a method of fabricating the same. The semiconductor device includes a first bit line structure extending in a first direction, a second bit line structure extending in the first direction and spaced apart from the first bit line structure, a storage contact plug located between the first bit line structure and the second bit line structure, and extending in a second direction perpendicular to the first direction, a first plug insulator located between the first bit line structure and the second bit line structure, and configured to contact a side surface extending in the second direction of the storage contact plug, and a plug isolation pattern located between the first bit line structure and the first plug insulator.

18 Claims, 42 Drawing Sheets

4000

5000

SEMICONDUCTOR DEVICES HAVING PLUG INSULATORS

CROSS-REFERENCE TO RELATED APPLICATION

This application claims priority under 35 U.S.C. §119 to Korean Patent Application No. 10-2013-0155763, filed on Dec. 13, 2013, the disclosure of which is hereby incorporated herein by reference in its entirety.

BACKGROUND

Embodiments of the inventive concepts relate to semiconductor devices that include bit line structures and to methods of fabricating such semiconductor devices.

Semiconductor devices include bit line structures. An aspect ratio of the bit line structures may be increased with increasing integration of the semiconductor device. Various techniques are being studied in an effort to reduce the incidence of failures caused by further increases in the aspect ratio of the bit line structures in semiconductor devices.

SUMMARY

Embodiments of the inventive concepts provide semiconductor devices having high aspect ratio bit line structures and methods of fabricating the same where the semiconductor devices may have a reduced tendency for adjacent storage contact plugs to become short circuited.

Other embodiments of the inventive concepts provide semiconductor devices and methods of fabricating the same in which a region in which a plug isolation pattern is not formed is less likely to be filled conductive material due to an increased aspect ratio of bit line structures of the device.

In accordance with an aspect of the inventive concepts, a semiconductor device includes a first bit line structure that extends in a first direction, a second bit line structure that extends in the first direction and that is spaced apart from the first bit line structure, a storage contact plug between the first bit line structure and the second bit line structure, the storage contact plug extending in a second direction that is perpendicular to the first direction, a first plug insulator between the first bit line structure and the second bit line structure, the first plug insulator contacting a side surface of the storage contact plug that extends in the second direction, and a plug isolation pattern between the first bit line structure and the first plug insulator.

In accordance with another aspect of the inventive concept, a semiconductor device includes a first bit line structure on a semiconductor substrate, a second bit line structure spaced apart from the first bit line structure, and having an upper portion bent in the first bit line structure, a plug isolation pattern between the first bit line structure and the second bit line structure, and a plug insulator between the second bit line structure and the plug isolation pattern. The upper surface of the plug isolation pattern is farther above an upper surface of the semiconductor substrate than is an upper surface of the plug insulator.

In accordance with another aspect of the inventive concept, a semiconductor device includes a first bit line structure that extends along an upper surface of a semiconductor substrate in a first direction and that extends upwardly from the upper surface of the semiconductor substrate; a first bit line spacer that extends along a side surface of the first bit line structure in the first direction; and a plug insulator adjacent the first bit line spacer. An upper portion of the first bit line spacer extends at least partly over an upper portion of the plug insulator.

BRIEF DESCRIPTION OF THE DRAWINGS

The foregoing and other features and advantages of the inventive concepts will be apparent from the more particular description of embodiments of the inventive concept provided herein. In the drawings:

FIGS. 4A to 23A and 4B to 23B are cross-sectional views sequentially illustrating a method of fabricating a semiconductor device in accordance with the first embodiment of the inventive concepts;

FIGS. 10C to 23C are plan views taken along lines of FIGS. 10A to 23A and 10B to 23B;

FIGS. 24A to 31A and 24B to 31B are cross-sectional views sequentially illustrating a method of fabricating a semiconductor device in accordance with the second embodiment of the inventive concepts;

DETAILED DESCRIPTION OF THE EMBODIMENTS

Figure 1:
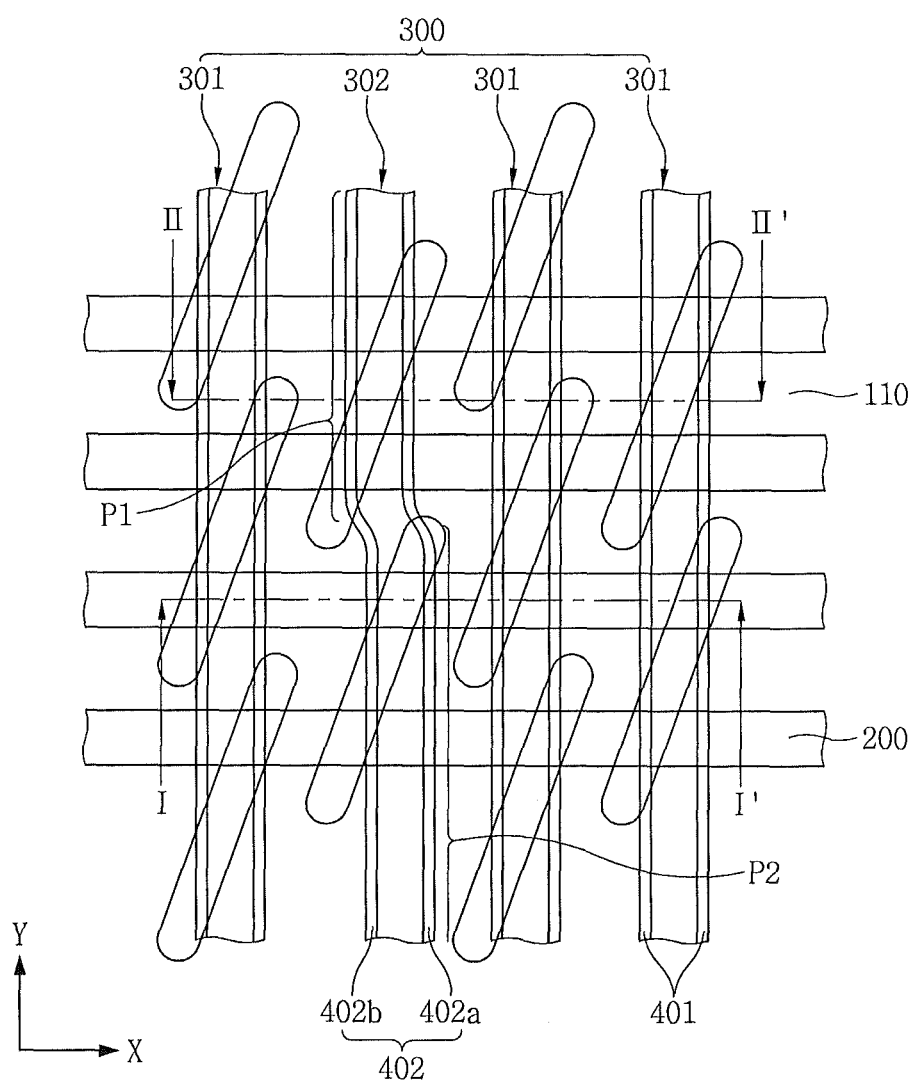
FIG. 1 is a layout diagram illustrating a semiconductor device in accordance with a first embodiment of the inventive concepts.

Structural and functional descriptions regarding example embodiments of the inventive concepts are set forth below. These example embodiments are provided so that this disclosure is thorough and complete and fully conveys the inventive concepts to those skilled in the art. Those of skill in the art will appreciate that the inventive concepts may be implemented in many other ways and should not be construed as limited to the embodiments set forth herein.

Like numerals refer to like elements throughout the drawings and the description below. In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, etc. are used herein in reference to various elements, these elements should not be construed as limited by these terms. These terms are only used to distinguish one element from another element. For example, a first element could be termed a second element, and a second element could be termed a first element, without departing from the scope of the present invention. Herein, the term "and/or" includes any and all combinations of one or more referents.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
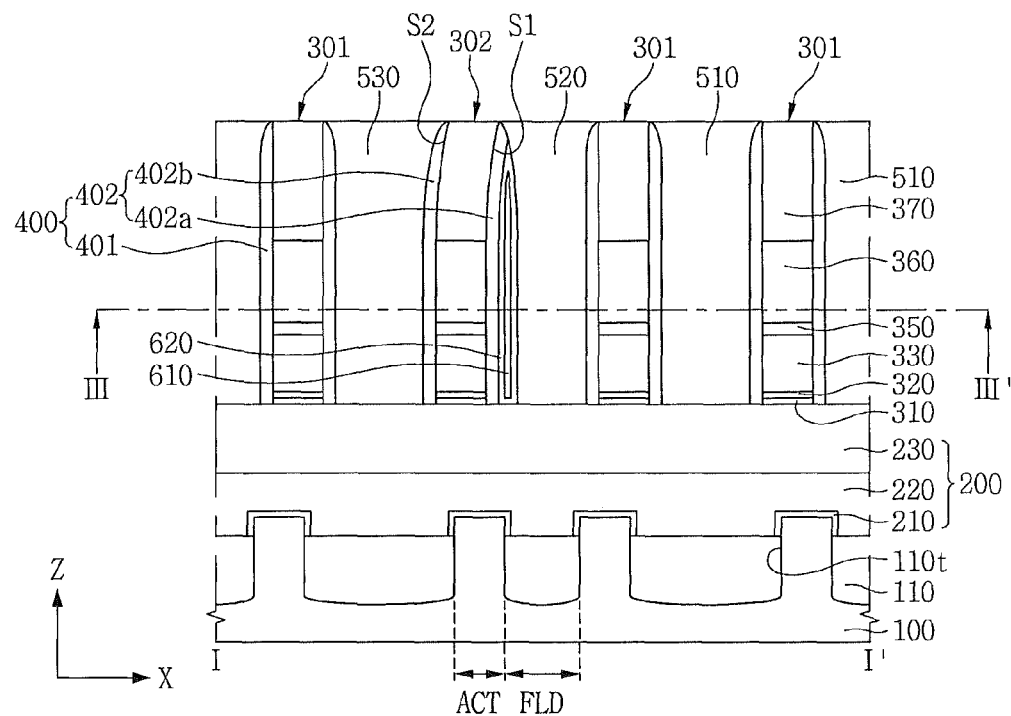
FIG. 2A is a cross-sectional view taken along line I-I' of FIG. 1.
Figure 2B:
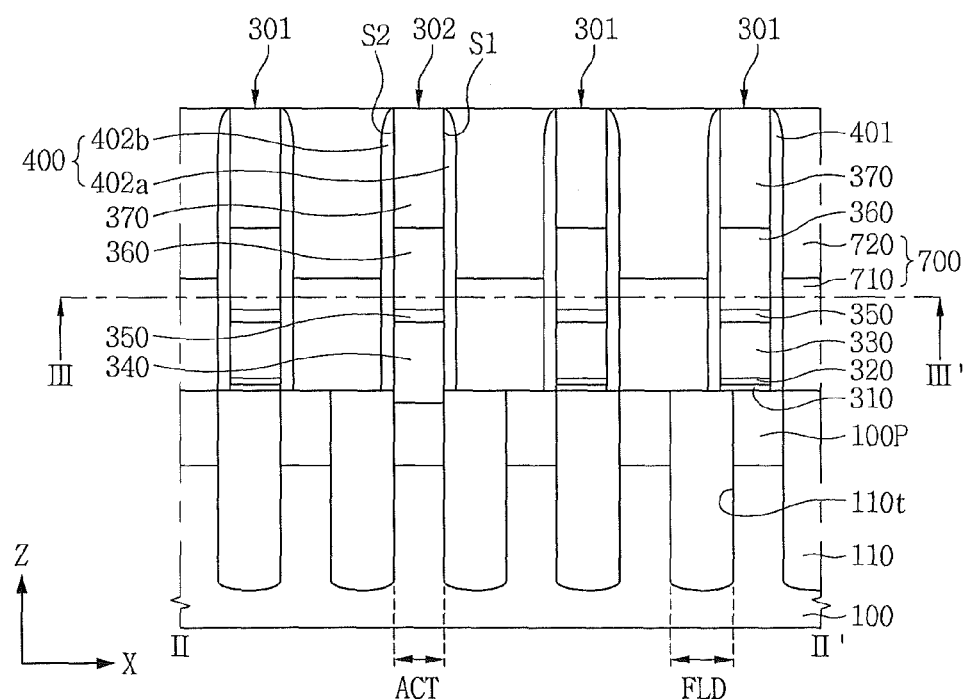
FIG. 2B is a cross-sectional view taken along line II-II' of FIG. 1.
Figure 2C:
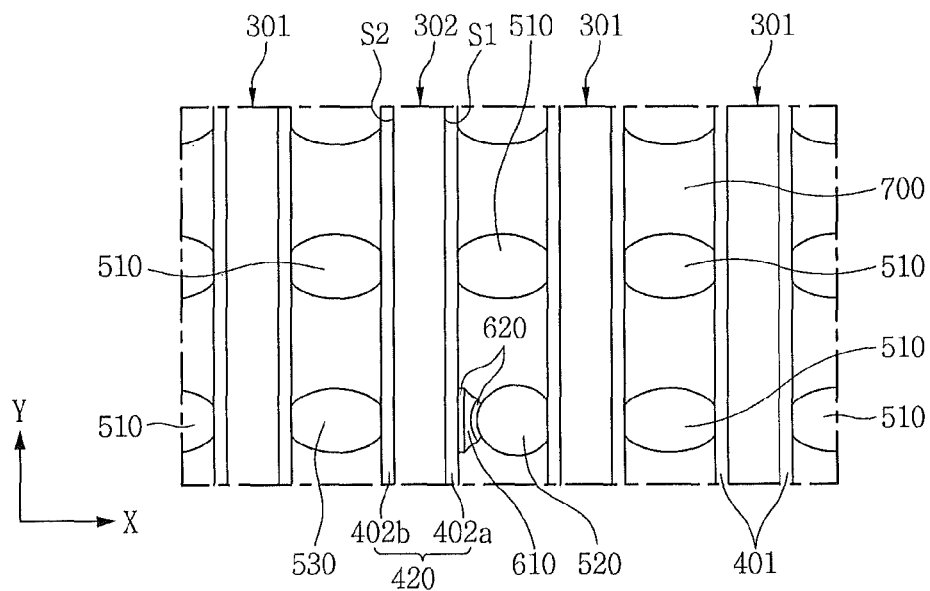
FIG. 2C is a plan view taken along lines of FIGS. 2A and 2B.

FIG. 1 is a layout diagram illustrating a semiconductor device in accordance with an embodiment of the inventive concepts. FIG. 2A is a cross-sectional view taken along line I-I' of FIG. 1. FIG. 2B is a cross-sectional view taken along line II-IP of FIG. 1. FIG. 2C is a plan view taken along lines of FIGS. 2A and 2B.

Referring to FIGS. 1 and 2A to 2C, the semiconductor device may include a semiconductor substrate 100, gate structures 200, bit line structures 300, bit line spacers 400, first plug isolation patterns 510, second plug isolation patterns 520, third plug isolation patterns 530, first plug insulators 610, second plug insulators 620 and storage contact plugs 700.

The semiconductor substrate 100 may comprise, for example, a silicon wafer or a silicon on insulator (SOI) substrate. The semiconductor substrate 100 may include active regions ACT and field regions FLD. The field regions FLD may be connected to each other.

The active regions ACT may be defined by the field regions FLD. The active regions ACT may include impurity regions 100p. The impurity regions 100p may be located at and/or near an upper surface of the semiconductor substrate 100. The impurity regions 100p may include a conductive dopant. For example, the impurity regions 100p may include a P-type dopant.

The field regions FLD may surround the active regions ACT. Each of the field regions FLD may include a field trench 110t and a field insulator 110.

The field trenches 110t may be formed in the semiconductor substrate 100. The field trenches 110t may extend in a Z-axis direction toward a lower surface of the semiconductor substrate 100 from the upper surface of the semiconductor substrate 100. A lower surface of each field trench 110t may be lower in the device structure than the lowermost portion of the impurity regions 100p.

The field insulators 110 may fill the field trenches 110t. Upper surfaces of the field insulators 110 may be coplanar with an upper surface of the semiconductor substrate 100. The field insulators 110 may include an insulating material such as, for example, silicon oxide, Each of the gate structures 200 may serve as a word line of a dynamic random access memory (DRAM). Each of the gate structures 200 may extend in an X-axis direction. Each of the gate structures 200 may be spaced apart from adjacent gate structures 200 in a Y-axis direction.

The gate structures 200 may be located in the semiconductor substrate 100. Upper surfaces of the gate structures 200 may be coplanar with the upper surface of the semiconductor substrate 100. Each of the gate structures 200 may intersect the active regions ACT and the field regions FLD of the semiconductor substrate 100. Lower surfaces of the gate structures 200 may be lower in the device structure than the lowermost portions of the impurity regions 100p. The lower surfaces of the gate structures 200 may be higher in the device structure than the lower surfaces of the field trench 110t.

Each of the gate structures 200 may include a gate insulating layer 210, a gate electrode 220 and a gate capping layer 230.

The gate insulating layer 210 of each gate structure 200 may be on the active regions ACT of the semiconductor substrate 100. The gate insulating layer 210 may be in direct contact with the active regions ACT. The gate insulating layer 210 may include an insulating material such as for example, silicon oxide.

The gate electrode 220 of each gate structure 200 may be on the gate insulating layer 210. The gate electrode 220 may extend in the X-axis direction. The gate electrode 220 may intersect the active regions ACT and the field regions FLD. The gate insulating layer 210 may be between the active regions ACT and the gate electrode 220. An upper surface of the gate electrode 220 may be lower in the device structure than the upper surface of the semiconductor substrate 100. The gate electrode 220 may include a conductive material such as, for example, polysilicon.

The gate capping layer 230 of each gate structure 200 may be on the gate electrode 220. An upper surface of the gate capping layer 230 may be coplanar with the upper surface of the semiconductor substrate 100. The gate capping layer 230 may include an insulating material such as, for example, silicon nitride.

Each of the bit line structures 300 may serve as a bit line of a DRAM. Each of the bit line structures 300 may extend in the Y-axis direction. Each of the bit line structures 300 may be spaced apart from adjacent bit line structures 300 in the X-axis direction.

The bit line structures 300 may be on the semiconductor substrate 100. Each of the bit line structures 300 may cross the gate structures 200. Each of the bit line structures 300 may cross the active regions ACT and the field regions FLD.

Each of the bit line structures 300 may include a lower barrier pattern 310, an upper barrier pattern 320, a lower bit line electrode 330, a DC plug 340, a middle bit line pattern 350, an upper bit line electrode 360 and a bit line capping pattern 370.

Each lower barrier pattern 310 may be on the upper surface of the semiconductor substrate 100. Each lower barrier pattern 310 may extend in the Y-axis direction. Each lower barrier pattern 310 may be in direct contact with the upper surface of the semiconductor substrate 100. Each lower barrier pattern 310 may be in direct contact with the gate capping layer 230. Each lower barrier pattern 310 may include an insulating material such as, for example, silicon oxide.

Each upper barrier pattern 320 may be located on a respective one of the lower barrier patterns 310. Each upper barrier pattern 320 may extend in the Y-axis direction. Each upper barrier pattern 320 may include an insulating material. The upper barrier patterns 320 may include a different insulating material than the lower barrier patterns 310. The materials of the upper barrier patterns 320 and the lower barrier patterns 310 may be selected so that an etch rate of the upper barrier patterns 320 may be different than an etch rate of the lower barrier patterns 310 so that the upper barrier patterns 320 have an etch selectivity with respect to the lower barrier patterns 310. For example, the upper barrier patterns 320 may include silicon nitride while the lower barrier patterns 310 include silicon oxide.

Each lower bit line electrode 330 may be located on a respective one of the upper barrier patterns 320. The lower bit line electrodes 330 may extend in the Y-axis direction. The lower bit line electrodes 330 may include a conductive material such as, for example, polysilicon.

Each DC plug 340 may be located on a respective active region ACT in the semiconductor substrate 100. In particular, each DC plug 340 may be in direct contact with an upper surface of a respective one of the impurity regions 100p. Each DC plug 340 may penetrate the lower barrier pattern 310, the upper barrier pattern 320 and the lower bit line electrode 330 of its respective bit line structure 300.

An upper surface of each DC plug 340 may be coplanar with the upper surfaces of the lower bit line electrodes 330. A side surface of each DC plug 340 may be in direct contact with a respective one of the lower bit line electrodes 330. A lower surface of each DC plug 340 may be below the upper surface of the semiconductor substrate 100.

The DC plugs 340 may include a conductive material. The DC plugs 340 may include the same material as the lower bit line electrodes 330. For example, the DC plugs 340 may include polysilicon.

Middle bit line patterns 350 may be located on the respective lower bit line electrodes 330 and on the DC plugs 340. The middle bit line patterns 350 may extend in the Y-axis direction. The middle bit line patterns 350 may include a conductive material such as, for example, a metal silicide.

The upper bit line electrodes 360 may be on the respective middle bit line patterns 350. The upper bit line electrodes 360 may extend in the Y-axis direction. The upper bit line electrodes 360 may include a conductive material. A conductivity of the upper bit line electrodes 360 may be higher than a conductivity of the lower bit line electrodes 330. For example, the upper bit line electrodes 360 may include a metal such as tungsten.

The bit line capping patterns 370 may be on the respective upper bit line electrodes 360. The bit line capping patterns 370 may extend in the Y-axis direction. The bit line capping patterns 370 may include an insulating material such as, for example, silicon nitride.

The bit line structures 300 may include first bit line structures 301 and at least one second bit line structure 302. In the semiconductor device according to the first example embodiment of the inventive concepts, the bit line structures 300 include a plurality of first bit line structures 301 and one second bit line structure 302. However, it will be appreciated that the bit line structures 300 may include a plurality of first bit line structures 301 and a plurality of second bit line structures 302 in other embodiments, Side surfaces of upper portions of each of the first bit line structures 301 may be vertically aligned (i.e., aligned in the Z-axis direction) with side surfaces of lower portions of the corresponding first bit line structures 301. For example, side surfaces of bit line capping pattern 370 of each of the first bit line structures 301 may be vertically aligned with side surfaces of lower bit line electrode 330 of the corresponding first bit line structures 301, as shown in FIGS. 2A and 2B.

The second bit line structure 302 may be located next to at least one of the first bit line structures 301. As shown in FIG. 1, the second bit line structure 302 may include a first portion P1 and a second portion P2.

The first portion P1 may be a region in which side surfaces of an upper portion of the second bit line structure 302 are vertically aligned with side surfaces of a lower portion of the second bit line structure 302. For example, side surfaces of the bit line capping pattern 370 of the second bit line structure 302 may be vertically aligned with side surfaces of the lower bit line electrode 330 of the second bit line structure 302 in the first portion P1.

The second portion P2 may be a region in which the upper portion of the second bit line structure 302 is bent in a direction of a first bit line structure 301 that is adjacent thereto. For example, the bit line capping pattern 370 of the second bit line structure 302 may be bent in a direction of an adjacent first bit line structure 301 in the second portion P2. In other words, in the second portion P2, an upper portion of the of the second bit line structure 302 may lean toward an adjacent first bit line structure 301.

The second bit line structure 302 may include a first side surface S1 and a second side surface S2. The second side surface S2 is opposite the first side surface S1. In the example embodiment depicted in FIGS. 2A-2C, in the second portion P2, the bit line capping pattern 370 of the second bit line structure 302 is bent toward the first bit line structure 301 that faces the first side surface S1, as shown in FIG. 2A.

The bit line spacers 400 may be located on side surfaces of the bit line structures 300. The bit line spacers 400 may extend along the side surfaces of the bit line structures 300. Each of the bit line spacers 400 may extend in the Y-axis direction. The bit line spacers 400 may include an insulating material, which may be the same as the material which forms the bit line capping pattern 370. For example, the bit line spacers 400 may include silicon nitride.

The bit line spacers 400 may include first bit line spacers 401 and second bit line spacers 402. The first bit line spacers 401 may be on side surfaces of the first bit line structures 301, and the second bit line spacers 402 may be on side surfaces of the second bit line structure 302.

The second bit line spacers 402 may include a first side surface spacer 402a and a second side surface spacer 402b. The first side surface spacer 402a may be on the first side surface S1 of the second bit line structure 302 and the second side surface spacer 402b may be on the second side surface S2 of the second bit line structure 302.

In the first portion P1 of the second bit line structure 302, a profile of the first side surface spacer 402a that is on the first side surface S1 may be symmetrical with a profile of the second side surface spacer 402b that is on the second side surface S2. In contrast, in the second portion P2 of the second bit line structure 302, an upper portion of the first side surface spacer 402a may be bent (i.e., leans) toward an adjacent first bit line structure 301, and an upper portion of the second side surface spacer 402b may lean in the same direction. In the example embodiment depicted in FIGS. 2A-2C, in the second portion P2, the upper portion of the first side surface spacer 402a and the upper portion of the second side surface spacer 402b lean towards the first bit line structure 301 that faces the first side surface S1.

A profile of the upper portion of the first side surface spacer 402a in the second portion P2 may be different from a profile of the upper portion of the first side surface spacer 402a in the first portion P1. A profile of the upper portion of the second side surface spacer 402b in the second portion P2 may be different from a profile of the upper portion of the second side surface spacer 402b in the first portion P1.

In the second portion P2, the profile of the first side surface spacer 402a may not be symmetric with a profile of the second side surface spacer 402b. For example, in the second portion P2, a length in the X-axis direction of the upper portion of the first side surface spacer 402a may be greater than a length in the X-axis direction of the upper portion of the second side surface spacer 402b.

The first plug isolation patterns 510 may be located on the gate structures 200. Each of the first plug isolation patterns 510 may directly contact the gate capping layer 230 of the gate structures 200. The lower surfaces of the first plug isolation patterns 510 may be directly on the upper surfaces of the semiconductor substrate 100. The upper surfaces of the first plug isolation patterns 510 may be coplanar with upper surfaces of the bit line structures 300.

The first plug isolation patterns 510 may be located between the first bit line structures 301. The first plug isolation patterns 510 may be located between the first bit line spacers 401. The first plug isolation patterns 510 may directly contact the first bit line spacers 401.

As shown in FIG. 2C, in the first portion P1, first plug isolation patterns 510 may be provided between the first side surface spacer 402a and one of the first bit line spacers 401. Similarly, in the first portion P1, first plug isolation patterns 510 may be provided between the second side surface spacer 402b and one of the first bit line spacers 401. These first plug isolation patterns 510 may directly contact the first side surface spacer 402a or the second side surface spacer 402b in the first portion P1.

Each of the first plug isolation patterns 510 may extend in the X-axis direction. As shown in FIG. 2C, side surfaces extending along the X-axis direction of each of the first plug isolation patterns 510 may be symmetrical and may have a convex shape.

The first plug isolation patterns 510 may include an insulating material, which may be the same insulating material that is included in the bit line spacers 400. For example, the first plug isolation patterns 510 may include silicon nitride.

The second plug isolation patterns 520 may be located on the gate structures 200. Each of the second plug isolation patterns 520 may directly contact the gate capping layer 230 of the gate structures 200. Lower surfaces of the second plug isolation patterns 520 may directly contact the upper surface of the semiconductor substrate 100. The lower surfaces of the second plug isolation patterns 520 may be coplanar with lower surfaces of the first plug isolation patterns 510.

A height in the Z-axis direction of each of the second plug isolation patterns 520 may be the same as a height in the Z-axis direction of each of the first plug isolation patterns 510. The upper surfaces of the second plug isolation patterns 520 may be coplanar with the upper surfaces of the first plug isolation patterns 510 and/or with upper surfaces of the bit line structures 300.

The second plug isolation patterns 520 may be provided adjacent the second bit line structure 302 in the second portion P2 of the second bit line structure 302. The second plug isolation patterns 520 may be between the first side surface S1 of the second bit line structure 302 and an adjacent first bit line structure 301. In particular, the second plug isolation patterns 520 may be between the first side surface spacer 402a and the first bit line spacer 401 that is on the adjacent first bit line structure 301 that faces the first side surface spacer 402a.

Each of the second plug isolation patterns 520 may directly contact the first bit line spacer 401. As shown in FIG. 2A, lower and middle portions of each of the second plug isolation patterns 520 may be spaced apart from the first side surface spacer 402a. As is also shown in FIG. 2A, upper portions of each of the second plug isolation patterns 520 may contact the first side surface spacer 402a.

As shown in FIGS. 2A and 2C, a length of each the second plug isolation patterns 520 in the X-axis direction may be smaller than a length of the first plug isolation patterns 510 in the X-axis direction when compared at the same height in the Z-axis direction.

Each of the second plug isolation patterns 520 may extend in the X-axis direction. As shown in FIG. 2C, side surfaces extending along the X-axis direction of each of the second plug isolation patterns 520 may be symmetrical and may have a convex shape.

A profile of the side surfaces extending along the X-axis direction of each of the second plug isolation patterns 520 may be different from the profile of the side surfaces extending along the X-axis direction of each of the first plug isolation patterns 510 due to the fact that the second plug isolation patterns 520 include portions that are spaced apart from the first side surface spacer 402a.

The second plug isolation patterns 520 may include an insulating material, which may be the same material that is included in the first plug isolation patterns 510. For example, the second plug isolation patterns 520 may include silicon nitride.

The third plug isolation patterns 530 may be on the gate structures 200. Each of the third plug isolation patterns 530 may directly contact the gate capping layer 230 of each of the gate structures 200. Lower surfaces of the third plug isolation patterns 530 may directly contact the upper surface of the semiconductor substrate 100. Lower surfaces of the third plug isolation patterns 530 may be coplanar with lower surfaces of the second plug isolation patterns 520.

A height in the Z-axis direction of each of the third plug isolation patterns 530 may be the same as a height in the Z-axis direction of each of the second plug isolation patterns 520. Upper surfaces of the third plug isolation patterns 530 may be coplanar with the upper surfaces of the second plug isolation patterns 520 and/or with upper surfaces of the bit line structures 300.

The third plug isolation patterns 530 may be adjacent the second bit line structure 302 in the second portion P2 of the second bit line structure 302. The third plug isolation patterns 530 may be between the second side surface S2 of the second bit line structure 302 and an adjacent first bit line structure 301. In particular, the third plug isolation patterns 530 may be between the second side surface spacer 402b and the first bit line spacer 401 that is on the adjacent first bit line structure 301 that faces the second side surface spacer 402b.

Each of the third plug isolation patterns 530 may directly contact the first bit line spacer 401. Each of the third plug isolation patterns 530 may directly contact the second side surface spacer 402b.

Each of the third plug isolation patterns 530 may extend in the X-axis direction. As shown in FIG. 2C, side surfaces extending along the X-axis direction of each of the third plug isolation patterns 530 may be symmetrical and may have a convex shape.

A profile of the side surfaces extending along the X-axis direction of an upper portion of the third plug isolation patterns 530 may be different from the profile of the side surfaces extending along the X-axis direction of upper portions of the first plug isolation patterns 510. In contrast, the profile of side surfaces extending along the X-axis direction of lower portions of the third plug isolation patterns 530 may be the same as the profile of the side surfaces extending along the X-axis direction of lower portions of the first plug isolation patterns 510.

The third plug isolation patterns 530 may include an insulating material, which may be the same material that is included in the second plug isolation patterns 520. For example, the third plug isolation patterns 530 may include silicon nitride.

The first plug insulators 610 may be located on the gate structures 200. The first plug insulators 610 may be spaced apart from the gate structures 200. In particular, the lower surfaces of the first plug insulators 610 may be spaced above the upper surfaces of the gate structures 200. The lower surfaces of the first plug insulators 610 may be spaced above the upper surface of the semiconductor substrate 100.

The first plug insulators 610 may be between the second bit line structure 302 and the second plug isolation patterns 520. Each of the first plug insulators 610 may be between the first side surface spacer 402a and one of the second plug isolation patterns 520. Upper surfaces of the first plug insulators 610 may be below the upper surfaces of the second plug isolation patterns 520 and may be below the upper surfaces of the bit line structures 300.

The first plug insulators 610 may be spaced apart from the first side surface spacer 402a. Each of the first plug insulators 610 may be spaced apart from the second plug isolation pattern 520. A distance in the X-axis direction between the second plug isolation pattern 520 and an adjacent first plug insulator 610 may be the same as a distance in the X-axis direction between the first side surface spacer 402a and the first plug insulator 610. The distance in the X-axis direction between the first side surface spacer 402a and the first plug insulator 610 may be the same as a distance in the Z-axis direction between the first plug insulator 610 and the upper surface of the semiconductor substrate 100.

A length in the X-axis direction of an upper portion of each of the first plug insulators 610 may be smaller than a length in the X-axis direction of a lower portion of each of the first plug insulators 610. A length in the Y-axis direction of a side surface of a representative one of the first plug insulators 610 that faces the second bit line structure 302 may exceed a length in the Y-axis direction of a side surface of the first plug insulator 610 that faces the second plug isolation pattern 520.

A profile of side surfaces of each of the first plug insulators 610 extending along the X-axis direction may be symmetrical, but may be different from the profile of side surfaces of the second plug isolation patterns 520 extending along the X-axis direction at the same level. For example, the profile of the side surfaces extending along the X-axis direction of each of the first plug insulators 610 at a Z-axis direction height corresponding to a lower surface of the upper bit line electrode 360 of the second bit line structure 302 may have a concave shape.

The first plug insulators 610 may include an insulating material, which may be the same material included in the second plug isolation patterns 520. For example, the first plug insulators 610 may include silicon nitride.

The second plug insulators 620 may be on the gate structures 200. The second plug insulators 620 may directly contact the gate capping layers 230 of the gate structures 200. Lower surfaces of the second plug insulators 620 may be directly on the upper surface of the semiconductor substrate 100. The lower surface of the second plug insulators 620 may be coplanar with the upper surfaces of the gate structures 200.

Each second plug insulator 620 may directly contact one of the first plug insulators 610. The second plug insulators 620 may be between the gate structures 200 and the first plug insulators 610. A space between the gate structures 200 and the first plug insulators 610 may be filled by the second plug insulators 620.

The second plug insulators 620 may be between the first side surface spacer 402a and the first plug insulators 610. Each of the second plug insulators 620 may directly contact the first side surface spacer 402a. Side surfaces of the first side surface spacer 402a that faces the second plug isolation patterns 520 may be covered by the second plug insulators 620. A space between the first side surface spacer 402a and the first plug insulators 610 may be filled by the second plug insulators 620.

The second plug insulators 620 may be located between the second plug isolation patterns 520 and the first plug insulators 610. The second plug insulators 620 may directly contact the second plug isolation patterns 520. Side surfaces of the second plug isolation patterns 520 that face the first side surface S1 of the second bit line structure 302 may be covered by the second plug insulators 620. Spaces between the second plug isolation pattern 520 and the first plug insulators 610 may be filled by the second plug insulators 620.

In the semiconductor device in accordance with the first example embodiment of the inventive concepts, the first plug insulators 610 and the second plug insulators 620 may be located between the first side surface spacer 402a and the second plug isolation pattern 520. Accordingly, regions underneath the bent upper portion of the second bit line structure 302 may be filled by the first plug insulators 610 and the second plug insulators 620.

The upper surface of the second plug insulators 620 may be higher (i.e., extend farther upward in the Z-axis direction) than the upper surfaces of the first plug insulators 610. The upper surfaces of the second plug insulators 620 may be lower than the upper surfaces of the second plug isolation patterns 520. The upper surfaces of the second plug insulators 620 may be lower than the upper surfaces of the bit line structures 300.

A profile of side surfaces extending along the X-axis direction of each of the second plug insulators 620 may be symmetrical and may have a concave shape. The profile of side surfaces extending along the X-axis direction of the second plug insulators 620 may be different from the profile of side surfaces extending along the X-axis direction of the second plug isolation patterns 520 at the same level in the Z-axis direction.

The second plug insulators 620 may include an insulating material. An etch rate of the second plug insulators 620 may be different than an etch rate of the first plug insulators 610. Accordingly, the second plug insulators 620 may have an etch selectivity with respect to the first plug insulators 610. For example, the second plug insulators 620 may include silicon oxide.

The storage contact plugs 700 are provided on the semiconductor substrate 100. The storage contact plugs 700 may be between the bit line structures 300. The storage contact plugs 700 may be between the bit line spacers 400. Each storage contact plug 700 may be surrounded by some combination of the the bit line spacers 400, the first plug isolation patterns 510, the second plug isolation patterns 520, the third plug isolation patterns 530, the first plug insulators 610 and the second plug insulators 620.

The storage contact plugs 700 may directly contact the bit line spacers 400. Each storage contact plug 700 may directly contact at least one of a first plug isolation pattern 510, a second plug isolation pattern 520 and a third plug isolation pattern 530. Some of the storage contact plugs 700 may directly contact a first plug insulator 610 and a second plug insulator 620. Locations of the storage contact plugs 700 may be defined by one or more of the bit line spacers 400, the first plug isolation patterns 510, the second plug isolation patterns 520, the third plug isolation patterns 530, the first plug insulators 610 and the second plug insulators 620.

Each of the storage contact plugs 700 may include a lower contact plug 710 and an upper contact plug 720.

The lower contact plug 710 may be located near the upper surface of the semiconductor substrate 100. The lower contact plug 710 may directly contact the active region ACT of the semiconductor substrate 100. The lower surface of the lower contact plug 710 may be coplanar with the upper surface of the semiconductor substrate 100.

The upper surfaces of the lower contact plugs 710 may be lower than the upper surfaces of the bit line structures 300. In the depicted embodiment, the upper surfaces of the lower contact plugs 710 are lower than the upper surfaces of the upper bit line electrodes 360 and higher than the lower surfaces of the upper bit line electrodes 360.

The lower contact plug 710 may include a conductive material such as, for example, polysilicon.

Each upper contact plug 720 may be directly on a lower contact plug 710. The upper surface of the upper contact plug 720 may be coplanar with the upper surfaces of the first plug isolation patterns 510, the second plug isolation patterns 520, the third plug isolation patterns 530 and the bit line structures 300.

The upper contact plug 720 may include a conductive material. An etch rate of the upper contact plug 720 may be different than an etch rate of the lower contact plug 710. The upper contact plug 720 may have a higher conductivity than the lower contact plug 710. For example, the upper contact plug 720 may include a metal such as tungsten.

Figure 3A:
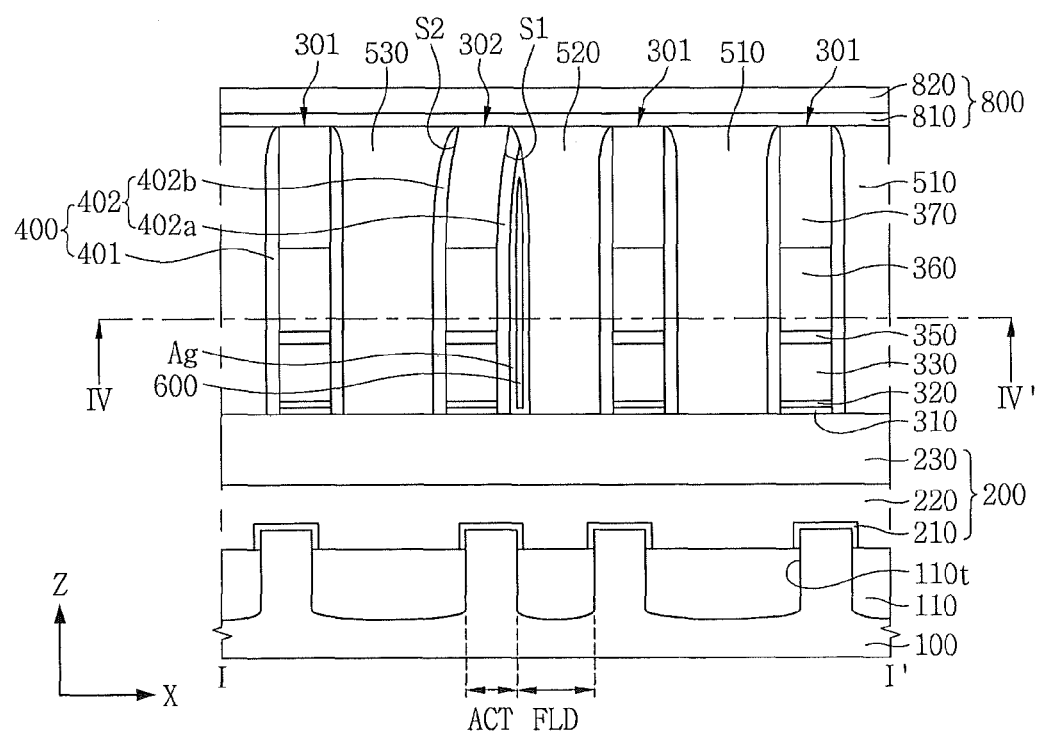
FIGS. 3A and 3B are cross-sectional views illustrating a semiconductor device in accordance with a second embodiment of the inventive concepts.
Figure 3B:
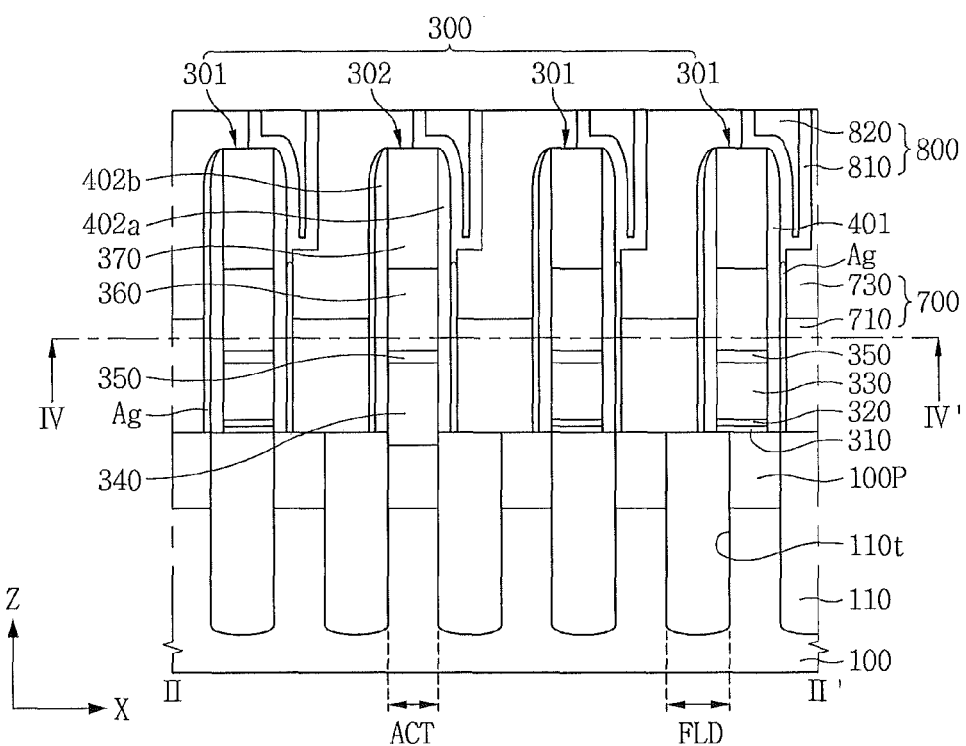
Figure 3C:
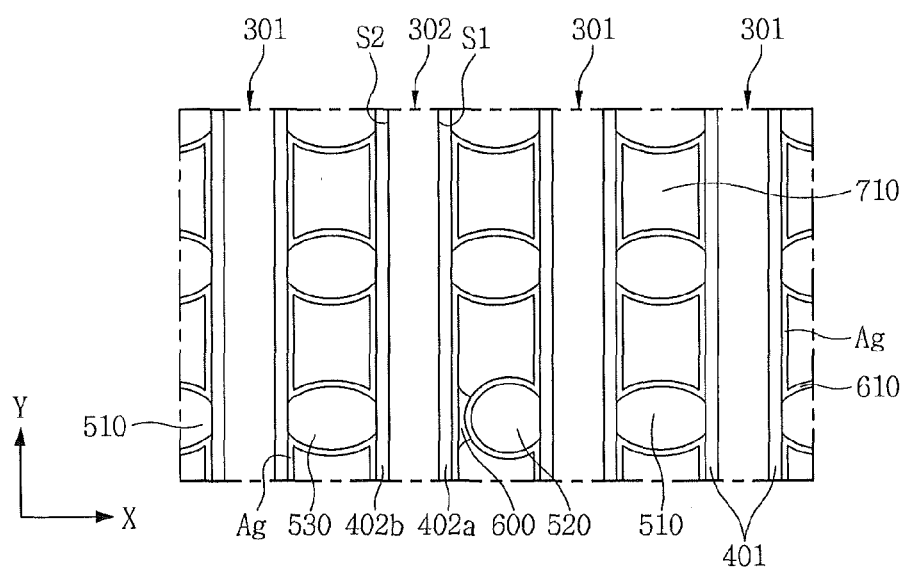
FIG. 3C is a plan view taken along lines of FIGS. 3A and 3B.
Figure 4A:
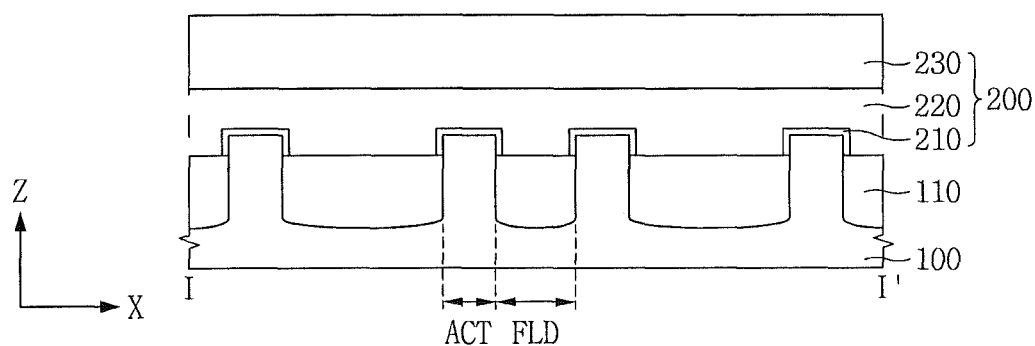
Figure 4B:
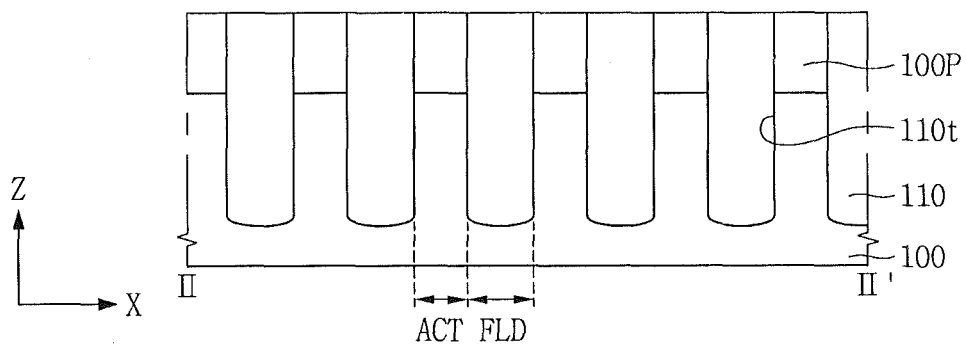

FIGS. 3A and 3B are cross-sectional views illustrating a semiconductor device in accordance with an embodiment of the inventive concepts. FIG. 3C is a plan view taken along lines IV-IV' of FIGS. 3A and 3B.

Referring to FIGS. 3A to 3C, the semiconductor device may include a semiconductor substrate 100, gate structures 200, bit line structures 300, bit line spacers 400, first plug isolation patterns 510, second plug isolation patterns 520, third plug isolation patterns 530, plug insulators 600, storage contact plugs 700 and interlayer insulating patterns 800.

The semiconductor substrate 100 may include active regions ACT and field regions FLD. The active regions ACT may include impurity regions 100p. Each field region FLD may include a field trench 110t and a field insulator 110.

Each of the gate structures 200 may include a gate insulating layer 210, a gate electrode 220 and a gate capping layer 230. Each of the bit line structures 300 may include a lower barrier pattern 310, an upper barrier pattern 320, a lower bit line electrode 330, a DC plug 340, a middle bit line pattern 350, an upper bit line electrode 360 and a bit line capping pattern 370.

The bit line structures 300 may include first bit line structures 301 and a second bit line structure 302. The second bit line structure 302 may include a first portion P1 and a second portion P2. The second bit line structure 302 may include a first side surface S1 and a second side surface S2. An upper portion of the second bit line structure 302 in the second portion P2 may be bent in a direction of an adjacent first bit line structure 301 that faces the first side surface S1 of the second bit line structure 302.

The bit line spacers 400 may include first bit line spacers 401 and second bit line spacers 402. The second bit line spacers 402 may include a first side surface spacer 402a and a second side surface spacer 402b.

The plug insulators 600 may be located on the gate structures 200. The plug insulators 600 may be spaced apart from the gate structures 200. Lower surfaces of the plug insulators 600 may be higher in the device structure (i.e., a greater distance above a bottom surface of the semiconductor substrate 100) than the upper surfaces of the gate structures 200. The lower surfaces of the plug insulators 600 may be higher in the device structure than the upper surface of the semiconductor substrate 100.

Spaces between the plug insulators 600 and the gate structures 200 may be empty. In other words, air gaps Ag may be provided between the plug insulators 600 and the gate structures 200.

Each of the plug insulators 600 may be between the first side surface spacer 402a and one of the second plug isolation patterns 520. The upper surfaces of the plug insulators 600 may be lower in the device structure than the upper surfaces of the second plug isolation patterns 520 and/or upper surfaces of the bit line structures 300.

The plug insulators 600 may be spaced apart from the first side surface spacer 402a. A distance in the X-axis direction between the first side surface spacer 402a and the plug insulators 600 may be the same as a distance in the Z-axis direction between the gate structures 200 and the plug insulators 600.

An air gap Ag is provided between the first side surface spacer 402a and each plug insulator 600. The air gap Ag that is between the first side surface spacer 402a and the plug insulators 600 may be connected to the air gap Ag that is between the plug insulators 600 and the gate structures 200.

The plug insulators 600 may also be spaced apart from the second plug isolation patterns 520. A distance in the X-axis direction between the second plug isolation pattern 520 and an adjacent plug insulator 600 may be same as the distance in the X-axis direction between the first side surface spacer 402a and the plug insulator 600.

An air gap Ag is provided between each second plug isolation pattern 520 and its corresponding plug insulator 600. The air gap Ag between the second plug isolation patterns 520 and the plug insulators 600 may be connected to the air gap Ag that is between the first side surface spacer 402a and the plug insulators 600.

A side surface of each plug insulator 600 that faces the second bit line structure 302 may be longer in the Y-axis direction as compared to an opposite side surface of the plug insulator 600 that faces the corresponding second plug isolation pattern 520. A length in the X-axis direction of an upper portion of each of the plug insulators 600 may be smaller than a length in the X-axis direction of a lower portion of each of the plug insulators 600.

A profile of side surfaces extending in the X-axis direction of each of the plug insulators 600 may be symmetrical, and may be different from the profile of the side surfaces extending in the X-axis direction of the second plug isolation patterns 520 at the same level in the Z-axis direction. For example, the profile of the side surfaces extending in the X-axis direction of each of the plug insulators 600 may have a concave shape.

The storage contact plugs 700 may be on the semiconductor substrate 100. The storage contact plugs 700 may be surrounded by the bit line spacers 400, various of the first, second and/or third plug isolation patterns 510, 520, 530, the plug insulators 600 and the air gaps Ag.

The storage contact plugs 700 may be spaced apart from the bit line spacers 400. A distance in the X-axis direction between the bit line spacers 400 and adjacent storage contact plugs 700 may be the same as the distance in the X-axis direction between the first side surface spacer 402a and the plug insulators 600. Side surfaces of the storage contact plugs 700 that face the first side surface spacer 402a may be horizontally aligned with side surfaces of the plug insulators 600 that face the first side surface spacer 402a in Y-axis direction.

Spaces between the bit line spacers 400 and the storage contact plugs 700 may be empty. In other words, air gaps Ag may be located between the bit line spacers 400 and the storage contact plugs 700. The air gap Ag located between the first side surface spacer 402a and the storage contact plugs 700 may be connected to the air gap Ag located between the first side surface spacer 402a and the plug insulators 600.

The storage contact plugs 700 may be spaced apart from the first plug isolation pattern 510. A distance in the Y-axis direction between the first plug isolation patterns 510 and the storage contact plugs 700 may be the same as the distance in the X-axis direction between the bit line spacers 400 and the storage contact plugs 700.

Air gaps may be provided between the first plug isolation patterns 510 and the storage contact plugs 700.

The air gap Ag located between each first plug isolation pattern 510 and an adjacent storage contact plug 700 may be connected to the air gap Ag located between the first bit line spacers 401 and the storage contact plug 700. The air gap Ag located between each first plug isolation pattern 510 and an adjacent storage contact plug 700 may also be connected to the air gap Ag located between the first side surface spacer 402a and the storage contact plug 700. The air gap Ag located between the first plug isolation patterns 510 and the storage contact plugs 700 may be connected to the air gap Ag located between the second side surface spacer 402b and the storage contact plugs 700.

The storage contact plugs 700 may be spaced apart from the second plug isolation patterns 520. A distance in the Y-axis direction between the second plug isolation patterns 520 and the storage contact plugs 700 may be the same as the distance in the Y-axis direction between the first plug isolation patterns 510 and the storage contact plugs 700.

Air gaps may be provided between the second plug isolation patterns 520 and the storage contact plugs 700.

The air gaps Ag located between the second plug isolation patterns 520 and the storage contact plugs 700 may be connected to the air gaps Ag located between the second plug isolation patterns 520 and the plug insulators 600. The air gaps Ag located between the second plug isolation patterns 520 and the storage contact plugs 700 may be connected to the air gaps Ag located between the first bit line spacers 401 and the storage contact plugs 700.

The storage contact plugs 700 may be spaced apart from the third plug isolation patterns 530. A distance in the Y-axis direction between the third plug isolation patterns 530 and the storage contact plugs 700 may be the same as a distance in the Y-axis direction between the first plug isolation pattern 510 and the storage contact plugs 700.

Air gaps may be provided between the third plug isolation patterns 530 and the storage contact plugs 700. The air gaps Ag located between the third plug isolation patterns 530 and the storage contact plugs 700 may be connected to the air gaps Ag located between the first bit line spacers 401 and the storage contact plugs 700. The air gaps Ag located between the third plug isolation patterns 530 and the storage contact plugs 700 may be connected to the air gaps Ag located between the second side surface spacer 402b and the storage contact plugs 700.

The storage contact plugs 700 may directly contact the plug insulators 600. In particular, the side surfaces of the plug insulators 600 that extend in the X-axis direction may directly contact respective ones of the storage contact plugs 700.

Each of the storage contact plugs 700 may include a lower contact plug 710 and an upper contact plug 730.

A lower surface of each lower contact plug 710 may be near or directly contacting the upper surface of the semiconductor substrate 100. The upper surface of each lower contact plug 710 may be lower than the upper surfaces of the upper bit line electrodes 360.

Each upper contact plug 730 may be on a respective one of the lower contact plugs 710. The upper surface of each upper contact plug 730 may be higher than the upper surfaces of the bit line capping patterns 370. For example, an upper surface of the bit line capping pattern 370 may be partially covered by a respective one of the upper contact plugs 730.

The upper contact plugs 730 may extend along one side surface of each of the bit line structures 300. The upper contact plugs 730 may also extend to the upper surfaces of the corresponding bit line structure 300 along a left side surface of each of the bit line structures 300. The upper surface of the air gap Ag that is on the left side surface of each of the bit line structures 300 may be coplanar with the upper surface of the bit line structures 300.

The bit line spacer 400 located on the other side surface of each of the bit line structures 300 may only be partially covered by a respective one of the upper contact plugs 730. In particular, the upper contact plug 730 may expose an upper portion of the bit line spacer 400 that is on a right side surface of each of the bit line structures 300. The upper surface of the air gap Ag located on the right side surface of each of the bit line structures 300 may be lower than the upper surface of the bit line structures 300.

The interlayer insulating patterns 800 may be between adjacent storage contact plugs 700. Each of the interlayer insulating patterns 800 may surround the upper contact plug 730 of each of the storage contact plugs 700.

Each of the interlayer insulating patterns 800 may cover the portion of the above-described bit line spacers 400 that are exposed by the upper contact plugs 730. For example, the upper portion of the bit line spacer 400 located on the right side surface of each of the bit line structures 300 may be covered by the interlayer insulating patterns 800. The upper surface of the air gap Ag located on the right side surface of each of the bit line structures 300 may be defined by a lower surface of each interlayer insulating pattern 800.

The upper surfaces of the interlayer insulating patterns 800 may be coplanar with the upper surfaces of the storage contact plugs 700. The interlayer insulating patterns 800 may be on the first plug isolation patterns 510, the second plug isolation patterns 520 and the third plug isolation patterns 530. Upper surfaces of the bit line structures 300 which are not covered by the upper contact plugs 730 may be covered by the interlayer insulating patterns 800.

Each of the interlayer insulating patterns 800 may include a lower insulating pattern 810 and an upper insulating pattern 820.

The lower insulating pattern 810 may extend along an upper surface of the corresponding bit line structure 300, a side surface of the corresponding bit line spacer 400 and a side surface of the corresponding upper contact plug 730. A thickness of each of the lower insulating patterns 810 that is on a side surface of each of the upper contact plugs 730 may be the same as a thickness of each of the lower insulating patterns 810 that is on the upper surface of the respective bit line structures 300.

The lower insulating pattern 810 may include an insulating material. For example, the lower insulating pattern 810 may include silicon nitride.

The upper insulating pattern 820 may be located on the lower insulating pattern 810. The upper insulating pattern 820 may fill a space between vertical regions of the lower insulating pattern 810.

The upper insulating pattern 820 may include an insulating material. For example, the upper insulating pattern 820 may include silicon nitride. The upper insulating pattern 820 may be harder than the lower insulating pattern 810.

FIGS. 4A to 23A and 4B to 23B are cross-sectional views sequentially illustrating a method of fabricating a semiconductor device in accordance with an embodiment of the inventive concepts. FIGS. 10C to 23C are plan views taken along lines of FIGS. 10A to 23A and 10B to 23B.

The method of fabricating a semiconductor device in accordance with an embodiment of the inventive concepts will now be explained with reference to FIGS. 1, 2A to 2C, 4A to 23A, 4B to 23B and 10C to 23C. First, referring to FIGS. 4A and 4B, the method of forming the semiconductor device may include a process of forming gate structures 200 in a semiconductor substrate 100 that includes active regions ACT and field regions FLD.

The process of forming the gate structures 200 in the semiconductor substrate 100 may include a process of preparing the semiconductor substrate 100 including the active regions ACT and the field regions FLD, a process of forming a trench for the gate structures 200 in the semiconductor substrate 100, a process of forming a gate insulating layer 210 in the trench, a process of forming a gate electrode 220 on the gate insulating layer 210 and a process of forming a gate capping layer 230 on the gate electrode 220.

The process of preparing the semiconductor substrate 100 that includes the active regions ACT and the field regions FLD may include a process of forming field trenches 110t in the semiconductor substrate 100 and a process of filling the field trenches 110t with field insulators 110. For example, the process of filling the field trenches 110t with field insulators 110 may include a process of filling the field trenches 110t with silicon oxide.

The process of preparing the semiconductor substrate 100 including the active regions ACT and the field regions FLD may include a process of forming impurity regions 100p by doping a conductive dopant into the active regions ACT of the semiconductor substrate 100.

The process of forming the gate insulating layer 210 may include a process of forming the gate insulating layer 210 with an insulating material. For example, the process of forming the gate insulating layer 210 may include a process of oxidizing the semiconductor substrate 100.

The process of forming the gate electrode 220 may include a process of forming the gate electrode 220 with a conductive material. For example, the process of forming the gate electrode 220 may include a process of forming the gate electrode 220 with polysilicon.

The process of forming the gate capping layer 230 may include a process of forming the gate capping layer 230 with an insulating material. For example, the process of forming the gate capping layer 230 may include a process of forming the gate capping layer 230 with silicon nitride.

Figure 5A:
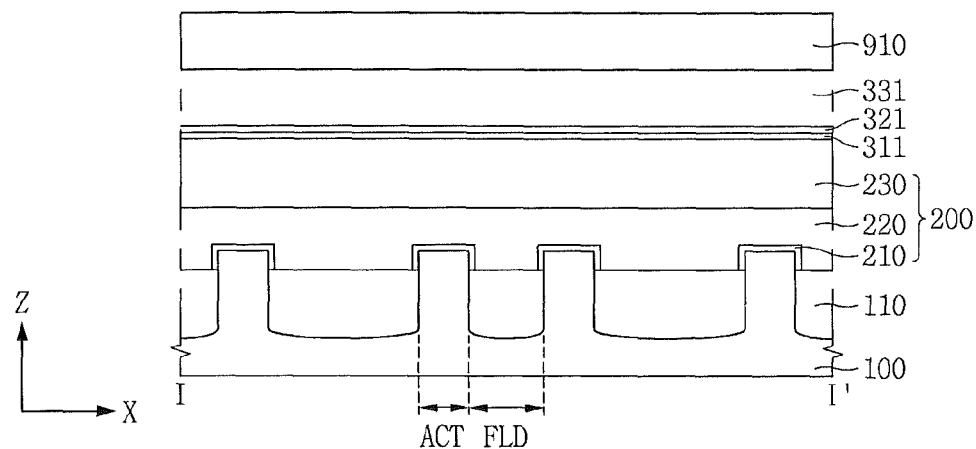
Figure 5B:
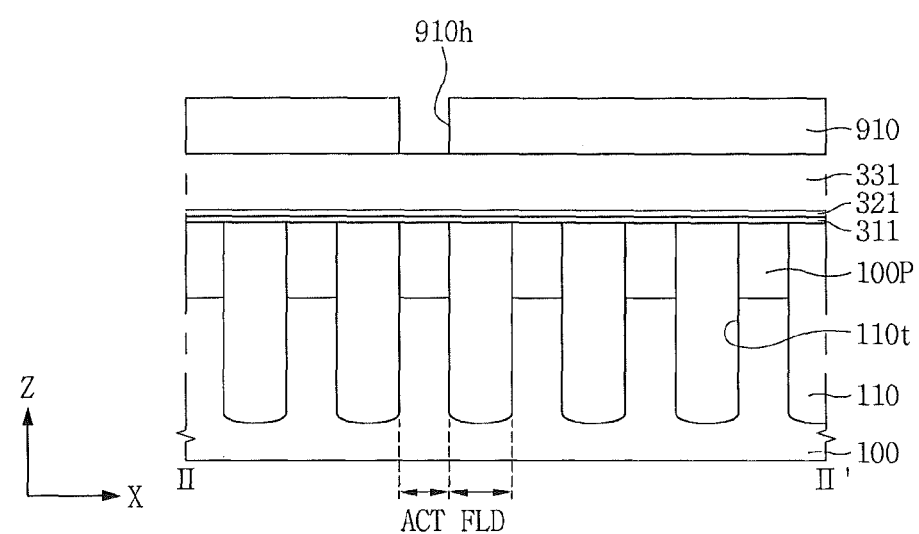

Referring to FIGS. 5A and 5B, the method of forming the semiconductor device may further include a process of forming a lower barrier layer 311, an upper barrier layer 321, a lower bit line conductive layer 331 and a mask pattern 910 on the semiconductor substrate 100.

The process of forming the lower barrier layer 311, the upper barrier layer 321, the lower bit line conductive layer 331 and the mask pattern 910 may include a process of forming the lower barrier layer 311 on the upper surface of the semiconductor substrate 100, a process of forming the upper barrier layer 321 on the lower barrier layer 311, a process of forming the lower bit line conductive layer 331 on the upper barrier layer 321 and a process of forming the mask pattern 910 on the lower bit line conductive layer 331.

The process of forming the lower barrier layer 311 may include a process of forming the lower barrier layer 311 with an insulating material. For example, the process of forming the lower barrier layer 311 may include a process of forming the lower barrier layer 311 with silicon oxide.

The process of forming the upper barrier layer 321 may include a process of forming the upper barrier layer 321 with an insulating material. The process of forming the upper barrier layer 321 may include a process of forming the upper barrier layer 321 with a material having an etch selectivity with respect to the lower barrier layer 311. For example, the process of forming the upper barrier layer 321 may include a process of forming the upper barrier layer 321 with silicon nitride.

The process of forming the lower bit line conductive layer 331 may include a process of forming the lower bit line conductive layer 331 with a conductive material. For example, the process of forming the lower bit line conductive layer 331 may include a process of forming the lower bit line conductive layer 331 with polysilicon.

The process of forming the mask pattern 910 may include a process of forming a mask layer on the lower bit line conductive layer 331, and a process of forming a first through hole 910h in the mask layer. The process of forming the first through hole 910h may include a process of forming the first through hole 910h on the active region ACT crossing the bit line structures formed by a following process.

Figure 6A:
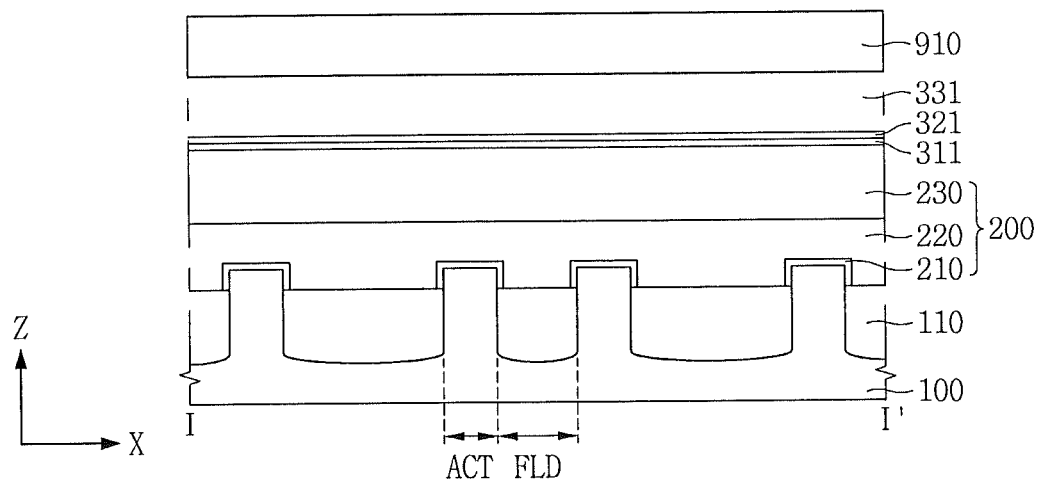
Figure 6B:
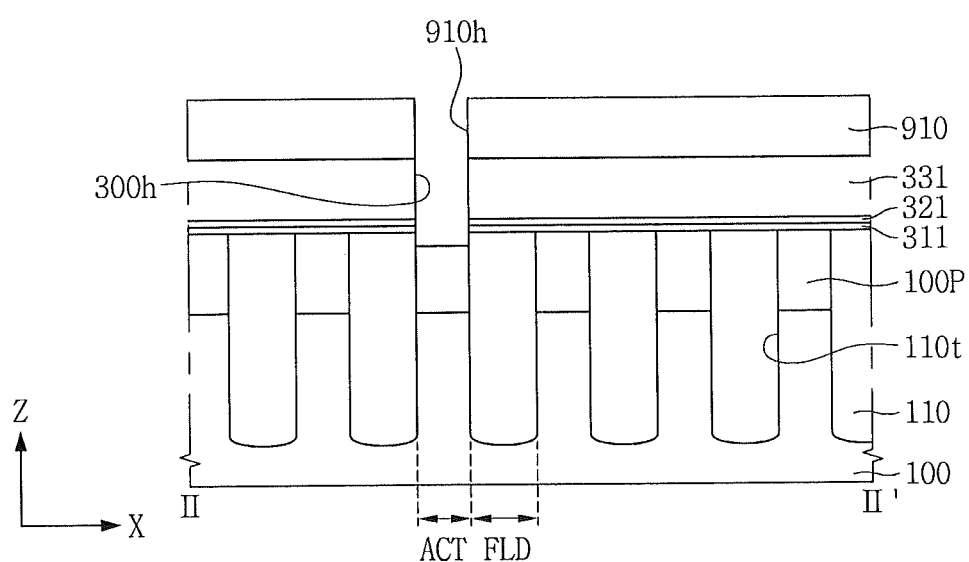

Referring to FIGS. 6A and 6B, the method of forming the semiconductor device may further include a process of forming a DC contact hole 300h penetrating the lower bit line conductive layer 331, the upper barrier layer 321 and the lower barrier layer 311.

The process of forming the DC contact hole 300h may include a process of sequentially etching the lower bit line conductive layer 331, the upper barrier layer 321 and the lower barrier layer 311 using the mask pattern 910 including the first through hole 910h.

The process of forming the DC contact hole 300h may include a process of recessing the semiconductor substrate 100 using the mask pattern 910 including the first through hole 910h.

Figure 7A:
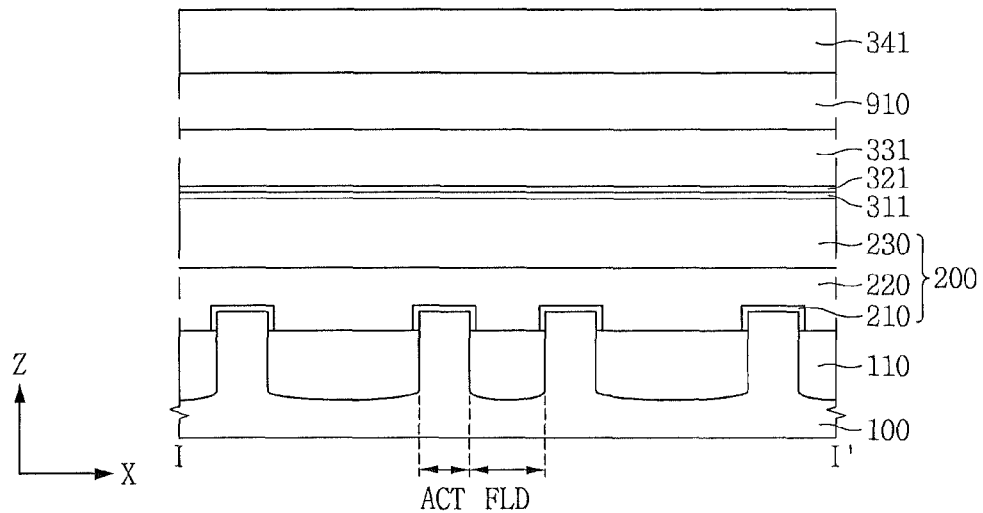
Figure 7B:
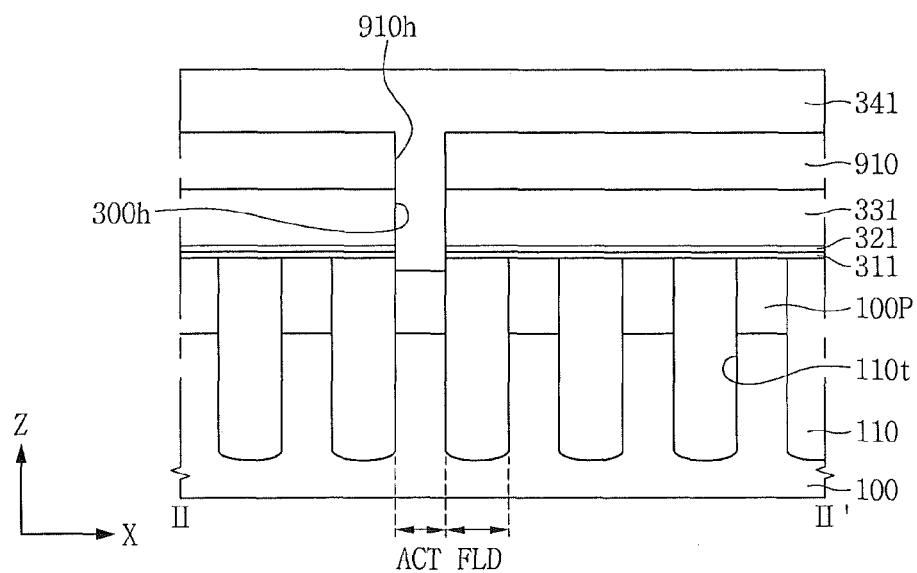

Referring to FIGS. 7A and 7B, the method of forming the semiconductor device may further include a process of forming a DC conductive layer 341 on the mask pattern 910 and in the first through hole 910h and in the DC contact hole 300h.

The process of forming the DC conductive layer 341 may include a process of filling the DC contact hole 300h and the first through hole 910h with a conductive material. For example, the process of forming the DC conductive layer 341 may include a process of filling the DC contact hole 300h and the first through hole 910h with polysilicon.

Figure 8A:
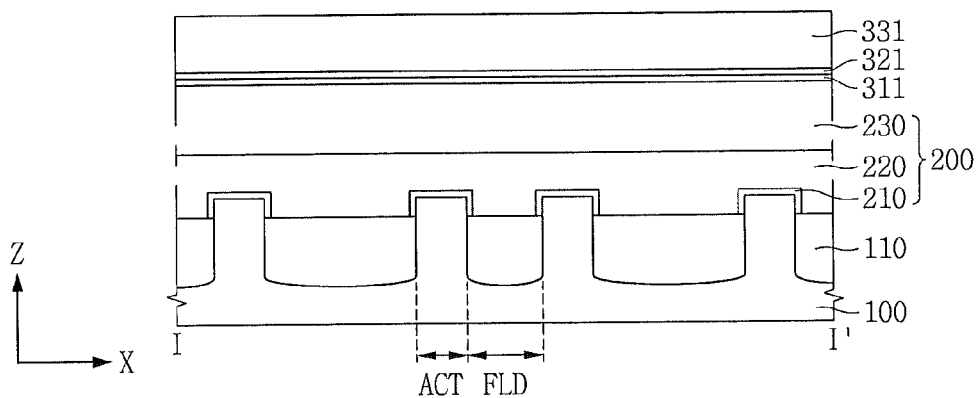
Figure 8B:
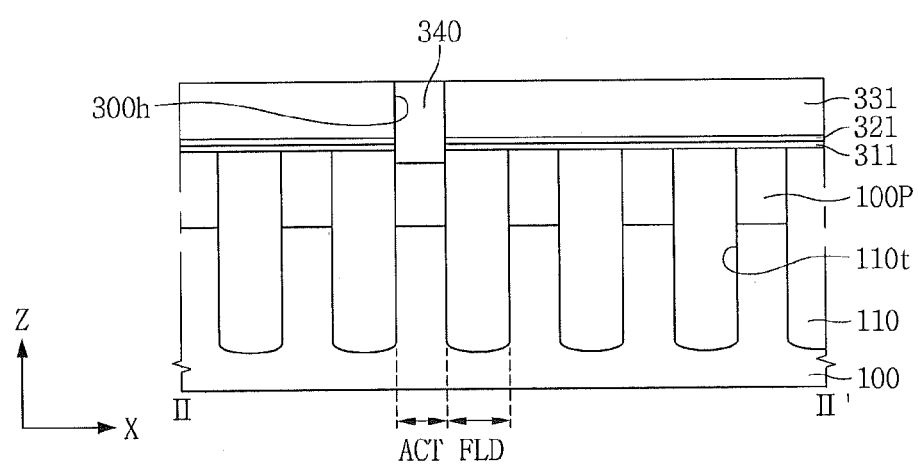

Referring to FIGS. 8A and 8B, the method of forming the semiconductor device in accordance with an embodiment of the inventive concept may include a process of forming a DC plug 340 in the DC contact hole 300h.

The process of forming the DC plug 340 may include a process of planarizing the DC conductive layer 341 and the mask pattern 910 to expose the lower bit line conductive layer 331. The process of planarizing the DC conductive layer 341 and the mask pattern 910 may include a chemical mechanical polishing (CMP) process.

Figure 9A:
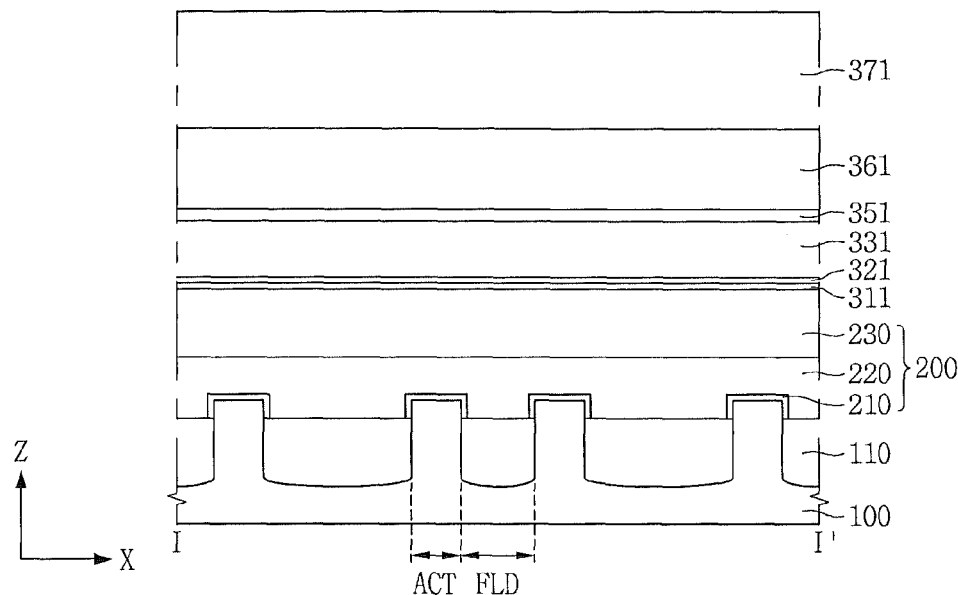
Figure 9B:
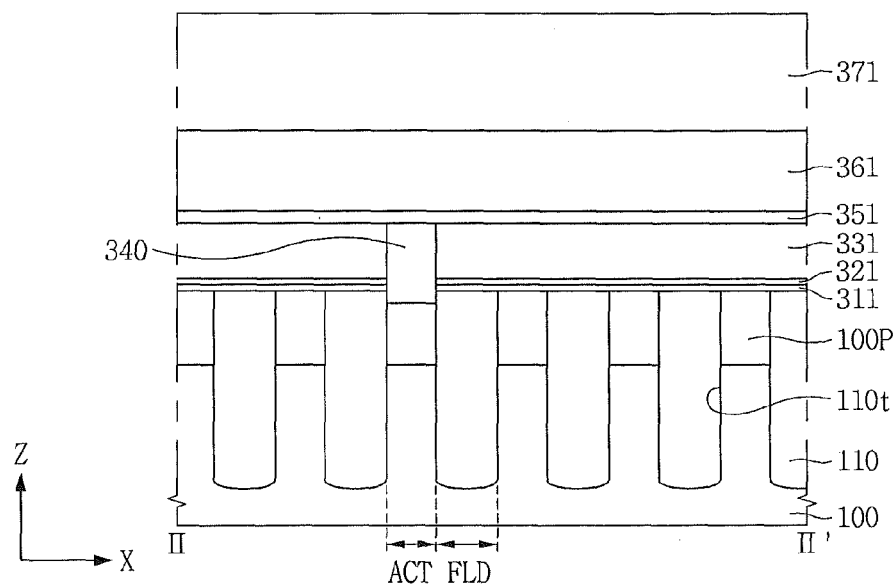

Referring to FIGS. 9A and 9B, the method of forming the semiconductor device may further include a process of forming a middle bit line insulating layer 351, an upper bit line conductive layer 361 and a bit line capping layer 371 on the semiconductor substrate 100 including the DC plug 340.

The process of forming the middle bit line insulating layer 351, the upper bit line conductive layer 361 and the bit line capping layer 371 may include a process of forming the middle bit line insulating layer 351 on the lower bit line conductive layer 331 and the DC plug 340, a process of forming the upper bit line conductive layer 361 on the middle bit line insulating layer 351 and a process of forming the bit line capping layer 371 on the upper bit line conductive layer 361.

The process of forming the middle bit line insulating layer 351 may include a process of forming the middle bit line insulating layer 351 with a conductive material. For example, the process of forming the middle bit line insulating layer 351 may include a process of forming the middle bit line insulating layer 351 with a metal silicide.

The process of forming the upper bit line conductive layer 361 may include a process of forming the upper bit line conductive layer 361 with a conductive material. For example, the process of forming the upper bit line conductive layer 361 may include a process of forming the upper bit line conductive layer 361 with a metal such as tungsten.

The process of forming the bit line capping layer 371 may include a process of forming the bit line capping layer 371 with an insulating material. For example, the process of forming the bit line capping layer 371 may include a process of forming the bit line capping layer 371 with silicon nitride.

Figure 10A:
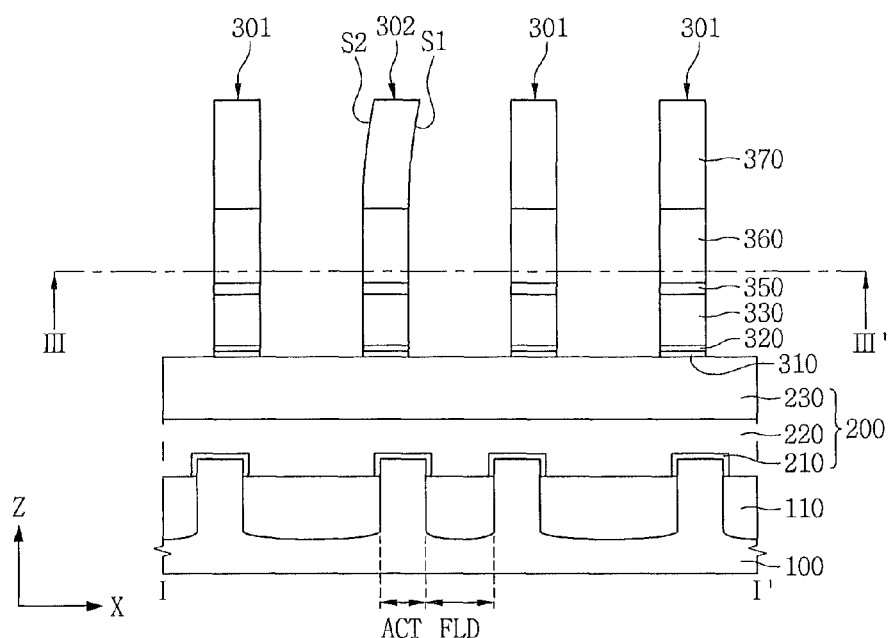
Figure 10B:
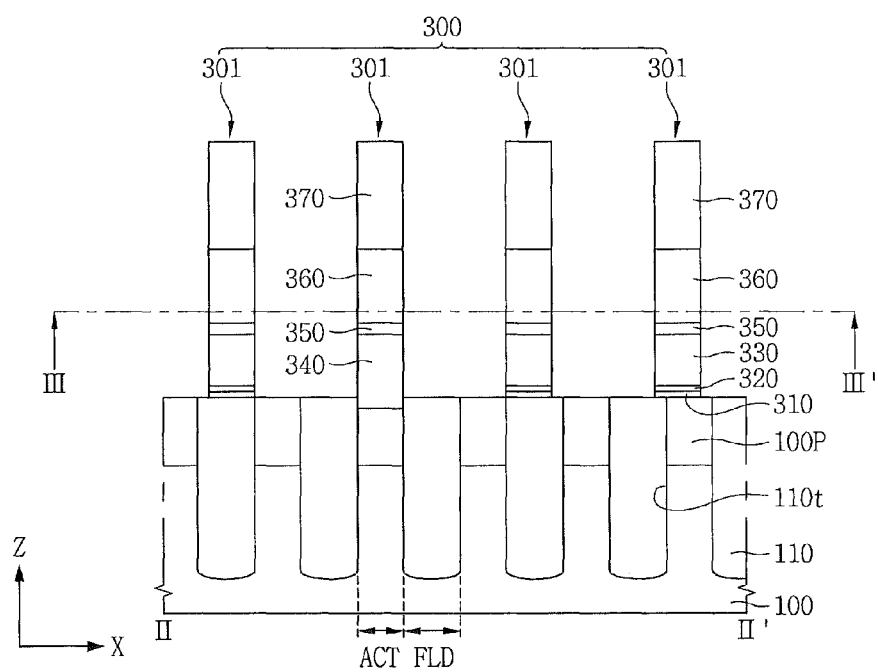
Figure 10C:
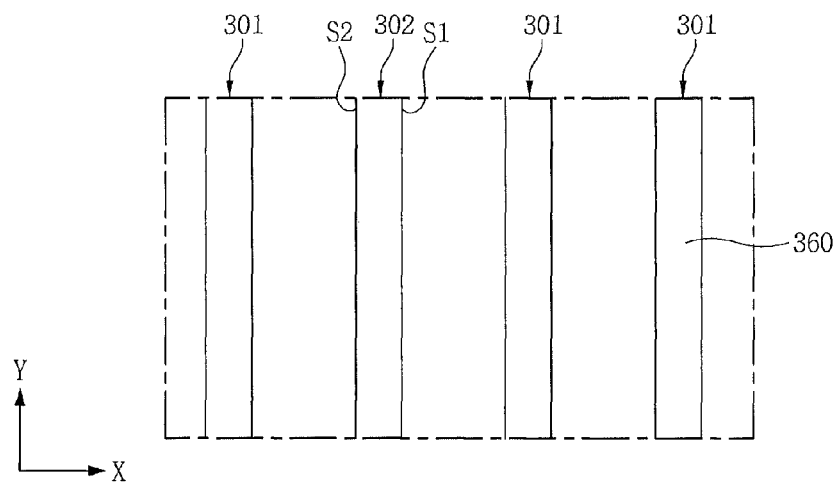

Referring to FIGS. 10A to 10C, the method of forming the semiconductor device may further include a process of forming bit line structures 300 on the semiconductor substrate 100.

The process of forming the bit line structures 300 may include a process of forming bit line capping patterns 370, a process of forming upper bit line electrodes 360, a process of forming middle bit line patterns 350, a process of forming lower bit line electrodes 330, a process of forming upper barrier patterns 320 and forming lower barrier patterns 310.

The process of forming the bit line capping patterns 370 may include a process of patterning the bit line capping layer 371. The process of forming the upper bit line electrodes 360 may include a process of patterning the upper bit line conductive layer 361. The process of forming the middle bit line pattern 350 may include a process of patterning the middle bit line insulating layer 351. The process of forming the lower bit line electrodes 330 may include a process of patterning the lower bit line conductive layer 331. The process of forming the upper barrier patterns 320 may include a process of patterning the upper barrier layer 321. The process of forming of the lower barrier patterns 310 may include a process of patterning the lower barrier layer 311.

An upper portion of at least one of the bit line structures 300 may be partially bent toward an adjacent bit line structure 300. For example, the bit line structures 300 may include first bit line structures 301 in which the side surfaces of the bit line capping pattern 370 are vertically aligned with side surfaces of the lower barrier pattern 310 and at least one second bit line structure 302 in which an upper portion is partially bent toward a first bit line structure 301 that is adjacent to the first side surface S1 of the second bit line structure 302.

As shown in FIG. 10A, as the bit line capping pattern 370 of the second bit line structure 302 extends farther from the semiconductor substrate 100, the distance between the bit line capping pattern 370 of the second bit line structure 302 and the bit line capping pattern 370 of the first bit line structure 301 adjacent to the second side surface S2 of the second bit line structure 302 increases as a result of the bend in the second bit line structure 302. The bit line capping pattern 370 of the second bit line structure 302 may bend towards the first bit line structure 301 that is adjacent to the first side surface S1 of the second bit line structure 302. The second side surface S2 of the second bit line structure 302 may be opposite to the first side surface S1 of the second bit line structure 302.

Figure 11A:
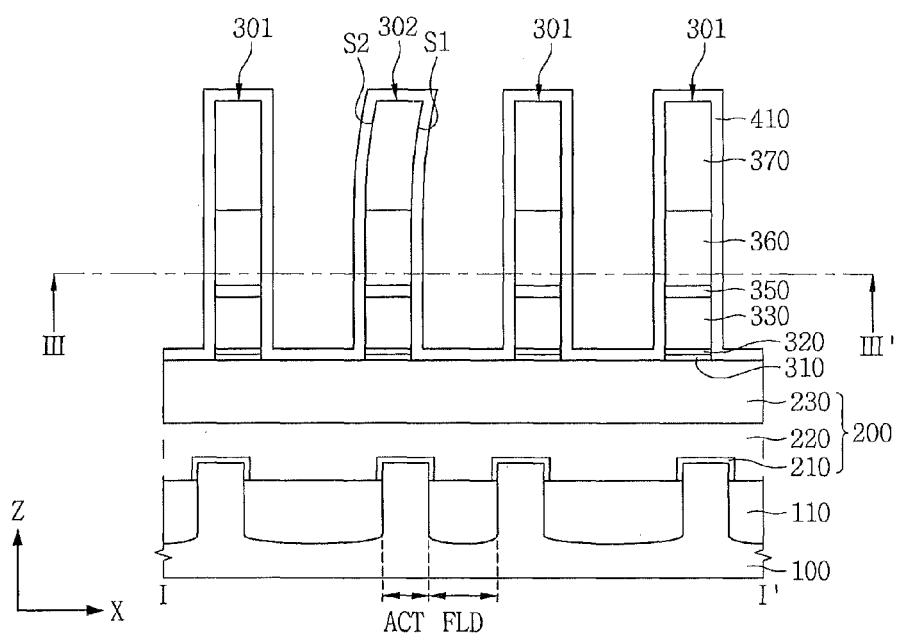
Figure 11B:
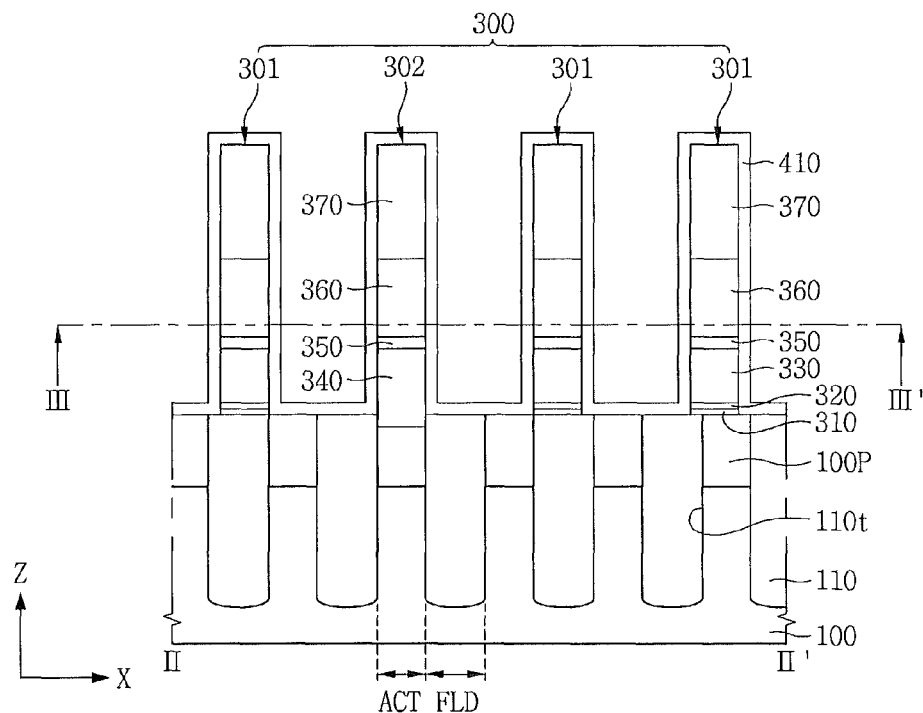
Figure 11C:
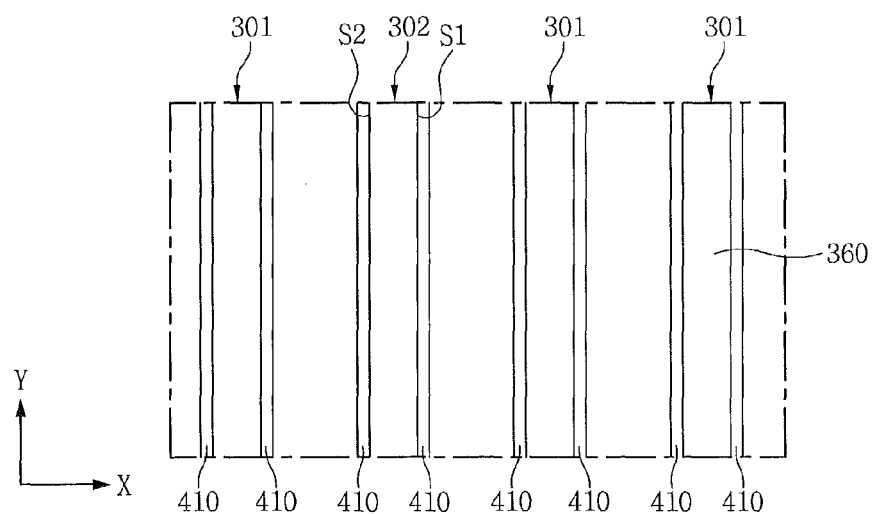

Referring to FIGS. 11A to 11C, the method of forming the semiconductor device may further include a process of forming a spacer insulating layer 410 on the semiconductor substrate 100 including the bit line structures 300.

The process of forming the spacer insulating layer 410 may include a process of forming the spacer insulating layer 410 with an insulating material. For example, the process of forming the spacer insulating layer 410 may include a process of forming the spacer insulating layer 410 with silicon nitride.

Figure 12A:
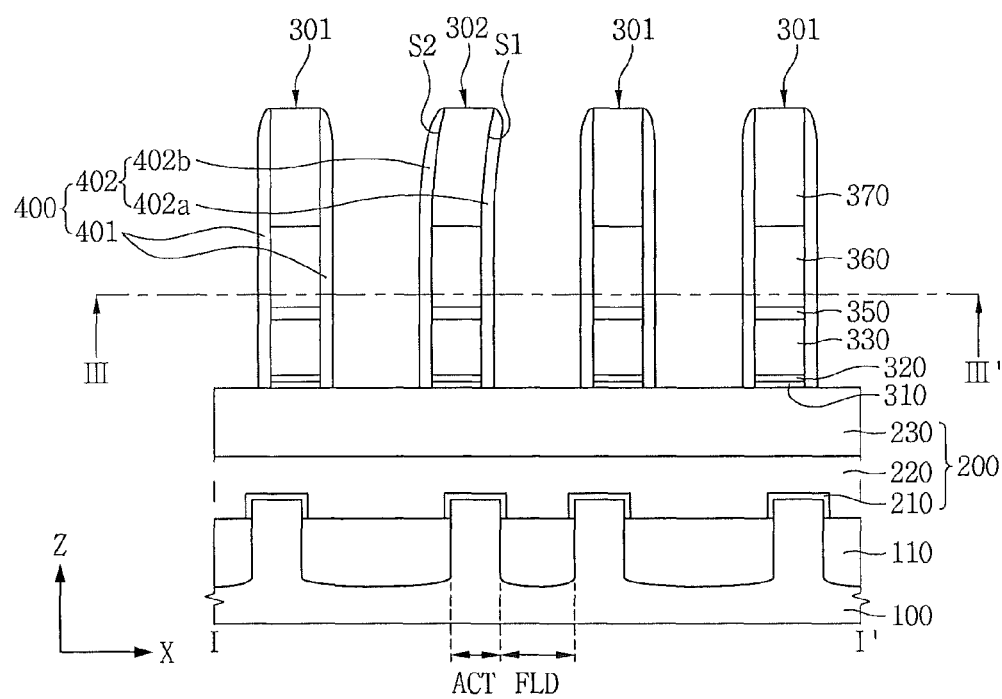
Figure 12B:
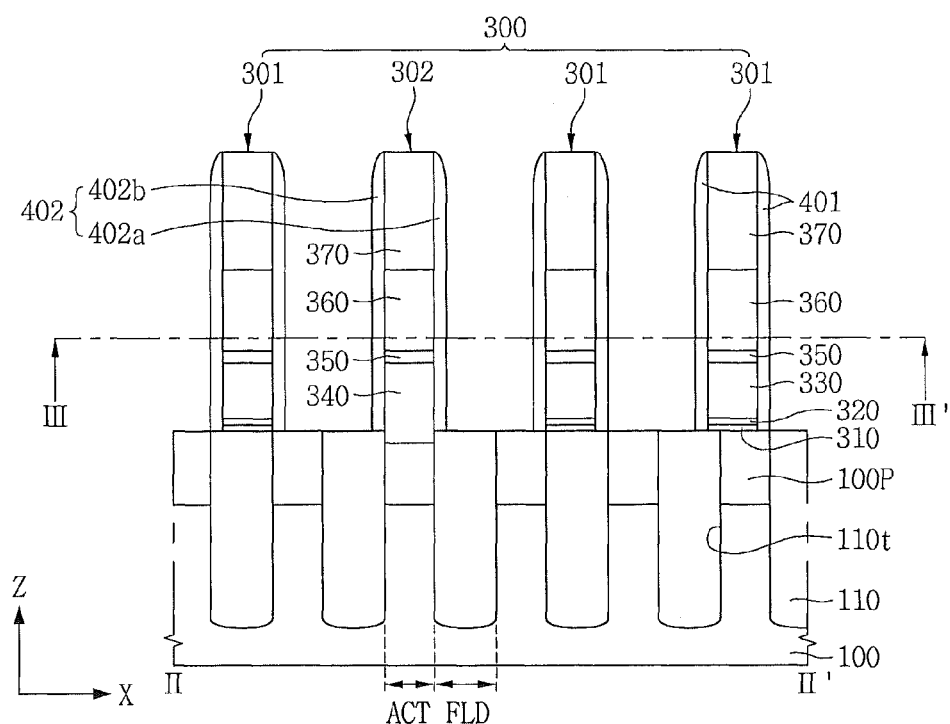
Figure 12C:
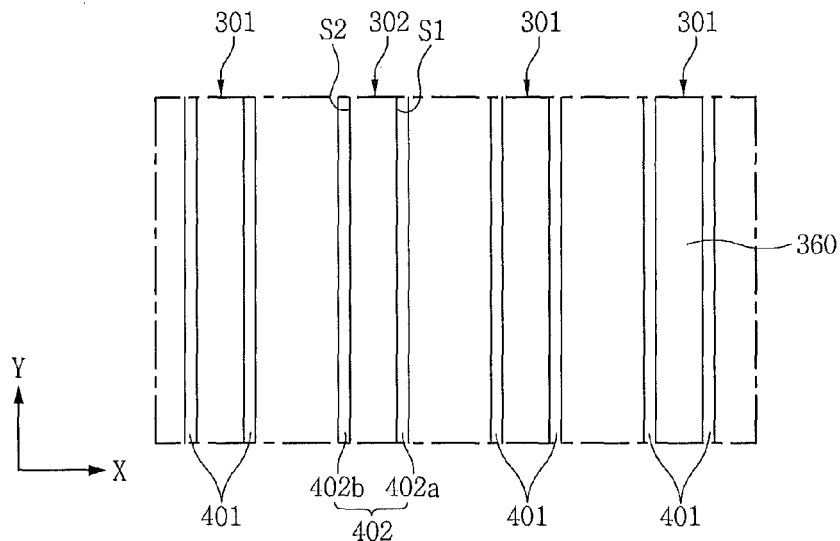

Referring to FIGS. 12A to 12C, the method of forming the semiconductor device may further include a process of forming bit line spacers 400 on the side surfaces of the bit line structures 300.

The process of forming the bit line spacers 400 may include a process of etching the spacer insulating layer to form the bit line spacers 400. For example, the process of forming the bit line spacers 400 may include a process of dry-etching the spacer insulating layer 410.

The process of forming the bit line spacers 400 may include a process of forming the first bit line spacers 401 on the side surfaces of the first bit line structures 301. The process of forming the bit line spacers 400 may include a process of forming second bit line spacers 402 on side surfaces of the second bit line structures 302. The first and second bit line spacers 401, 402 may be formed at the same time as part of a single process.

The process of forming the second bit line spacers 402 may include a process of forming a first side surface spacer 402a on the first side surface S1 of the second bit line structure 302. The process of forming the second bit line spacers 402 may include a process of forming a second side surface spacer 402b on the second side surface S2 of the second bit line structure 302. The first and second side surface spacers 402a, 402b may be formed simultaneously.

The upper portion of the first side surface spacer 402a and the upper portion of the second side surface spacer 402b may each be partially bent to conform to the bent upper portion of the second bit line structure 302. The upper portion of the first side surface spacer 402a may not be bent in a different region where the upper portion of the second bit line structure 302 is not bent. The upper portion of the second side surface spacer 402b may likewise not be bent in the region where the upper portion of the second bit line structure 302 is not bent. The upper portion of the second side surface spacer 402b may have a different profile from the upper portion of the first side surface spacer 402a in the region in which the upper portion of the second bit line structure 302 is bent.

Figure 13A:
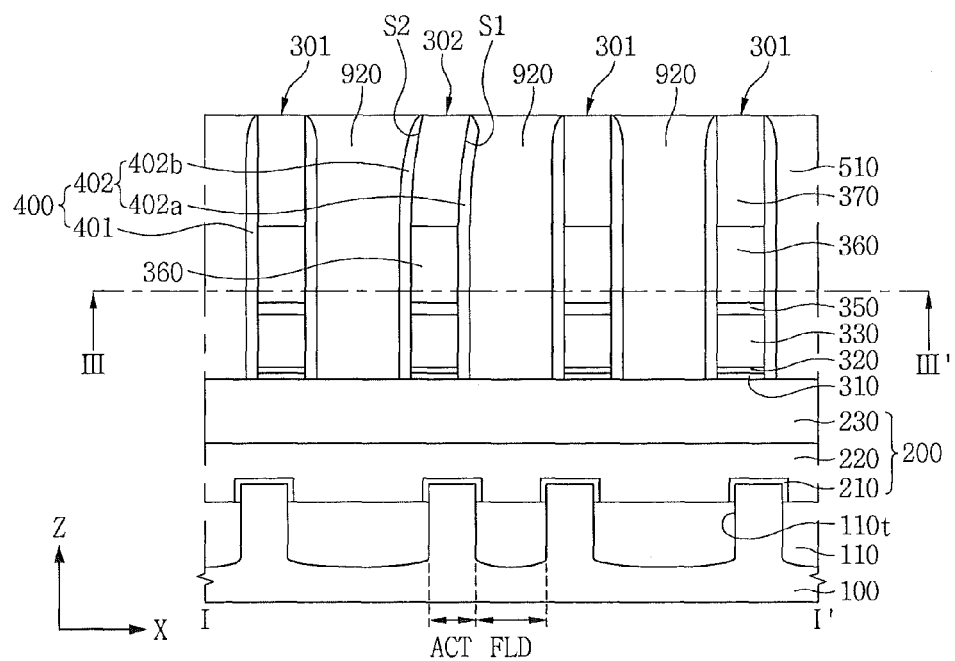
Figure 13B:
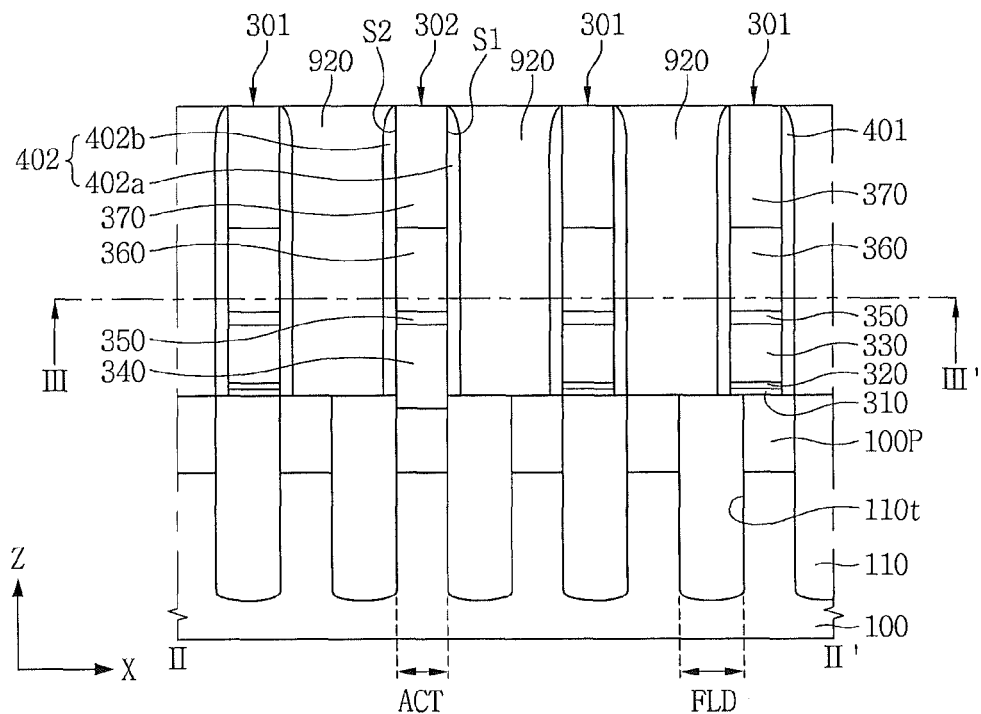
Figure 13C:
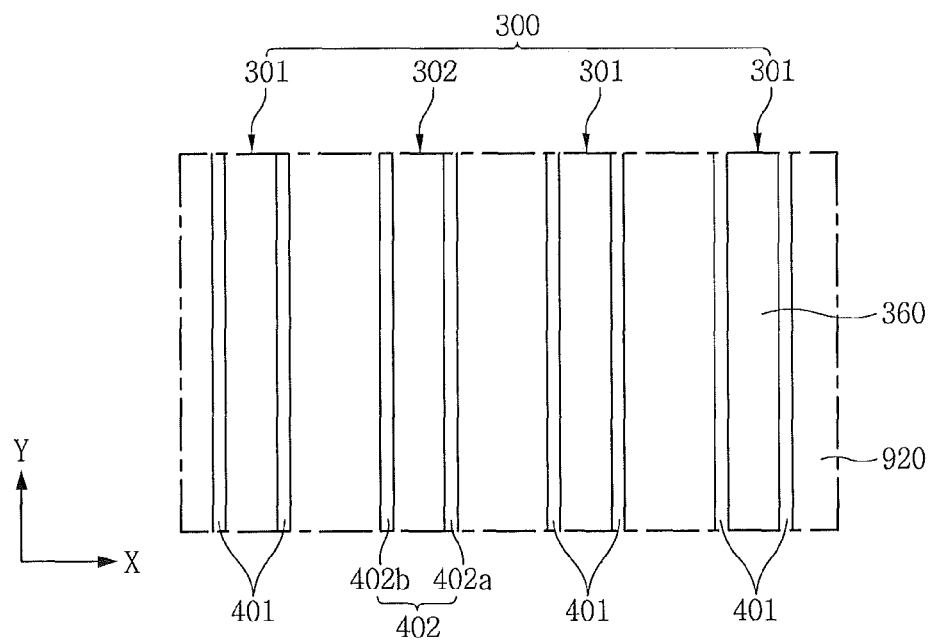

Referring to FIGS. 13A to 13C, the method of forming the semiconductor device may further include a process of forming molding patterns 920 between the bit line spacers 400.

The process of forming the molding patterns 920 may include a process of forming a molding layer on the semiconductor substrate 100 including the bit line spacers 400 and a process of performing a planarization of the molding layer until the upper surface of the bit line structures 300 are exposed. The planarization process may include a CMP process.

The process of forming the molding patterns 920 may include a process of forming the molding patterns 920 with an insulating material. The process of forming the molding patterns 920 may include a process of forming the molding patterns 920 with an insulating material having an etch selectivity with respect to the bit line capping patterns 370 and the bit line spacers 400. For example, the process of forming the molding patterns 920 may include a process of forming the molding patterns 920 with silicon oxide.

Figure 14A:
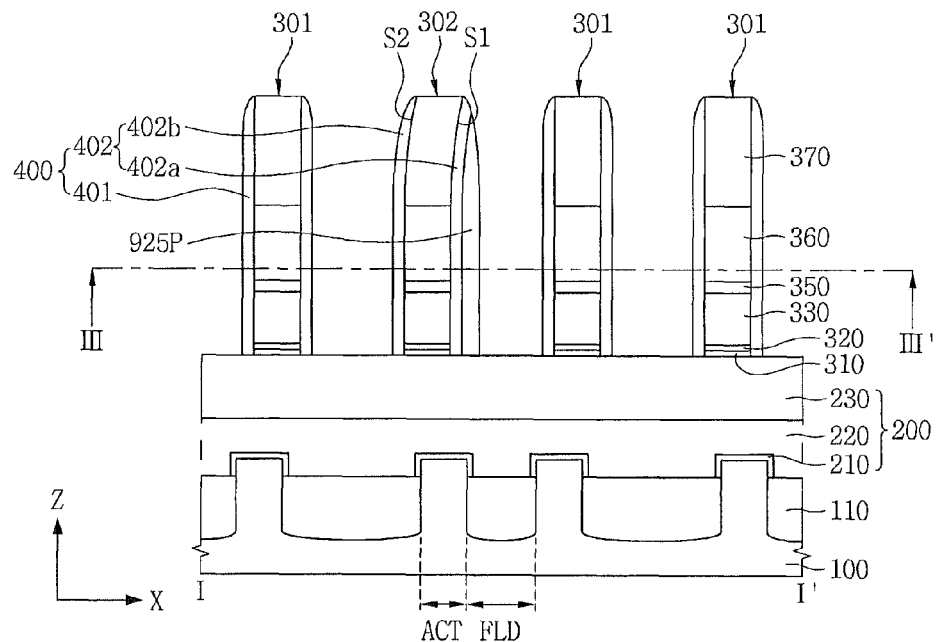
Figure 14B:
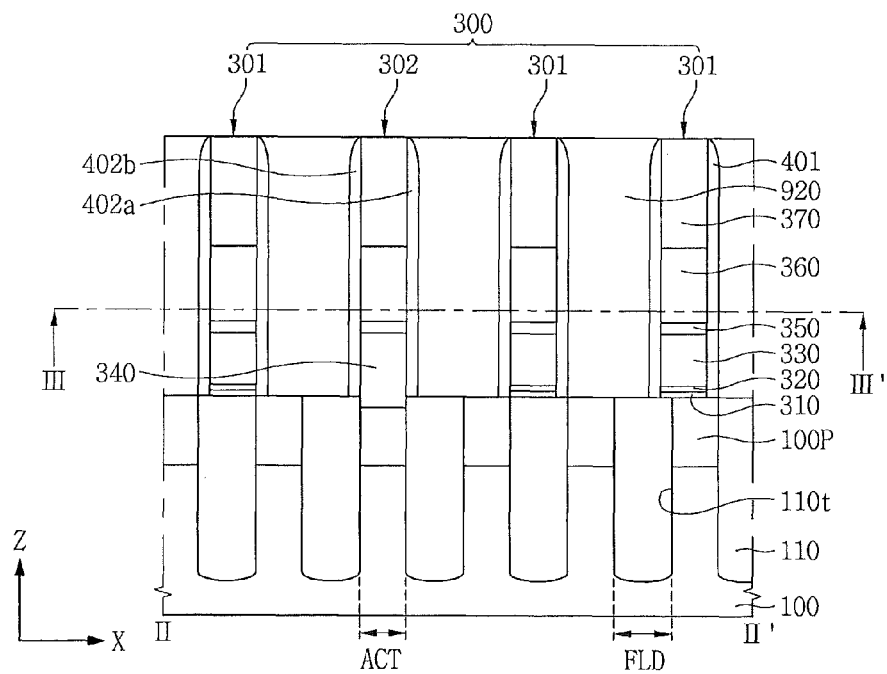
Figure 14C:
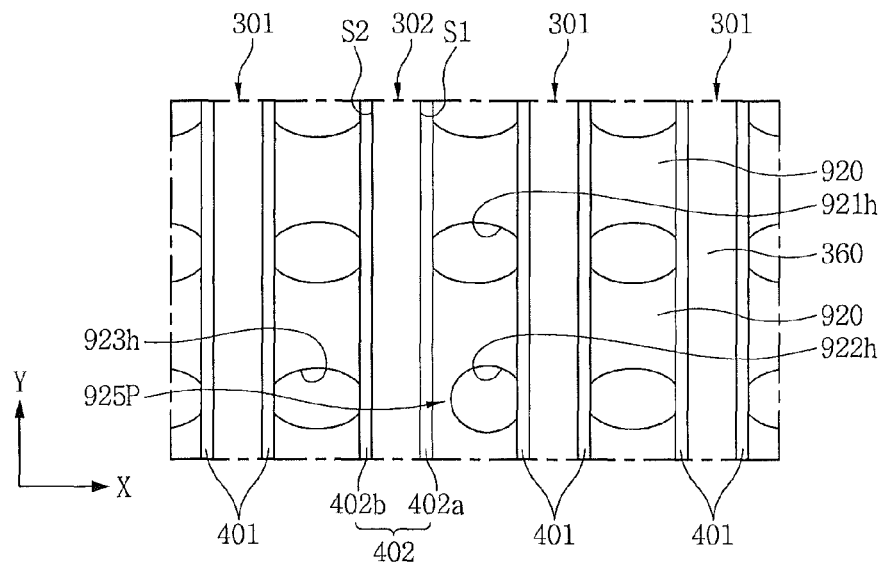

Referring to FIGS. 14A to 14C, the method of forming the semiconductor device may further include a process of etching the molding patterns 920 located on the gate structures 200.

The process of etching the molding patterns 920 may include a process of forming a hard mask layer on the molding patterns 920, a process of forming second through holes in the hard mask layer that expose the molding patterns 920 on the gate structures 200 and a process of dry-etching the molding patterns 920 using the second through holes.

In particular, first isolation holes 921h, second isolation holes 922h and third isolation holes 923h may be formed by the process of etching the molding patterns 920. The first isolation holes 921h may be formed to expose the gate structures 200 that are between the first bit line spacers 401. First isolation holes 921h may also be formed between the second bit line spacers 402 on the side surfaces of the second bit line structure 302 in which the upper portion is not bent and the first bit line spacers 401 opposite the second bit line spacers 402. The second isolation holes 922h may be formed between the first side surface spacer 402a located on the first side surface S1 of the second bit line structure 302 in which the upper portion is bent and the first bit line spacer 401 opposite the first side surface spacer 402a. The third isolation holes 923h may be formed between the second side surface spacer 402b located on the second side surface S2 of the second bit line structure 302 in which the upper portion is bent and the first bit line spacer 401 opposite the second side surface spacer 402b.

The bent upper portion of the second bit line structure 302 may interfere with the process of etching the molding patterns 920. In particular, the molding patterns 920 on the gate structures 200 may not be fully etched due to the bent upper portion of the second bit line structure 302. In the method of forming the semiconductor device in accordance with an embodiment of the inventive concepts, a remaining molding portion 925p may be left on the gate structures 200 when the process of etching the molding patterns 920 is completed. The remaining molding portion 925p may be a portion of the molding patterns 920 which is not etched due to the bent upper portion of the second bit line structure 302.

In the method of forming the semiconductor device in accordance with an embodiment of the inventive concept, a sidewall profile extending in the X-axis direction of the second isolation holes 922h may be different than a sidewall profile extending in the X-axis direction of the first isolation holes 921h. Similarly, a sidewall profile extending in the X-axis direction of the third isolation holes 923h may be different than the sidewall profile extending in the X-axis direction of the second isolation holes 922h.

Figure 15A:
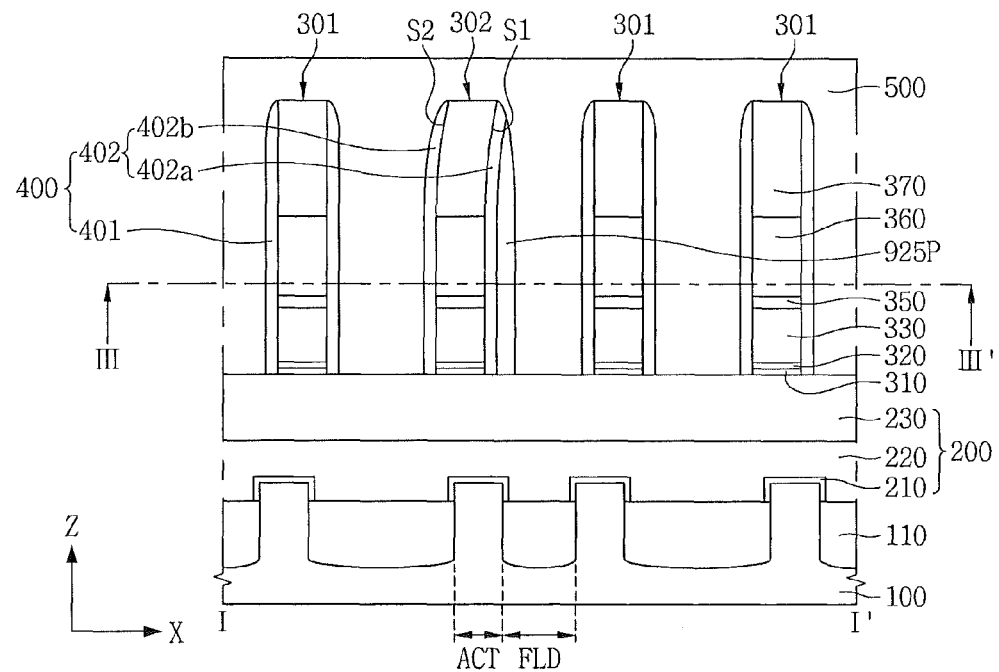
Figure 15B:
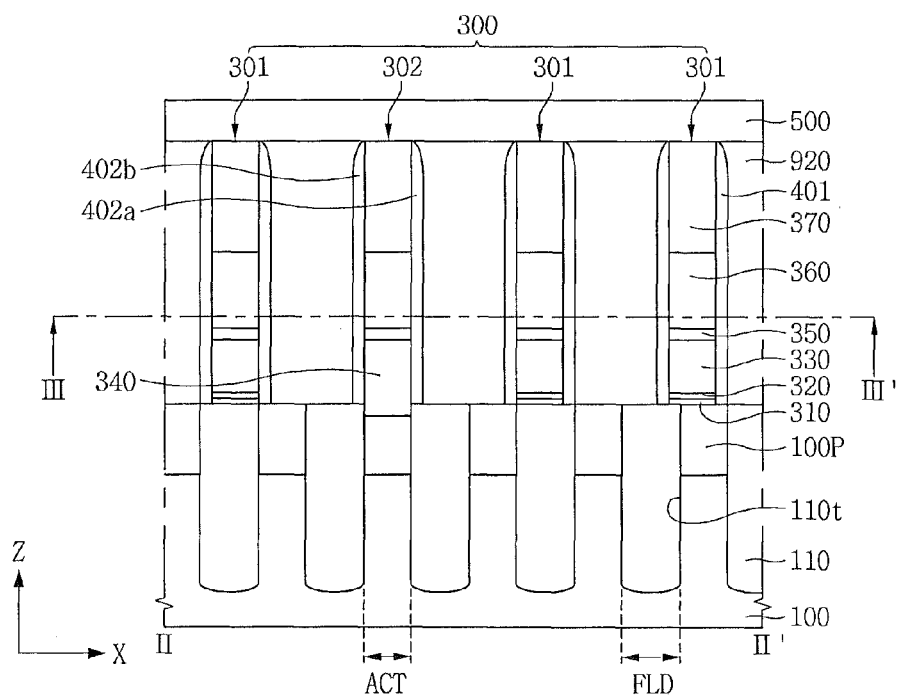
Figure 15C:
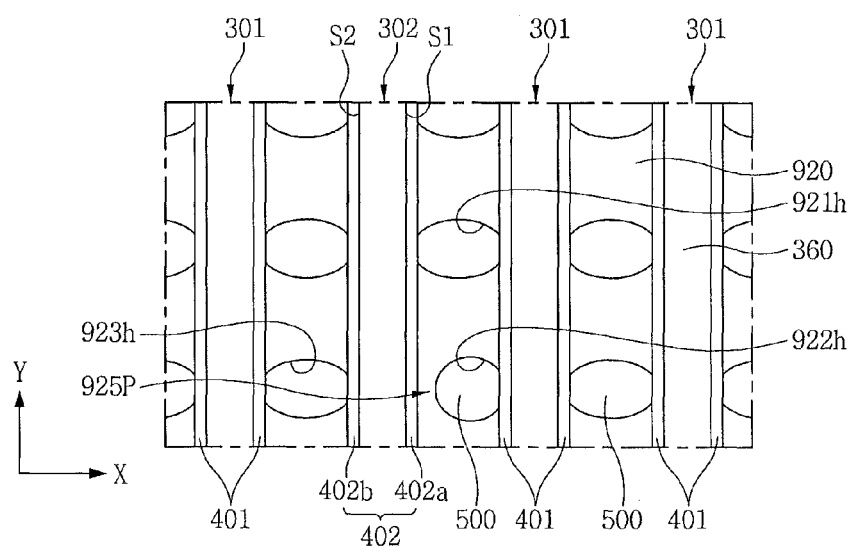

Referring to FIGS. 15A to 15C, the method of forming the semiconductor device may further include a process of forming a plug isolation layer 500 on the semiconductor substrate 100.

The process of forming the plug isolation layer 500 may include a process of filling the first to third isolation holes 921h to 923h with an insulating material. The process of forming the plug isolation layer 500 may include a process of filling the first to third isolation holes 921h to 923h with a material having an etch selectivity with respect to the remaining molding portion 925p. For example, the process of forming the plug isolation layer 500 may include a process of filling the first to third isolation holes 921h to 923h with silicon nitride.

Figure 16A:
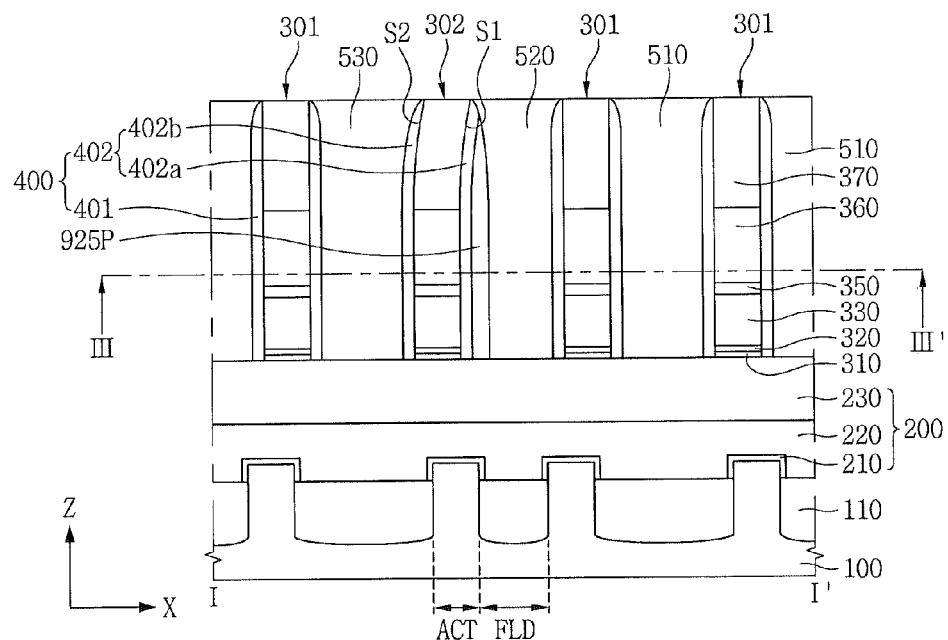
Figure 16B:
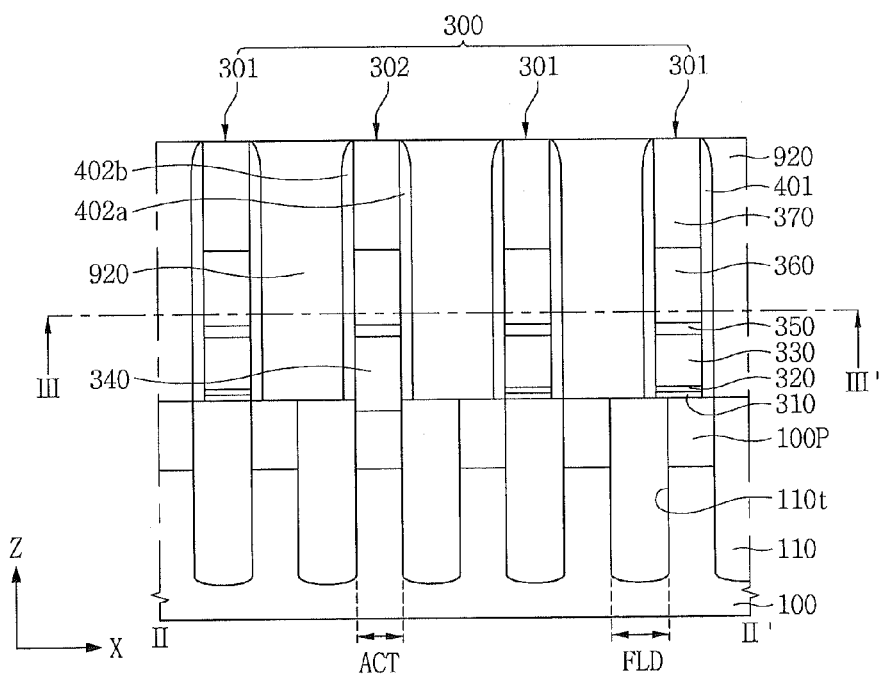
Figure 16C:
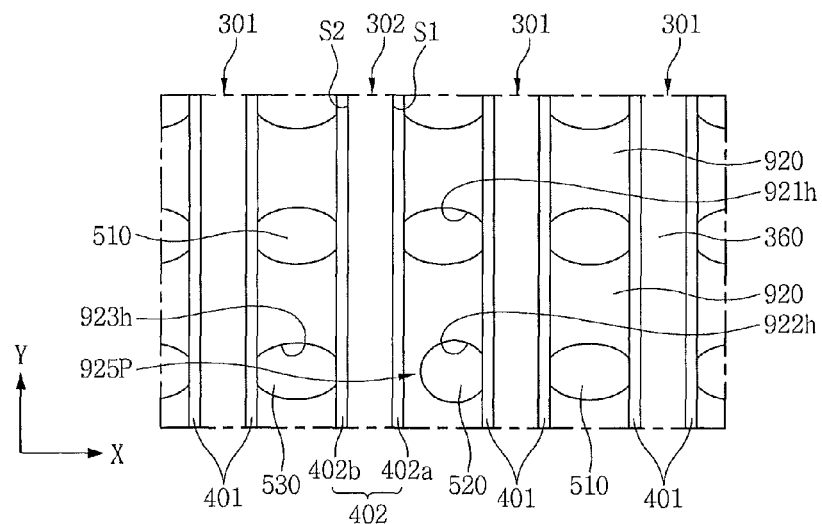

Referring to FIGS. 16A to 16C, the method of forming the semiconductor device may further include a process of forming first plug isolation patterns 510, second plug isolation patterns 520 and third plug isolation patterns 530 between the bit line spacers 400.

The process of forming the first plug isolation patterns 510, the second plug isolation patterns 520 and the third plug isolation patterns 530 may include a process of forming the first plug isolation patterns 510 in the first isolation holes 921h, a process of forming the second plug isolation patterns 520 in the second isolation holes 922h and a process of forming the third plug isolation patterns 530 in the third isolation holes 923h.

The process of forming the first plug isolation patterns 510, the second plug isolation patterns 520 and the third plug isolation patterns 530 may include a process of performing a planarizing the plug isolation layer 500 until upper surfaces of the molding patterns 920 are exposed. The process of planarizing of the plug isolation layer 500 may include a CMP process.

Figure 17A:
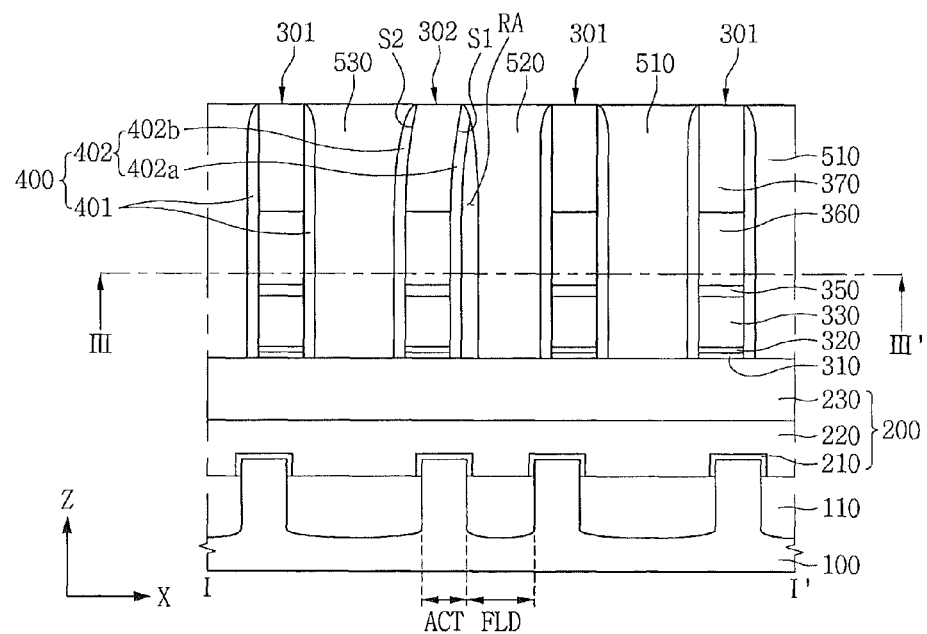
Figure 17B:
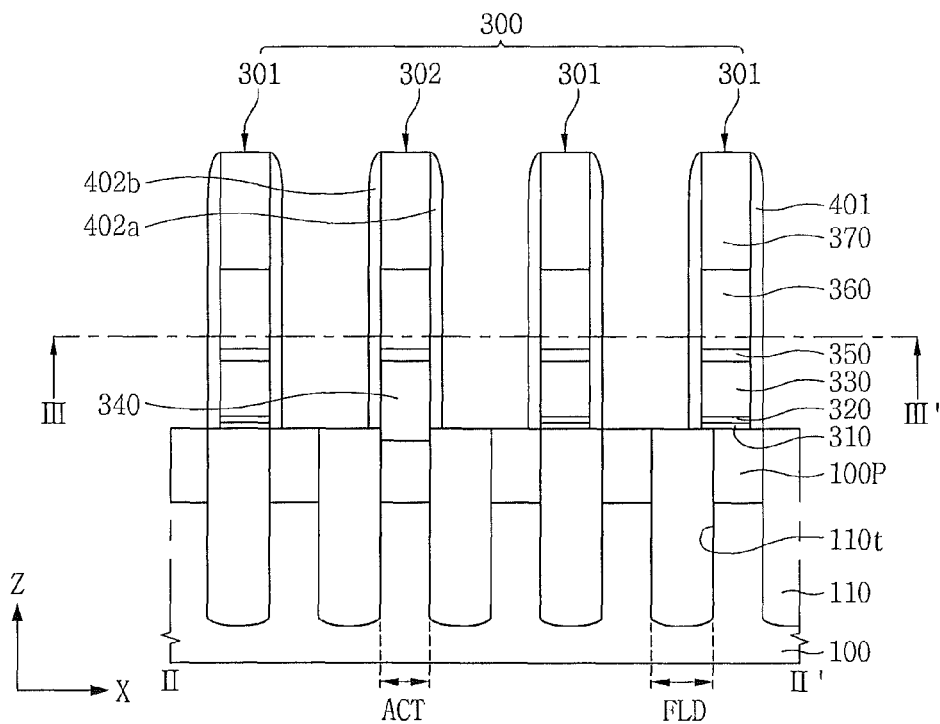
Figure 17C:
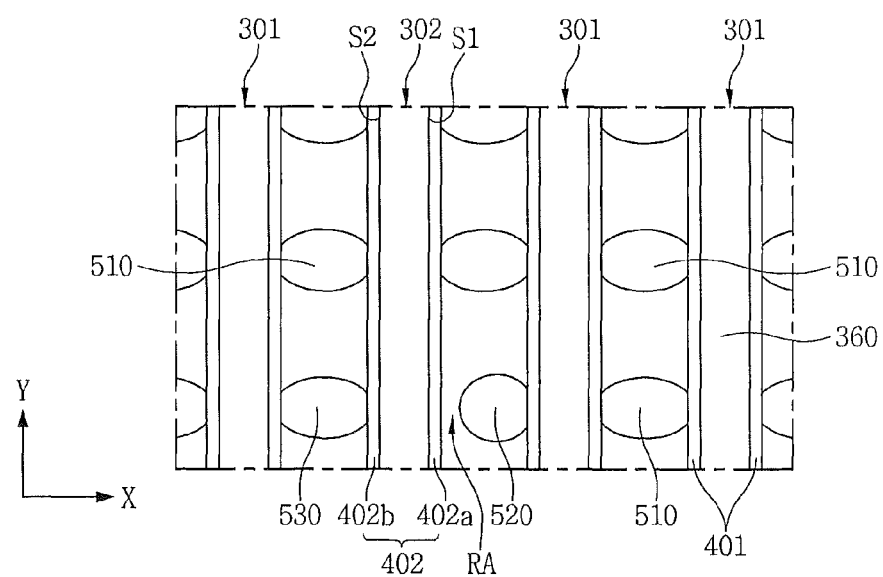

Referring to FIGS. 17A to 17C, the method of forming the semiconductor device may further include a process of removing the molding patterns 920.

The process of removing the molding patterns 920 may include a process of wet-etching the molding patterns 920. The process of removing the molding patterns 920 may include a process of removing the remaining molding portion 925p located on the gate structures 200. Empty spaces RA may be formed between the second bit line structure 302 and the second plug isolation patterns 520 by the process of removing the molding patterns 920.

Figure 18A:
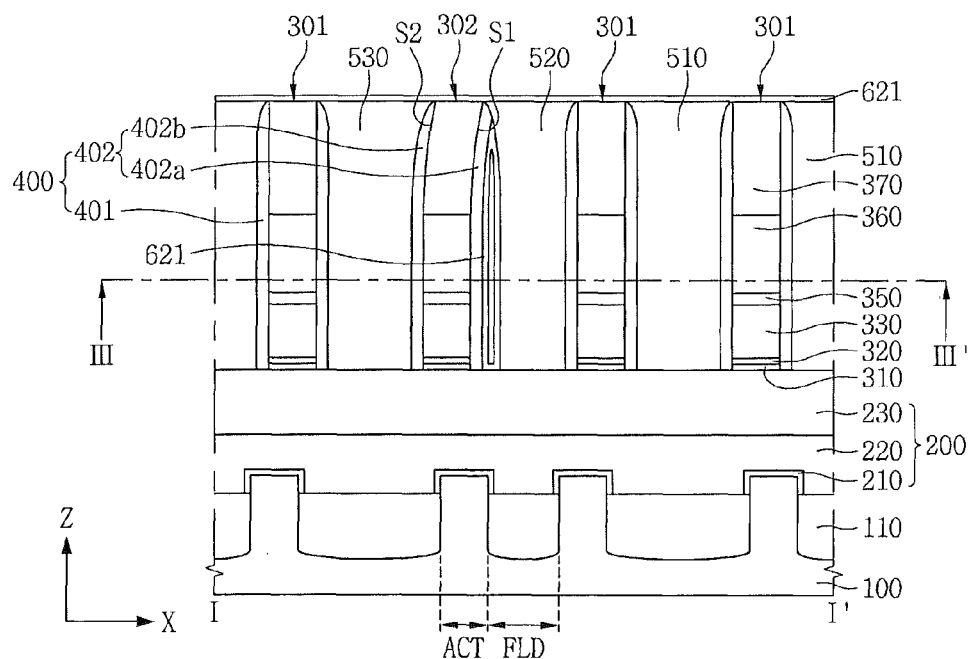
Figure 18B:
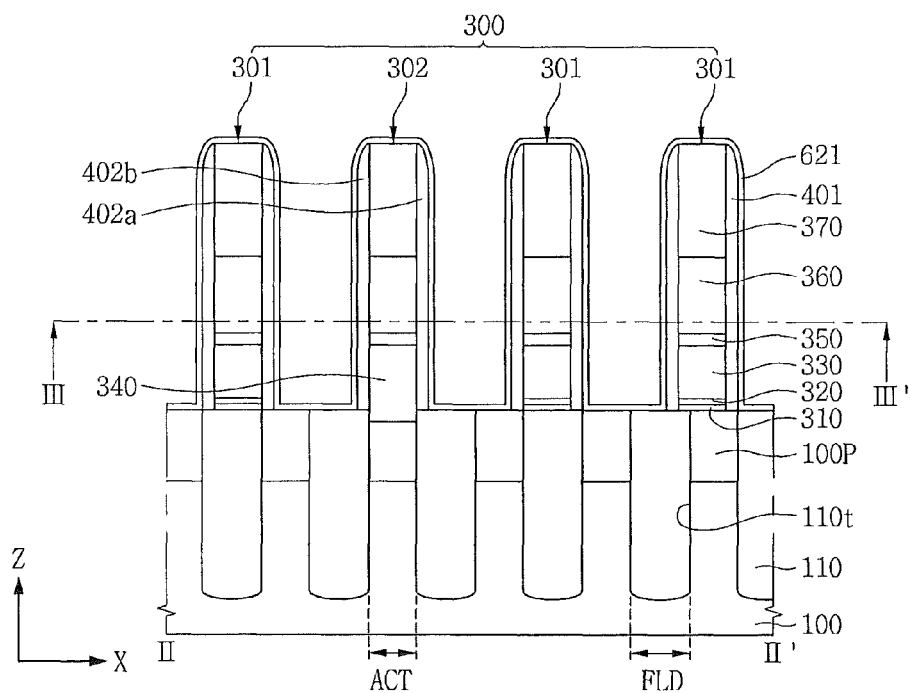
Figure 18C:
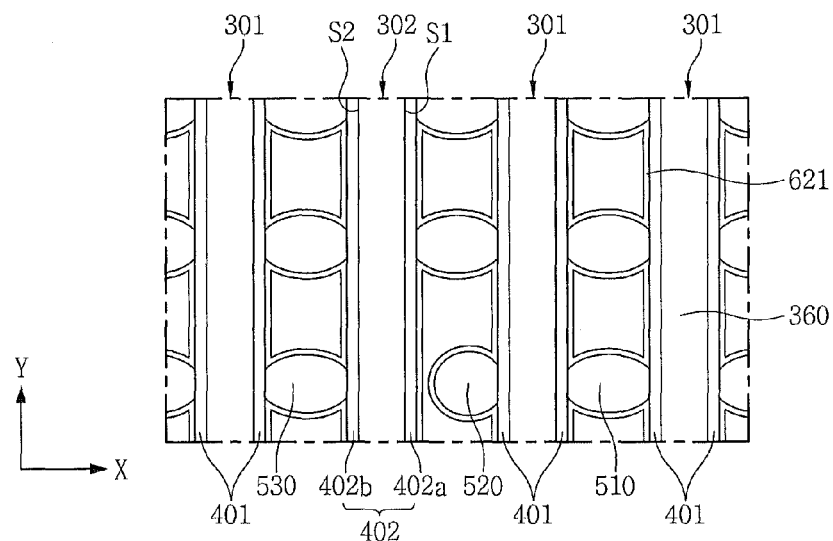

Referring to FIGS. 18A to 18C, the method of forming the semiconductor device may further include a process of forming a middle insulating layer 621 on the semiconductor substrate 100 including the first to third plug isolation patterns 510 to 530.

The process of forming the middle insulating layer 621 may include a process of forming the middle insulating layer 621 with an insulating material having an etch selectivity with respect to the first to third plug isolation patterns 510 to 530. For example, the process of forming the middle insulating layer 621 may include a process of forming the middle insulating layer 621 with silicon oxide. The process of forming the middle insulating layer 621 may include a process of oxidizing the semiconductor substrate 100 including the first to third plug isolation patterns 510 to 530.

The process of forming the middle insulating layer 621 may include a process of forming the middle insulating layer 621 on a side surface of the second bit line structure 302 facing each empty space RA and a side surface of the second plug isolation patterns 520.

Figure 19A:
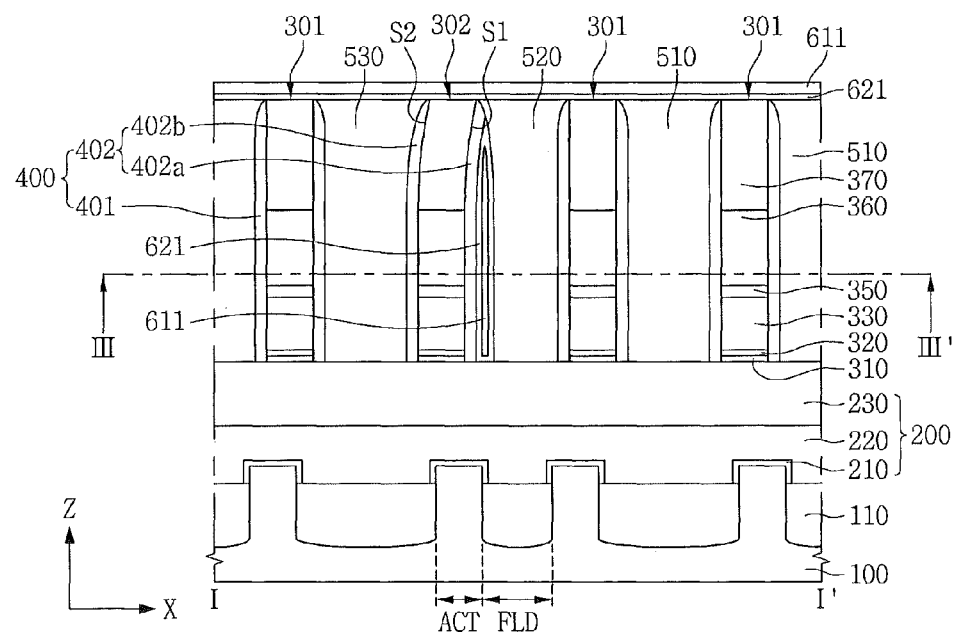
Figure 19B:
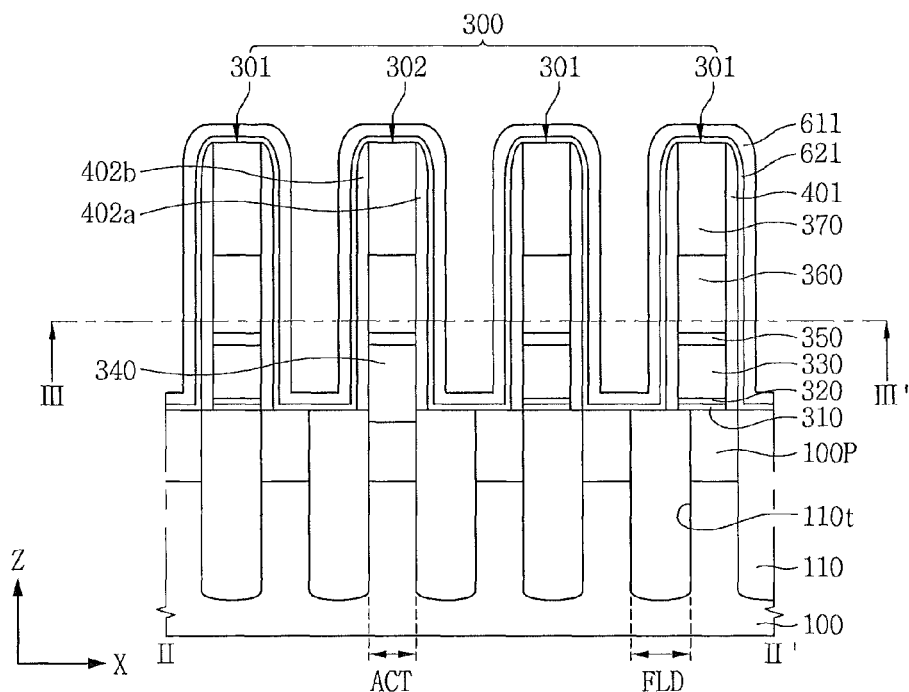
Figure 19C:
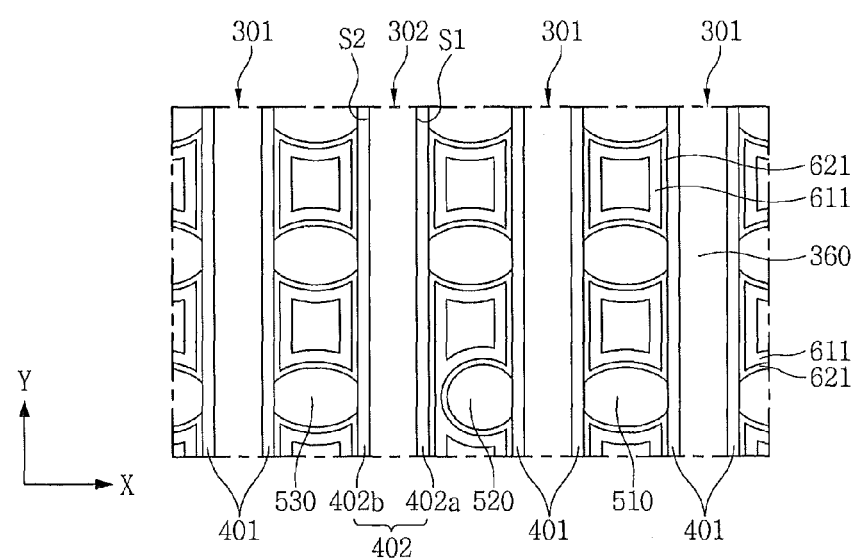

Referring to FIGS. 19A to 19C, the method of forming the semiconductor device may further include a process of forming a plug insulating layer 611 on the middle insulating layer 621.

The process of forming the plug insulating layer 611 may include a process of forming the plug insulating layer 611 with an insulating material. The process of forming the plug insulating layer 611 may include a process of forming the plug insulating layer 611 with a material having an etch selectivity with respect to the middle insulating layer 621. For example, the process of forming the plug insulating layer 611 may include a process of forming the plug insulating layer 611 with silicon nitride.

The process of forming the plug insulating layer 611 may include a process of filling the empty spaces RA with the plug insulating layer 611.

Figure 20A:
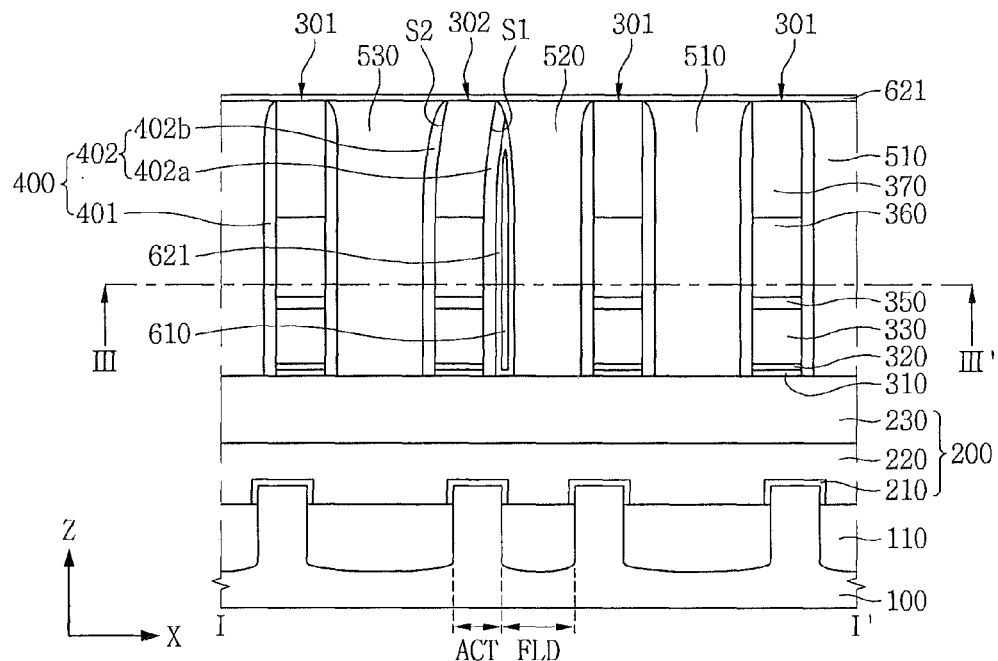
Figure 20B:
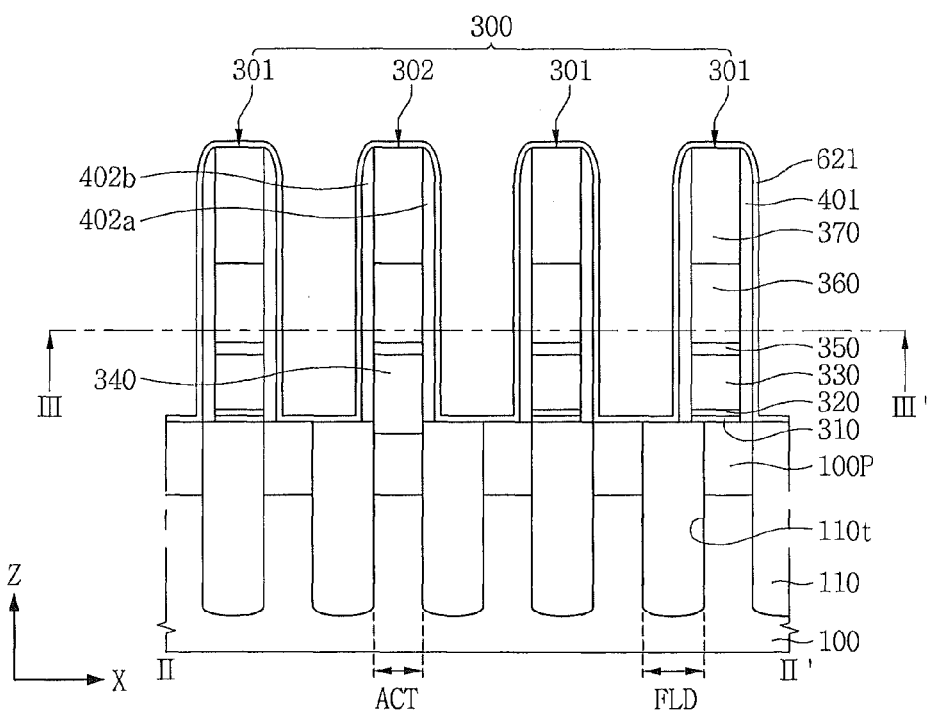
Figure 20C:
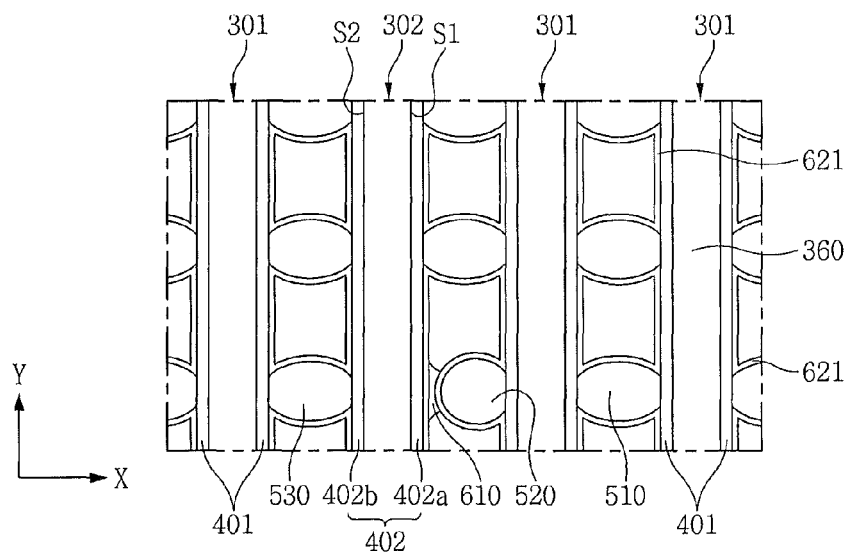

Referring to FIGS. 20A to 20C, the method of forming the semiconductor device may further include a process of forming first plug insulators 610.

The process of forming the first plug insulators 610 may include a process of removing the plug insulating layer 611 located on the first bit line spacers 401. The process of forming the first plug insulators 610 may include a process of removing the plug insulating layer 611 located on the first side surface spacer 402a in a region in which the upper portion of the second bit line structure 302 is not bent. The process of forming the first plug insulators 610 may include a process of removing the plug insulating layer 611 located on the second side surface spacer 402b. The process of forming the first plug insulators 610 may include a process of removing the plug insulating layer 611 located on side surfaces of the first to third plug isolation patterns 510 to 530 extending in X-axis direction. The process of forming the first plug insulators 610 may include a process of removing the plug insulating layer 611 that is on upper surfaces of the first to third plug isolation patterns 510 to 530. For example, the process of forming the first plug insulators 610 may include a process of wet-etching the plug insulating layer 611.

Figure 21A:
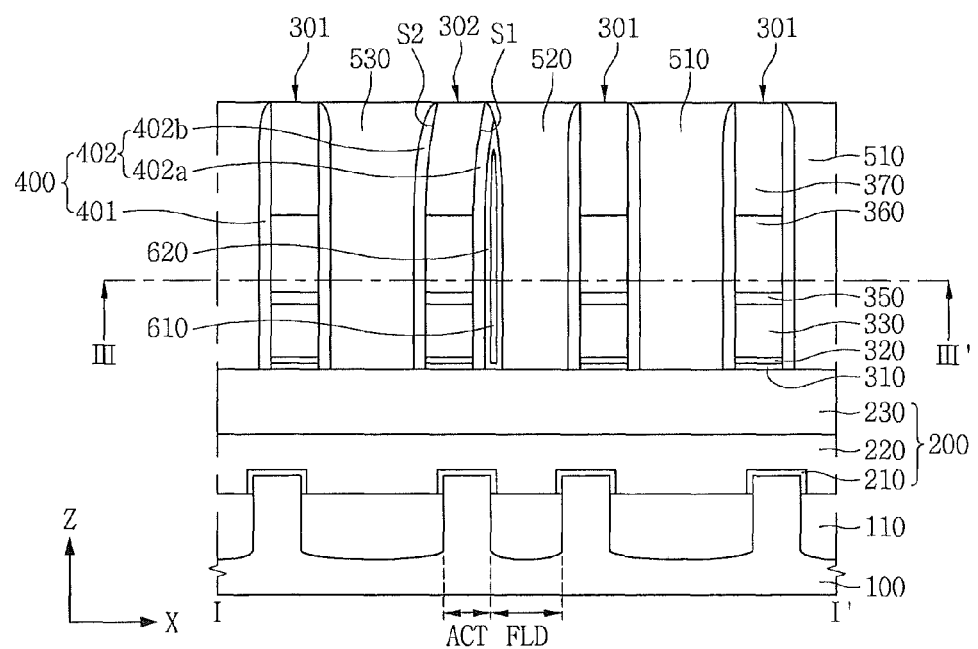
Figure 21B:
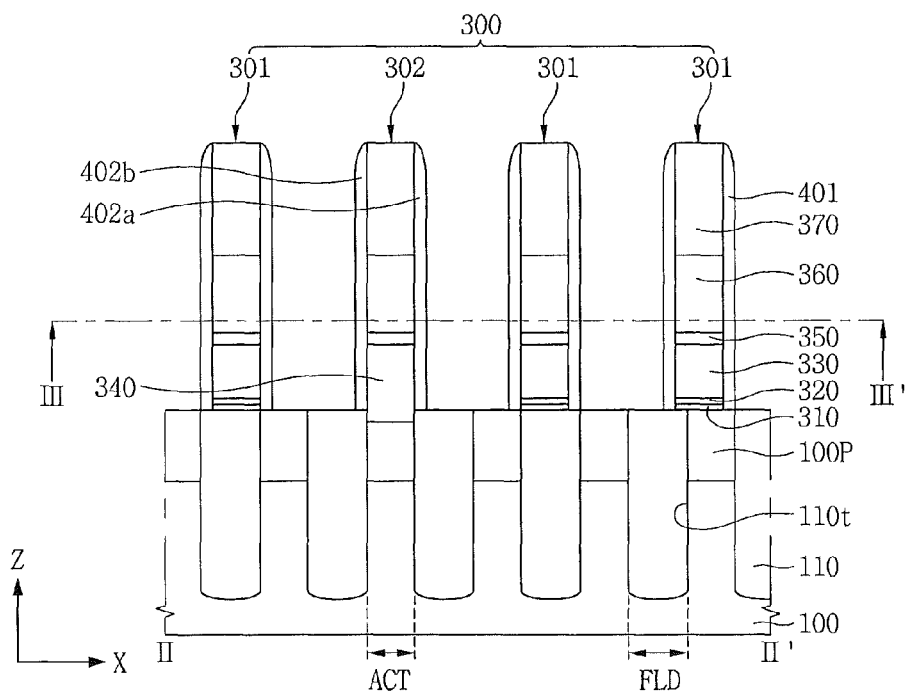
Figure 21C:
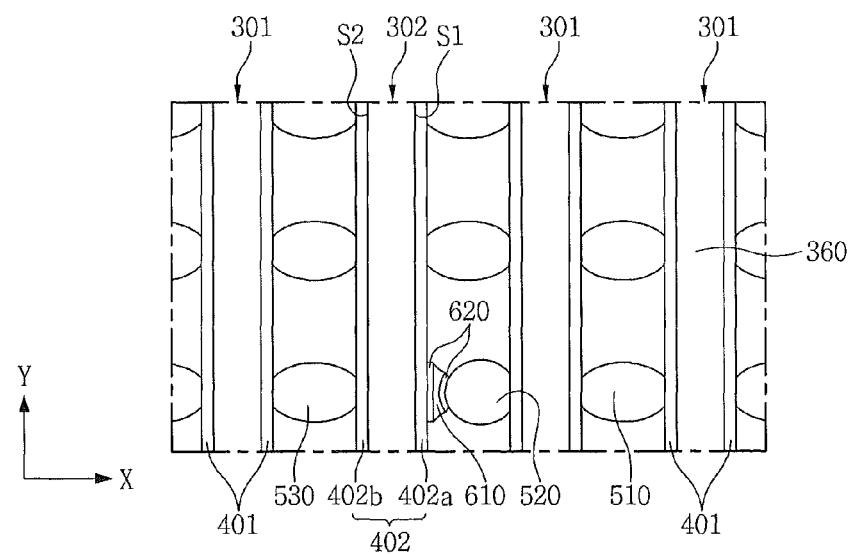

Referring to FIGS. 21A to 21C, the method of forming the semiconductor device may further include a process of forming second plug insulators 620 in each of the empty spaces RA.

The process of forming the second plug insulators 620 may include a process of removing the middle insulating layer 621 located on the first bit line spacers 401. The process of forming the second plug insulators 620 may include a process of removing the middle insulating layer 621 that is on the first side surface spacer 402a in the region in which the upper portion of the second bit line structure 302 is not bent. The process of forming the second plug insulators 620 may include a process of removing the middle insulating layer 621 that is on the second side surface spacer 402b. The process of forming the second plug insulators 620 may include a process of removing the middle insulating layer 621 that is on side surfaces of the first to third plug isolation patterns 510 to 530 extending in the X-axis direction. The process of forming the second plug insulators 620 may include a process of removing the middle insulating layer 621 that is on the upper surface of the first to third plug isolation patterns 510 to 530. For example, the process of forming the second plug insulators 620 may include a process of wet-etching the middle insulating layer 621.

Figure 22A:
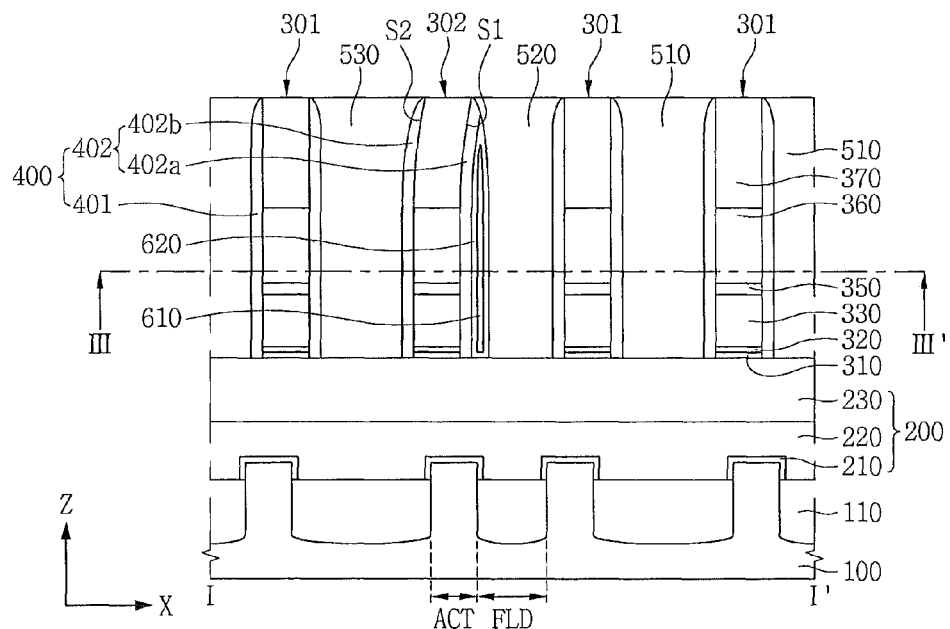
Figure 22B:
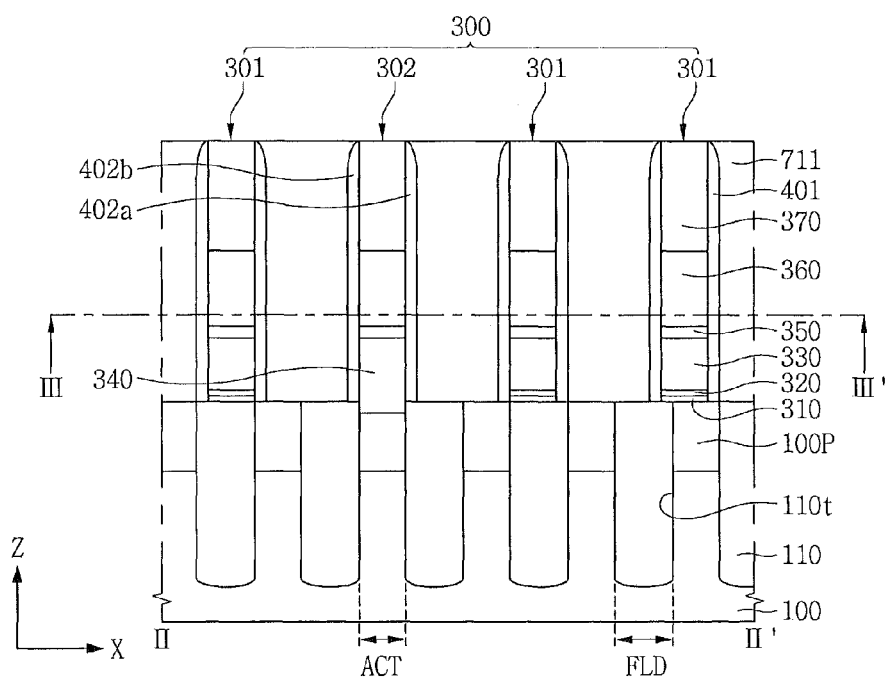
Figure 22C:
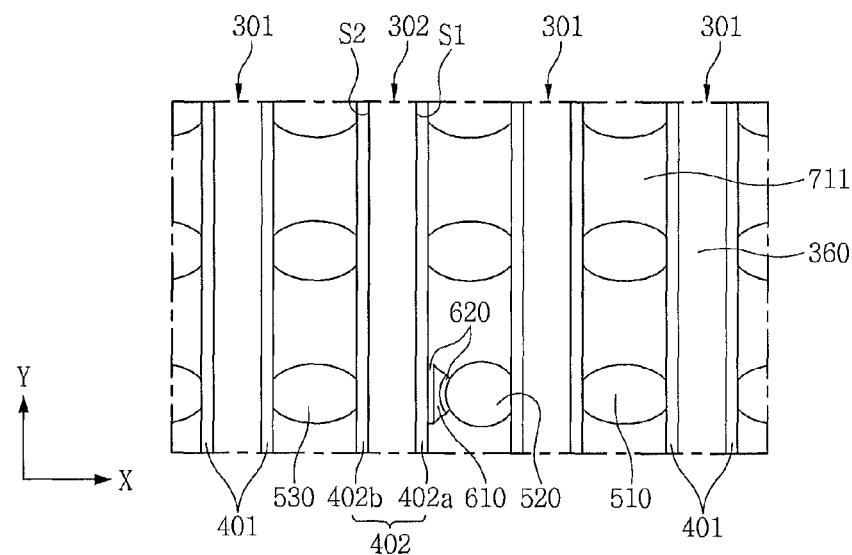

Referring to FIGS. 22A to 22C, the method of forming the semiconductor device may further include a process of forming a lower plug conductive pattern 711 on the semiconductor substrate 100 including the first plug insulators 610 and the second plug insulators 620.

The process of forming the lower plug conductive pattern 711 may include a process of filling spaces between the bit line spacers 400, the first to third plug isolation patterns 510 to 530, the first plug insulators 610 and the second plug insulators 620 with a conductive material. For example, the process of forming the lower plug conductive pattern 711 may include a process of filling spaces between the bit line spacers 400, the first to third plug isolation patterns 510 to 530, the first plug insulators 610 and the second plug insulators 620 with polysilicon.

Figure 23A:
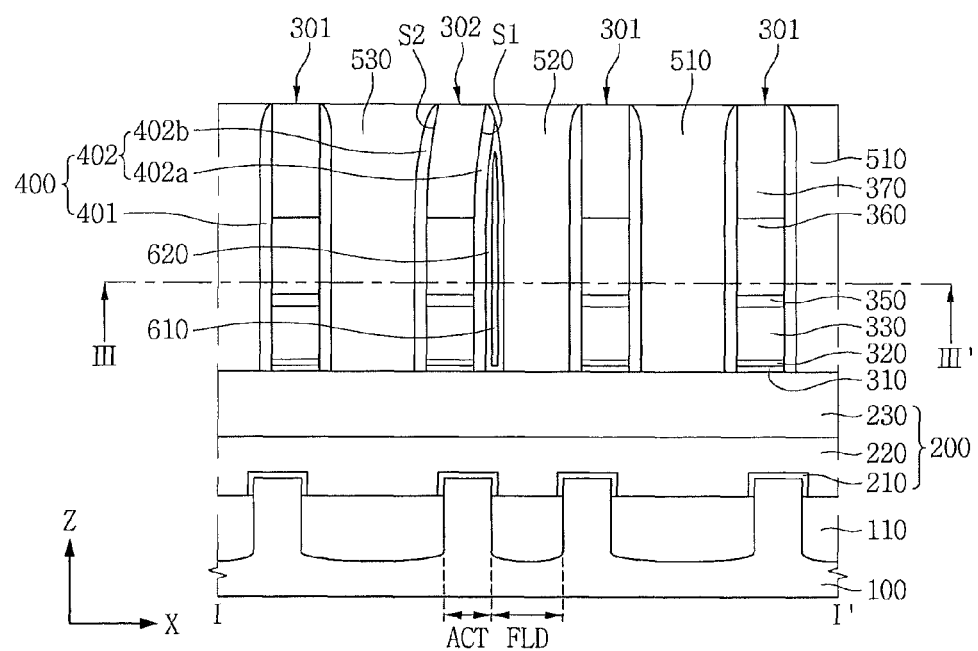
Figure 23B:
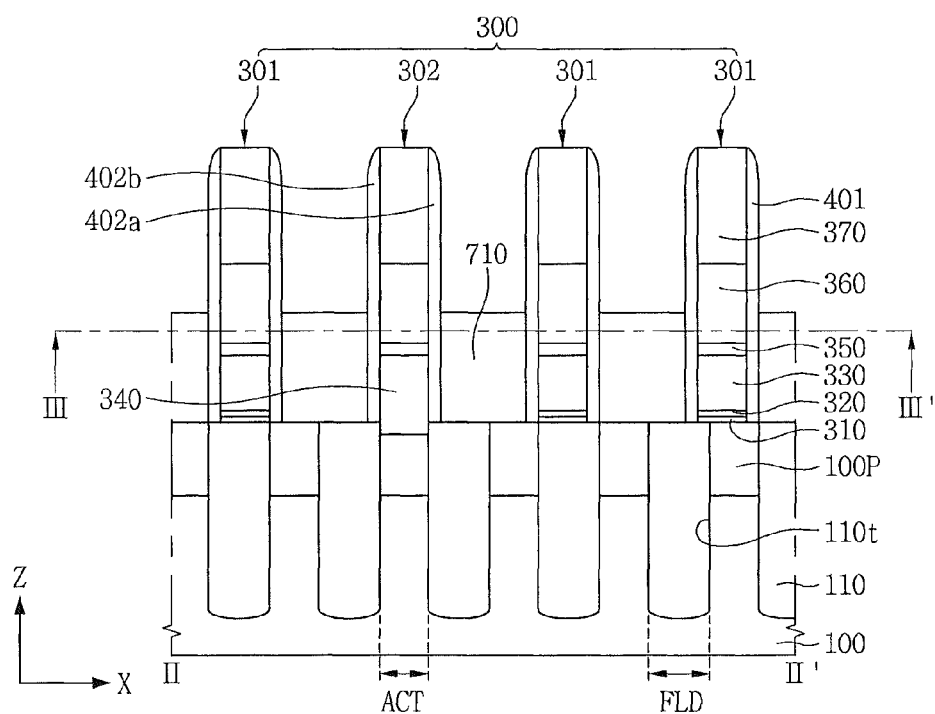
Figure 23C:
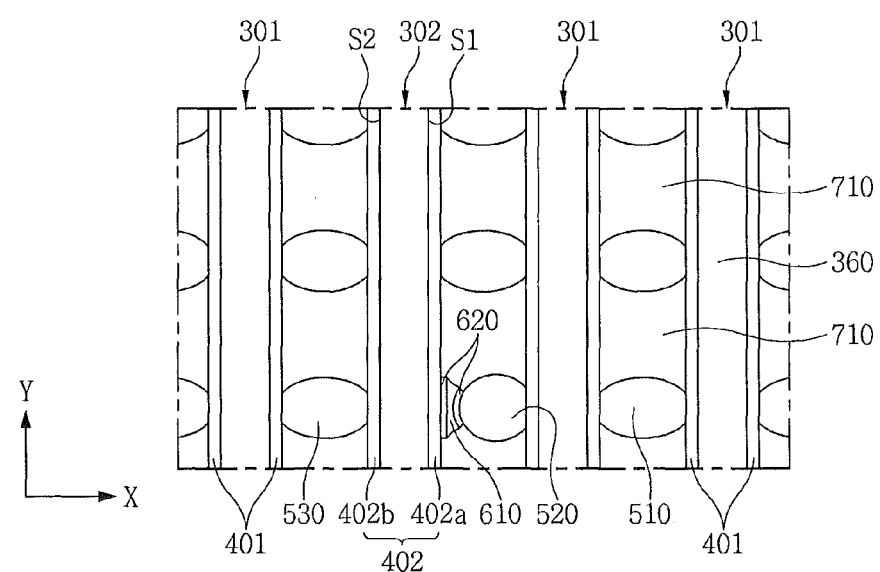

Referring to FIGS. 23A to 23C, the method of forming the semiconductor device may further include a process of forming lower contact plugs 710 among the bit line spacers 400, the first to third plug isolation patterns 510 to 530, the first plug insulators 610 and the second plug insulators 620.

The process of forming the lower contact plugs 710 may include a process of performing an etch-back of the lower plug conductive pattern 711. For example, process of the forming the lower contact plugs 710 may include a process of performing an etch-back of the lower plug conductive pattern 711 so that upper surfaces of the lower contact plugs 710 are lower than upper surface of the upper bit line electrodes 360.

Referring to FIGS. 2A to 2C, the method of forming the semiconductor device may further include a process of forming storage contact plugs 700 among the bit line spacers 400, the first to third plug isolation patterns 510 to 530, the first plug insulators 610 and the second plug insulators 620.

The process of forming the storage contact plugs 700 may include forming upper contact plugs 720 on the lower contact plugs 710.

The process of forming the upper contact plug 720 may include a process of forming the upper contact plugs 720 with a conductive material. For example, the process of forming the upper contact plugs 720 may include a process of forming the upper contact plugs 720 with a metal such as tungsten.

FIGS. 24A to 31A and 24B to 31B are cross-sectional views sequentially illustrating a method of fabricating a semiconductor device in accordance with an embodiment of the inventive concepts.

Figure 24A:
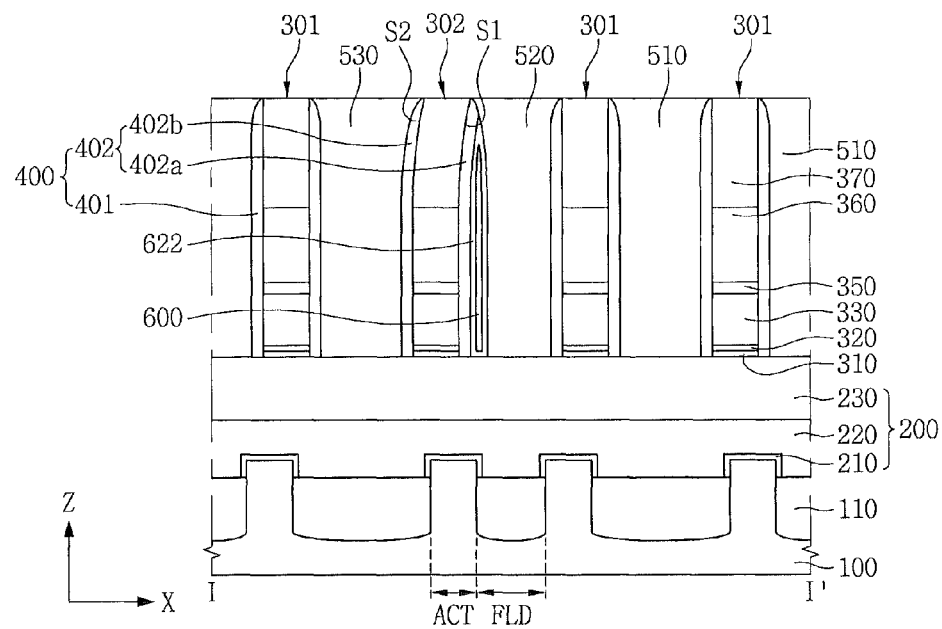
Figure 24B:
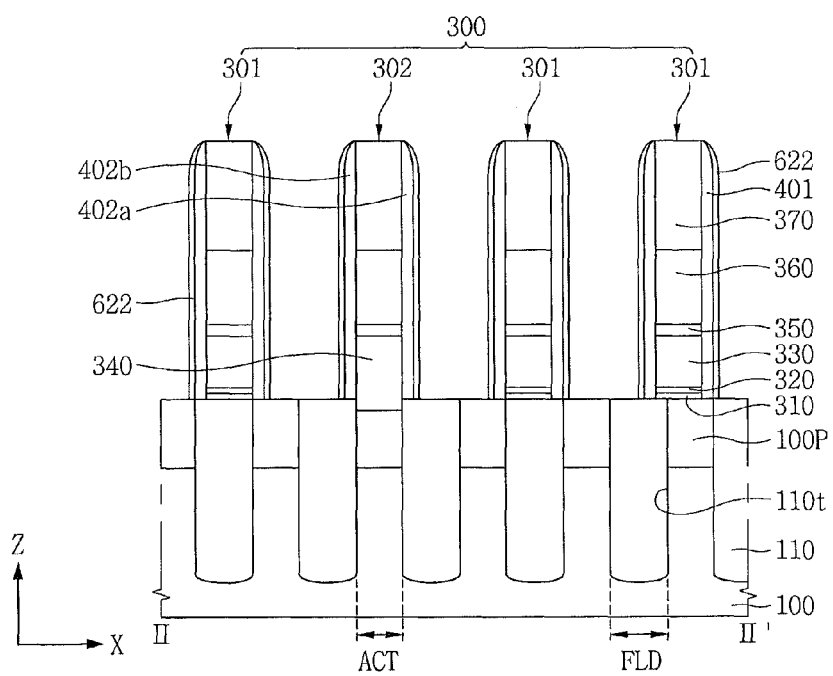

The method of forming the semiconductor device in accordance with an embodiment of the inventive concept will be explained with reference to FIGS. 3A to 3C, 24A to 31A and 24B to 31B, First, referring to FIGS. 24A to 24C, the method of forming the semiconductor device may include a process of forming gate structures 200 in a semiconductor substrate 100 including active regions ACT and field regions FLD, a process of forming bit line structures 300 including first bit line structures 301 and a second bit line structure 302 on the semiconductor substrate 100, a process of forming bit line spacers 400 on side surfaces of the bit line structures 300, a process of forming first plug isolation patterns 510, second plug isolation patterns 520 and third plug isolation patterns 530 between the bit line spacers 400, a process of forming a middle insulating layer on the semiconductor substrate 100 including the first to third plug isolation patterns 510 to 530, a process of forming plug insulators 600 between the second bit line structure 302 and the second plug isolation patterns 520 and a process of forming sacrificial spacers 622 using the middle insulating layer.

The process of forming the sacrificial spacers 622 may include a process of etching the middle insulating layer extending along an upper surface of the semiconductor substrate 100. The process of forming the sacrificial spacers 622 may include a process of etching the middle insulating layer that is on upper surfaces of the first to third plug isolation patterns 510 to 530. For example, the process of forming the sacrificial spacers 622 may include performing a dry etching process on the middle insulating layer.

Figure 25A:
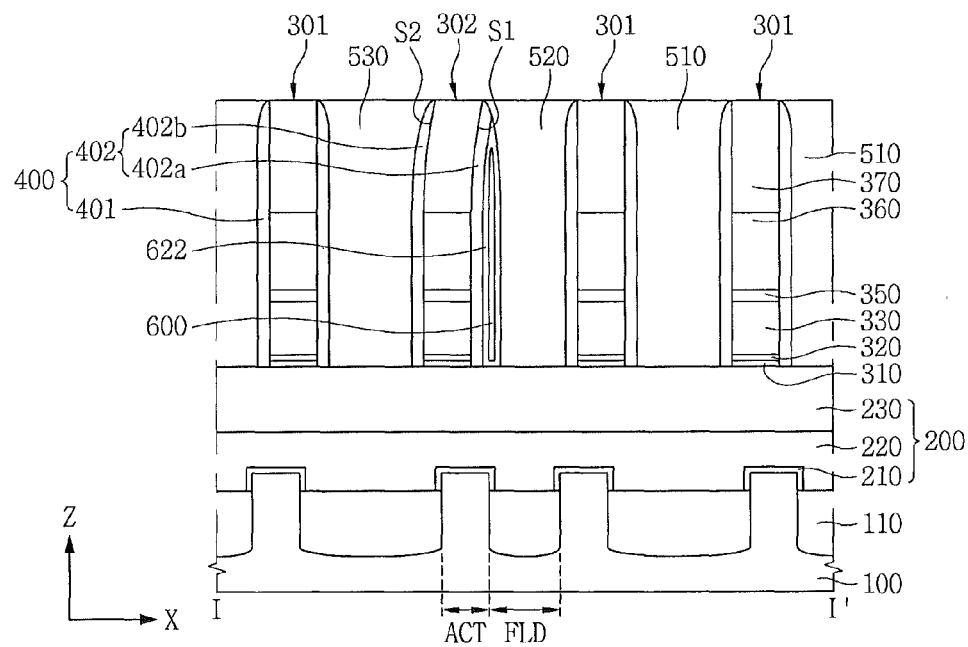
Figure 25B:
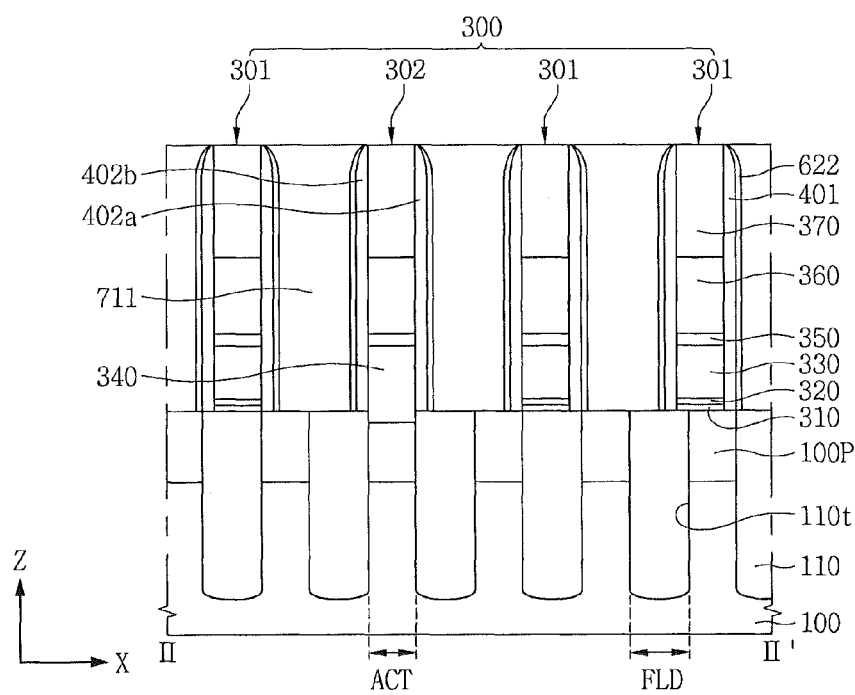

Referring to FIGS. 25A to 25C, the method of forming the semiconductor device may further include a process of forming a lower plug conductive pattern 711 on the semiconductor substrate 100 including the sacrificial spacers 622 and the plug insulators 600.

The process of forming the lower plug conductive pattern 711 may include a process of filling spaces between the first to third plug isolation patterns 510 to 530, the sacrificial spacers 622 and the plug insulators 600 with a conductive material.

Figure 26A:
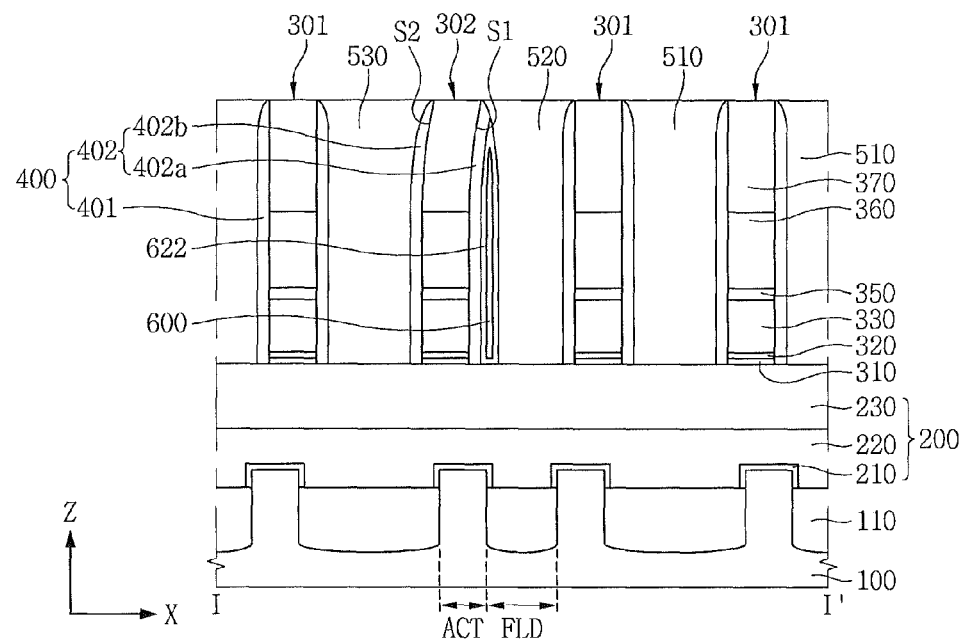
Figure 26B:
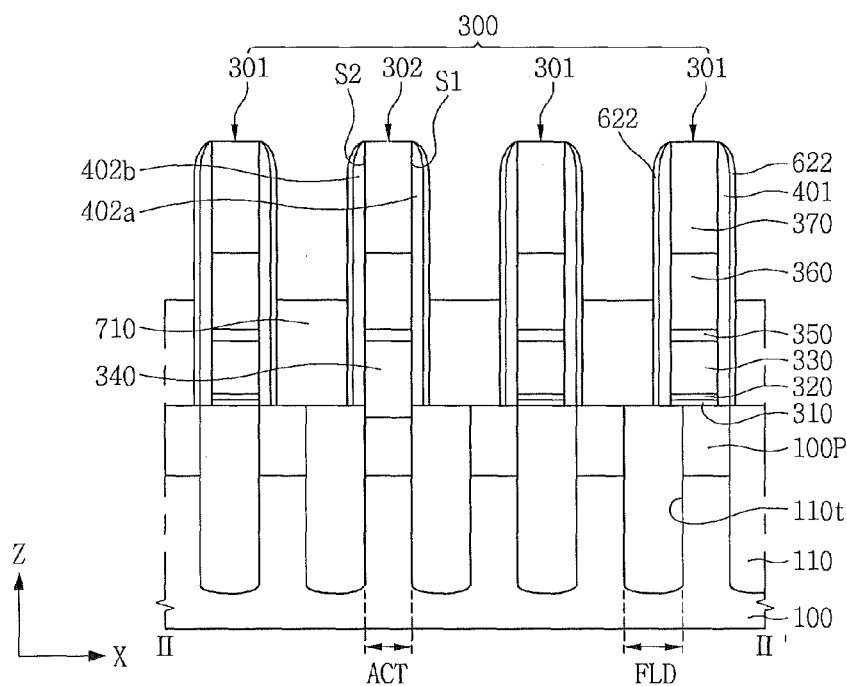

Referring to FIGS. 26A to 26C, the method of forming the semiconductor device may further include a process of forming lower contact plugs 710 among the first to third plug isolation patterns 510 to 530, the sacrificial spacers 622 and the plug insulators 600.

The process of forming the lower contact plugs 710 may include a process of performing an etch-back process on the lower plug conductive pattern 711.

Figure 27A:
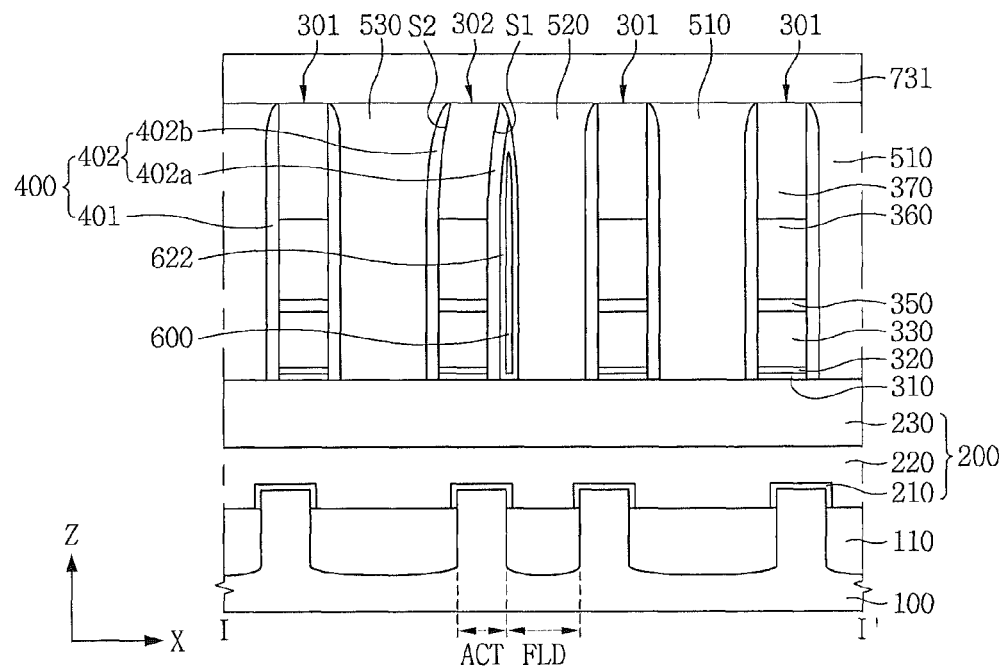
Figure 27B:
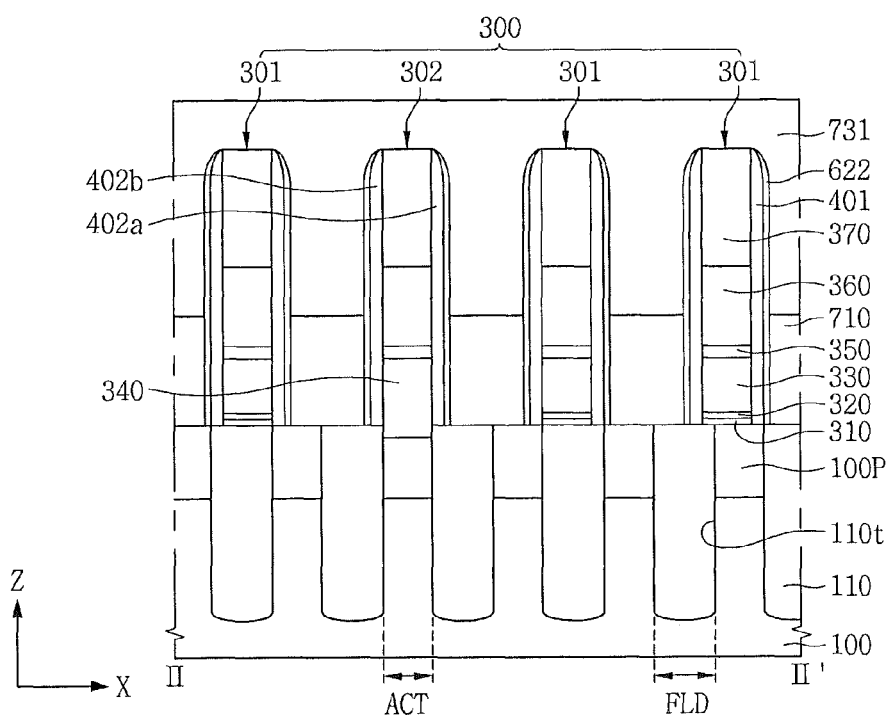

Referring to FIGS. 27A to 27C, the method of forming the semiconductor device may further include a process of forming an upper plug conductive layer 731 on the semiconductor substrate 100 including the lower contact plugs 710.

The process of forming the upper plug conductive layer 731 may include a process of covering upper surfaces of the lower contact plugs 710 with the upper plug conductive layer 731. The process of forming the upper plug conductive layer 731 may include a process of covering the sacrificial spacers 622 with the upper plug conductive layer 731. The process of forming the upper plug conductive layer 731 may include a process of covering upper surfaces of the bit line structures 300 with the upper plug conductive layer 731. The process of forming the upper plug conductive layer 731 may include a process of covering upper surfaces of the first to third plug isolation patterns 510 to 530 with the upper plug conductive layer 731.

The process of forming the upper plug conductive layer 731 may include a process of forming the upper plug conductive layer 731 with a conductive material. For example, the process of forming the upper plug conductive layer 731 may include a process of forming the upper plug conductive layer 731 with a metal such as tungsten.

Figure 28A:
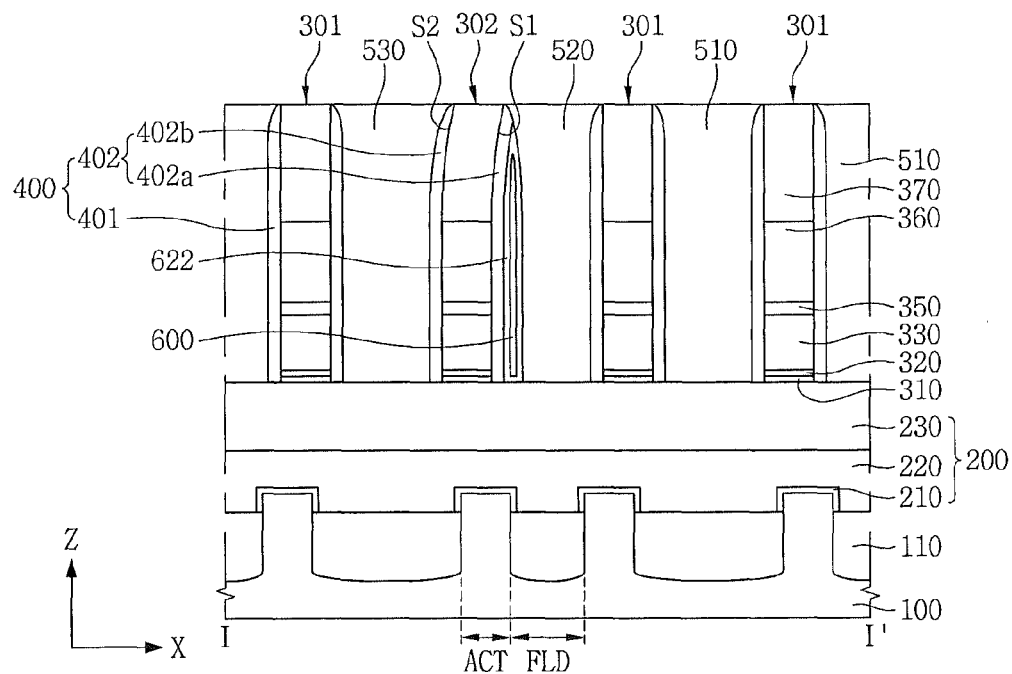
Figure 28B:
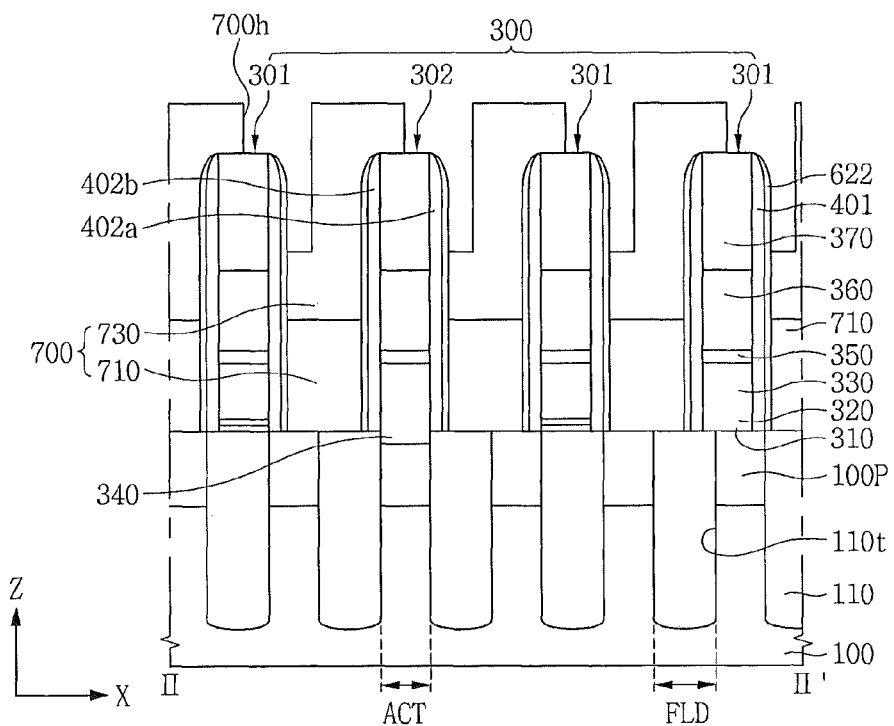

Referring to FIGS. 28A to 28C, the method of forming the semiconductor device may further include a process of forming upper contact plugs 730 on the lower contact plugs 710. The lower contact plugs 710 and the upper contact plugs 730 may configure the storage contact plugs 700.

The process of forming the upper contact plugs 730 may include a process of patterning the upper plug conductive layer 731.

The process of patterning the upper plug conductive layer 731 may include a process of etching the upper plug conductive layer 731 until upper surfaces of the first to third plug isolation patterns 510 to 530 are exposed. The process of patterning the upper plug conductive layer 731 may include a process of etching the upper plug conductive layer 731 until partially exposing upper surfaces of the bit line structures 300. The process of patterning the upper plug conductive layer 731 may include a process of etching the upper plug conductive layer 731 until upper portions of sacrificial spacers 622 that are on one side surface of each of bit line structures 300 are exposed.

Figure 29A:
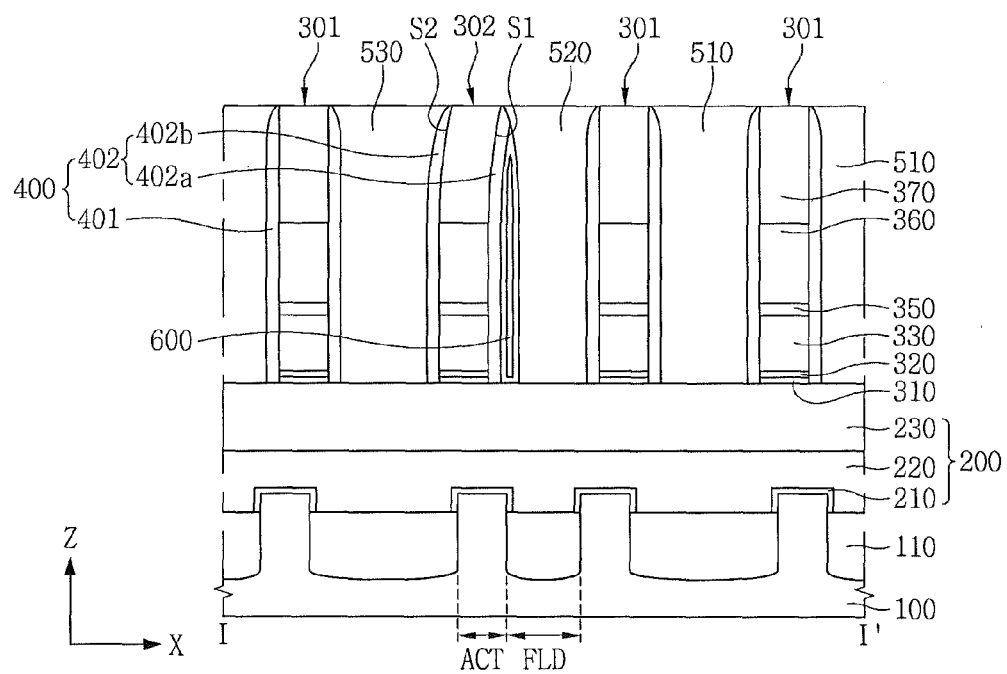
Figure 29B:
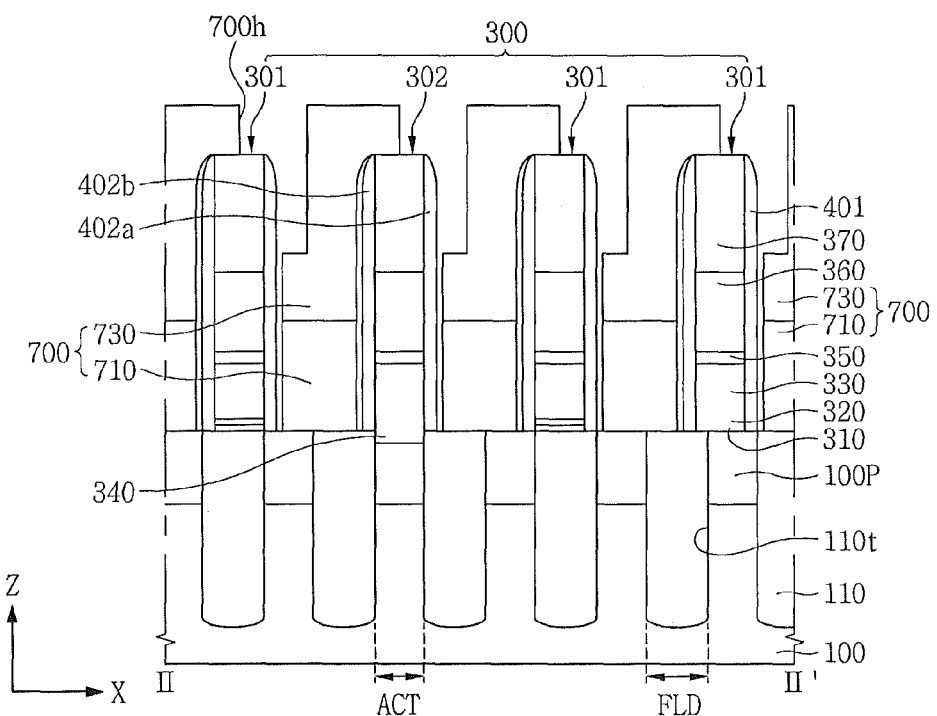

Referring to FIGS. 29A to 29B, the method of forming the semiconductor device may further include a process of removing the sacrificial spacers 622.

The process of removing the sacrificial spacers 622 may include a process of removing the sacrificial spacers 622 using an etch selectivity with respect to the bit line spacers 400 and the plug insulators 600. For example, the process of removing the sacrificial spacers 622 may include performing a wet etching process on the sacrificial spacers 622.

Figure 30A:
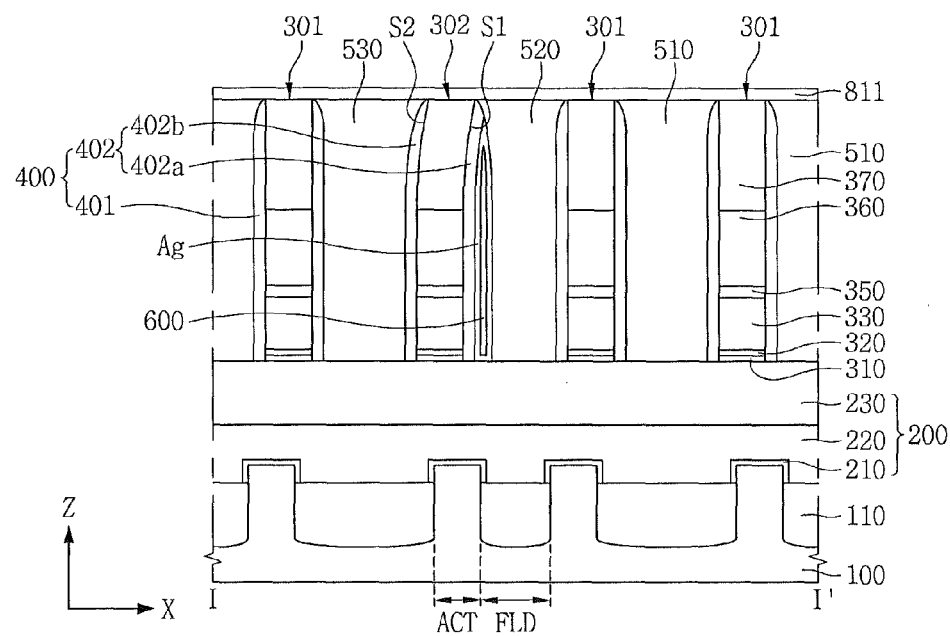
Figure 30B:
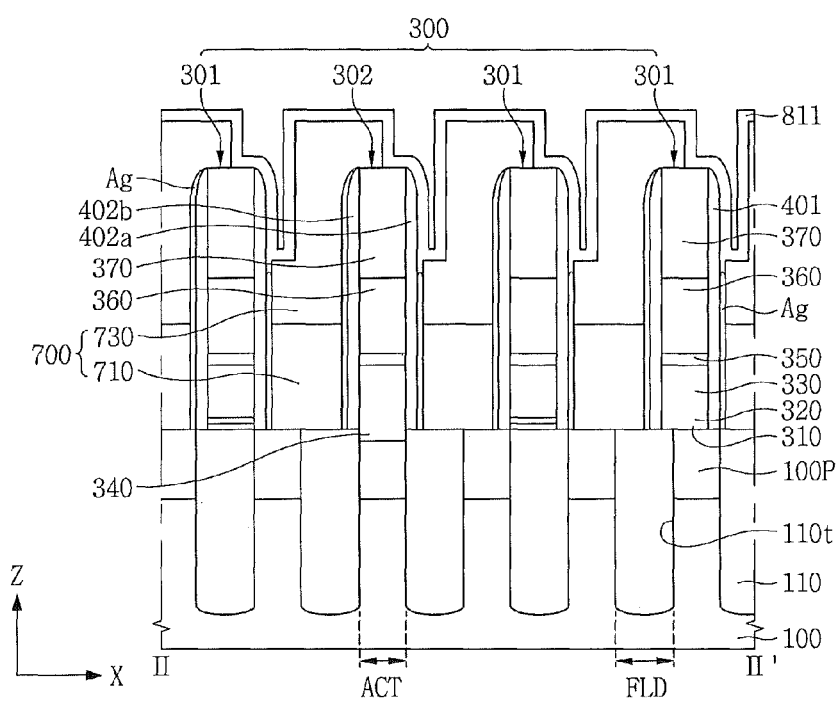

Referring to FIGS. 30A to 30B, the method of forming the semiconductor device may further include a process of forming an air gap Ag in a region in which the sacrificial spacers 622 are removed.

The process of forming the air gap Ag may include a process of forming a lower interlayer insulating layer 811 on the semiconductor substrate 100 in which the sacrificial spacers 622 are removed.

The process of forming the lower interlayer insulating layer 811 may include a process of covering surfaces of the upper contact plugs 730 with the lower interlayer insulating layer 811. The process of forming the lower interlayer insulating layer 811 may include a process of covering surfaces of the bit line spacers 400 exposed by the upper contact plugs 730 with the lower interlayer insulating layer 811. The process of forming the lower interlayer insulating layer 811 may include a process of covering upper surfaces of the bit line structures 300 that are exposed by the upper contact plugs 730 with the lower interlayer insulating layer 811. The process of forming the lower interlayer insulating layer 811 may include a process of covering upper surfaces of the first to third plug isolation patterns 510 to 530 with the lower interlayer insulating layer 811.

The process of forming the lower interlayer insulating layer 811 may include a process of forming the lower interlayer insulating layer 811 with an insulating material. For example, the process of forming the lower interlayer insulating layer 811 may include a process of forming the lower interlayer insulating layer 811 with silicon nitride.

Figure 31A:
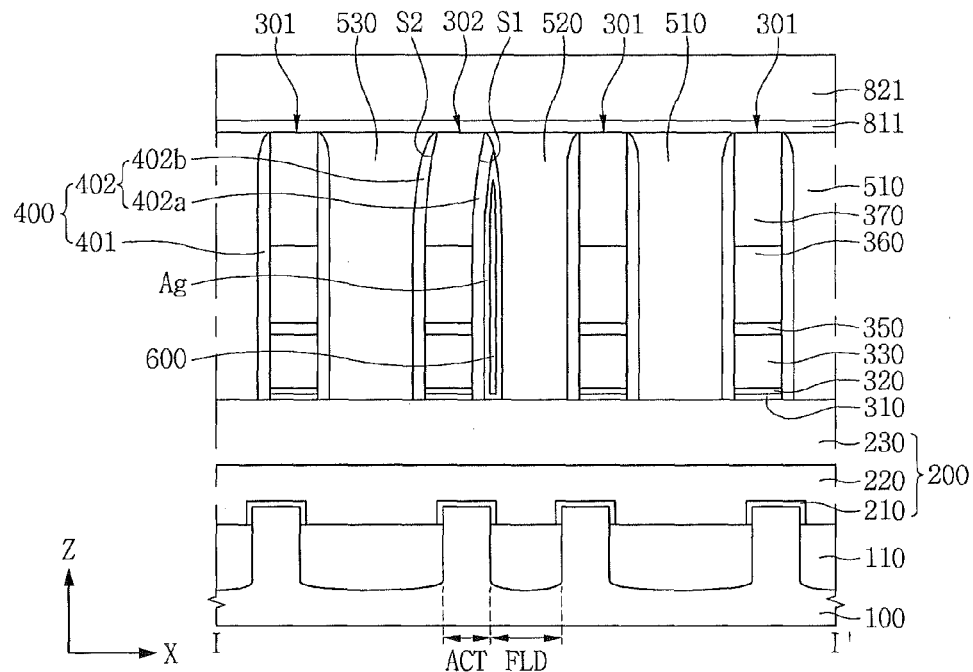
Figure 31B:
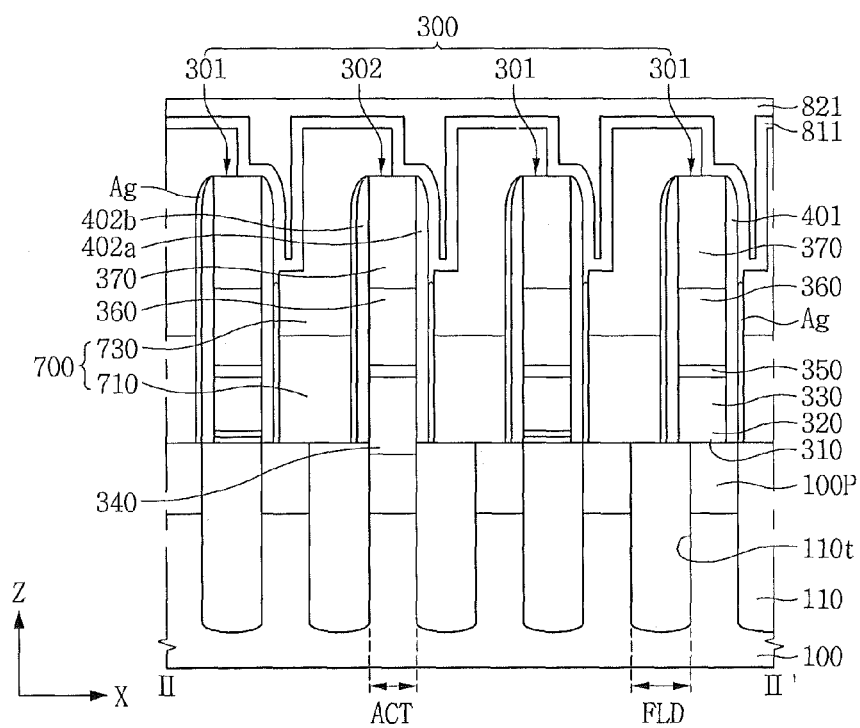

Referring to FIGS. 31A to 31B, the method of forming the semiconductor device may further include a process of forming an upper interlayer insulating layer 821 on the lower interlayer insulating layer 811.

The process of forming the upper interlayer insulating layer 821 may include a process of filling spaces between the upper contact plugs 730 with an insulating material. The insulating material may be a harder material than the lower interlayer insulating layer 811.

Referring to FIGS. 3A to 3C, the method of forming the semiconductor device may further include a process of forming interlayer insulating patterns 800 between the upper contact plugs 730.

The process of forming the interlayer insulating patterns 800 may include a process of forming lower interlayer insulating patterns 810 and a process of forming upper interlayer insulating patterns 820. For example, the process of forming the interlayer insulating patterns 800 may include performing a planarization process on the lower interlayer insulating layer 811 and the upper interlayer insulating layer 821 to expose upper surfaces of the storage contact plugs 700.

Figure 32:
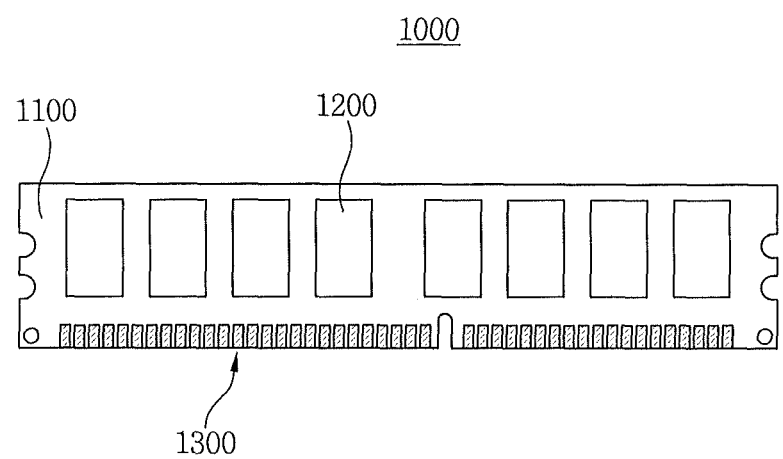
FIG. 32 is a block diagram illustrating a memory module that includes a semiconductor device in accordance with the inventive concepts.

FIG. 32 is a block diagram illustrating a memory module including a semiconductor device in accordance with embodiments of the inventive concepts.

Referring to FIG. 32, the memory module 1000 may include a module substrate 1100, semiconductor packages 1200 and module contact terminals 1300. The module substrate 1100 may be a system board. The semiconductor packages 1200 may be disposed on the module substrate 1100. The semiconductor packages 1200 may be disposed on both sides of the module substrate 1100. The module contact terminals 1300 may be formed in a line on one edge of the module substrate 1100. The module contact terminals 1300 may be electrically connected to the semiconductor packages 1200.

The semiconductor packages 1200 may include a semiconductor device in accordance with various embodiments of the inventive concept. Therefore, reliability of the semiconductor packages 1200 may be improved in the memory module 1000.

Figure 33:
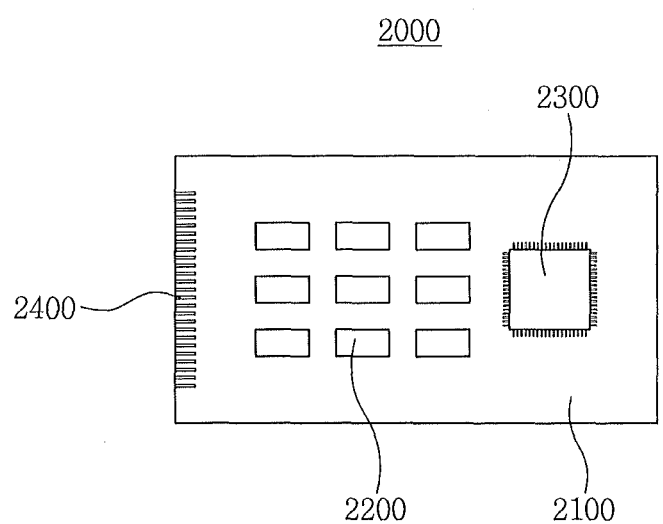
FIG. 33 is a block diagram illustrating a semiconductor module that includes a semiconductor device in accordance with the inventive concepts.

FIG. 33 is a block diagram illustrating a semiconductor module including a semiconductor device in accordance with the inventive concept.

Referring to FIG. 33, the semiconductor module 2000 may include a module substrate 2100, memories 2200, a microprocessor 2300 and input/output terminals 2400. The microprocessor 2300 and the input/output terminals 2400 may be installed on the module substrate 2100. The semiconductor module 2000 may include a memory card or card package.

The memories 2200 and/or the microprocessor 2300 may include semiconductor devices in accordance with various embodiments of the inventive concepts. Therefore, reliability of the memories 2200 and/or the microprocessor 2300 may be improved in the semiconductor module 2000.

Figure 34:
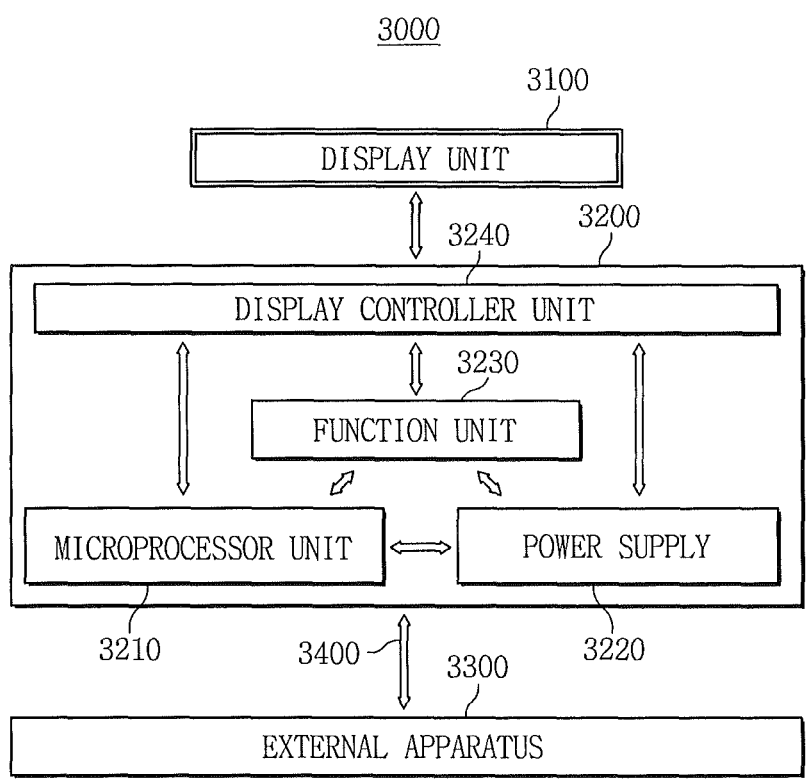
FIG. 34 is a block diagram illustrating a mobile system that includes a semiconductor device in accordance with the inventive concepts.

FIG. 34 is a block diagram illustrating a mobile system including a semiconductor device in accordance with embodiments of the inventive concepts.

Referring to FIG. 34, the mobile system 3000 may include a display unit 3100, a body unit 3200 and an external apparatus 3300. The body unit 3200 may include a microprocessor 3210, a power supply 3220, a function unit 3230 and a display controller 3240.

The display unit 3100 may be electrically connected to the body unit 3200. The display unit 3100 may be electrically connected to the display controller 3240 of the body unit 3200. The display unit 3100 may embody an image processed by the display controller 3240 of the body unit 3200.

The body unit 3200 may be a system board or mother board including a printed circuit board (PCB). The microprocessor 3210, the power supply 3220, the function unit 3230 and the display controller 3240 may be installed or mounted on system board or mother board.

The microprocessor 3210 may receive a voltage from the power supply 3220 and control the function unit 3230 and the display controller 3240. The power supply 3220 may receive a predetermined voltage from an external power source, divide the predetermined voltage into various voltage levels, and transmit the divided voltages to the microprocessor 3210, the function unit 3230, the display controller 3240, etc.

The power supply 3220 may include a power management IC (PMIC). The PMIC may efficiently supply a voltage to the microprocessor 3210, the function unit 3230, the display controller 3240, etc.

The function unit 3230 may perform various function of the mobile system 3000. For example, the function unit 3230 may include various components capable of performing wireless communication functions, such as output of an image on the display unit 3100 or output of an audio signal to a speaker, by dialing or communication with an external apparatus 3300. For example, the function unit 3230 may serve as an image processor of a camera.

When the mobile system 3000 is connected to a memory card to increase capacity, the function unit 3230 may serve as a memory card controller. When the mobile system 3000 further includes a universal serial bus (USB) to increase capacity, the function unit 3230 may serve as an interface controller.

The microprocessor 3210, the power supply 3220 and the function unit 3230 may include the semiconductor device in accordance with various embodiments of the inventive concepts. Therefore, reliability may be improved in the mobile system 3000 in accordance with an embodiment of the inventive concepts.

Figure 35:
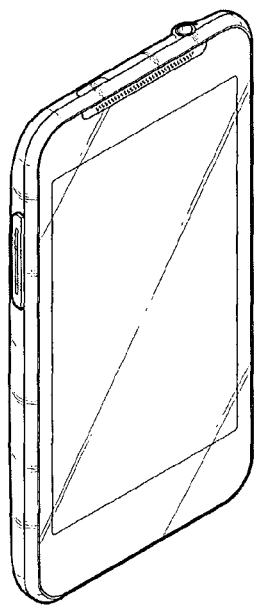
FIG. 35 is a schematic view illustrating a mobile device that includes a semiconductor device in accordance with the inventive concepts.

FIG. 35 is a schematic view illustrating a mobile device including a semiconductor device in accordance with embodiments of the inventive concepts.

Referring to FIG. 35, the mobile device 4000 may be a mobile wireless phone. The mobile device 4000 may be a tablet PC. The mobile device 4000 may include the semiconductor device in accordance with various embodiments of the inventive concepts. Therefore, reliability may be improved in the mobile device 4000 in accordance with an embodiment of the inventive concepts.

Figure 36:
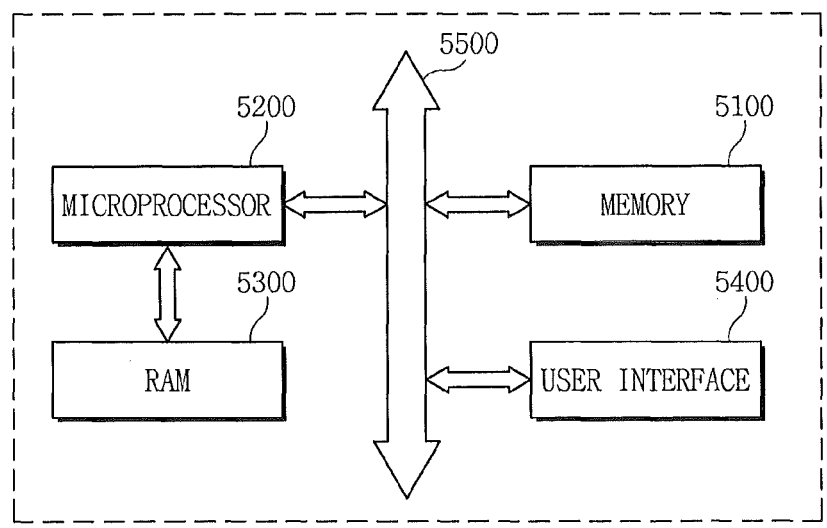
FIG. 36 is a block diagram illustrating an electronic system that includes a semiconductor device in accordance with the inventive concepts.

FIG. 36 is a block diagram illustrating an electronic system including a semiconductor device in accordance with embodiments of the inventive concepts.

Referring to FIG. 36, the electronic system 5000 may include a memory 5100, a microprocessor 5200, a random access memory (RAM) 5300 and a user interface 5400. The electronic system 5000 may be a system such as an LED lighting device, a refrigerator, an air conditioner, an industrial cutter, a welding machine, a vehicle, a vessel, an airplane, a satellite, etc.

The memory 5100 may store booting codes of the microprocessor 5200, data processed by the microprocessor 5200, and/or external input data. The memory 5100 may include a controller.

The electronic system 5000 may be programmed and controlled by the microprocessor 5200. The RAM 5300 may be used as an operating memory of the microprocessor 5200.

The user interface 5400 may perform data communication using a bus 5500. The user interface 5400 may be used for data input into the electronic system 5000 or data output from the electronic system 5000.

The memory 5100, the microprocessor 5200 and/or the RAM 5300 may include semiconductor devices in accordance with various embodiments of the inventive concepts. Therefore, reliability of the memory 5100, the microprocessor 5200 and/or the RAM 5300 may be improved in the electronic system 5000 in accordance with an embodiment of the inventive concepts.

In a semiconductor device and a method of fabricating the same according to embodiments of the inventive concepts, a plug insulator may be located in a region in which a plug isolation pattern is not formed by an increased aspect ratio of bit line structures. Therefore, in the semiconductor device and the method of fabricating the same according to technical aspects of the inventive concept, a tendency for electrical connections to be made between adjacent storage contact plugs due to an increase in the aspect ratio of the bit line structures can be reduced or prevented. Thus, reliability can be improved with respect to highly integrated semiconductor devices according to embodiments of the inventive concepts.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a first bit line structure extending in a first direction;
a second bit line structure extending in the first direction, the second bit line structure spaced apart from the first bit line structure in a second direction that is different from the first direction;
a storage contact plug between the first bit line structure and the second bit line structure;
a first plug insulator between the first bit line structure and the second bit line structure, the first plug insulator directly contacting a first side surface of the storage contact plug that extends in the second direction and not directly contacting a second side surface of the storage contact plug that extends in the second direction, the second side surface being opposite the first side surface; and
a plug isolation pattern between the first bit line structure and the first plug insulator,
wherein the first plug insulator and the plug isolation pattern are adjacent each other along the second direction and the storage contact plug and the plug isolation pattern are adjacent each other along the first direction wherein the plug isolation pattern directly contacts the first side surface of the storage contact plug and wherein a profile of a side surface of the first plug insulator that directly contacts the storage contact plug is different from a profile of a side surface of the plug isolation pattern that directly contacts the storage contact plug.

2. The semiconductor device of claim 1, wherein the first plug insulator includes a first side surface facing the second bit line structure and a second side surface facing the plug isolation pattern, and a length in the first direction of a first side surface of the first plug insulator is greater than a length in the first direction of a second side surface of the first plug insulator.

3. The semiconductor device of claim 1, wherein the first plug insulator has a first length in the second direction and the plug isolation pattern has a second length in the second direction that is greater than the first length.

4. The semiconductor device of claim 1, further comprising:
a first bit line spacer on a side surface of the first bit line structure; and
a second bit line spacer on a side surface of the second bit line structure,
wherein the plug isolation pattern is in direct contact with the first bit line spacer, and the first plug insulator is spaced apart from the plug isolation pattern and the second bit line spacer, and
wherein the storage contact plug directly contacts both the first bit line spacer and the second bit line spacer.

5. The semiconductor device of claim 4, wherein a first distance in the second direction between the first plug insulator and the plug isolation pattern is the same as a second distance in the second direction between the first plug insulator and the second bit line spacer.

6. The semiconductor device of claim 4, further comprising:
a second plug insulator configured to fill a first space between the first plug insulator and the plug isolation pattern and a second space between the first plug insulator and the second bit line spacer,
wherein an etch rate of the second plug insulator is different than an etch rate of the first plug insulator.

7. The semiconductor device of claim 6, wherein the storage contact plug is in contact with the plug isolation pattern and the second plug insulator, and wherein a profile of a side surface of the plug isolation pattern that is in contact with the storage contact plug is different than a profile of a side surface of the second plug insulator that is in contact with the storage contact plug.

8. A semiconductor device, comprising:
a first bit line structure on a semiconductor substrate;
a first bit line spacer on a side surface of the first bit line structure;
a second bit line structure on the semiconductor substrate that is spaced apart from the first bit line structure, an upper portion of at least part of the second bit line structure that extends farther above an upper surface of the semiconductor substrate than a lower portion of the second bit line structure being bent toward the first bit line structure to be closer to the first bit line structure than is at least part of the lower portion of the second bit line structure;
a second bit line spacer on a side surface of the second bit line structure;
a plug isolation pattern between the first bit line spacer and the second bit line spacer; and
a plug insulator between the second bit line spacer and the plug isolation pattern,
wherein an upper surface of the plug isolation pattern and an upper surface of the second bit line spacer are farther above an upper surface of the semiconductor substrate than is an upper surface of the plug insulator.

9. The semiconductor device of claim 8, wherein the upper surface of the plug isolation pattern is coplanar with the upper surface of the second bit line structure.

10. The semiconductor device of claim 8, wherein a lower surface of the plug insulator is farther above an upper surface of the semiconductor substrate than is a lower surface of the plug isolation pattern.

11. The semiconductor device of claim 10, wherein the lower surface of the plug isolation pattern is substantially coplanar with an upper surface of the semiconductor substrate.

12. The semiconductor device of claim 10, wherein the plug insulator is spaced apart from the plug isolation pattern, and wherein a horizontal distance between the plug insulator and the plug isolation pattern is the same as a vertical distance between an upper surface of the semiconductor substrate and the plug insulator.

13. The semiconductor device of claim 12,
wherein the second bit line spacer is spaced apart from the plug insulator, and
wherein a horizontal distance between the plug insulator and the second bit line spacer is the same as a vertical distance between the upper surface of the semiconductor substrate and the plug insulator.

14. The semiconductor device of claim 8, further comprising a storage contact plug, wherein both the plug isolation pattern and the plug insulator directly contact the storage contact plug.

15. A semiconductor device, comprising:
a first bit line structure that extends along an upper surface of a semiconductor substrate in a first direction and that extends upwardly from the upper surface of the semiconductor substrate;
a second bit line structure that extends along the upper surface of the semiconductor substrate in the first direction and that extends upwardly from the upper surface of the semiconductor substrate;

a first bit line spacer that extends along a side surface of the first bit line structure in the first direction; and a plug insulator adjacent the first bit line spacer opposite the first bit line structure, wherein an upper portion of the first bit line spacer is closer to the second bit line structure than is a lower portion of the first bit line spacer so that the upper portion of the first bit line spacer extends at least partly over an upper portion of the plug insulator that is directly underneath the first bit line spacer wherein the side surface of the first bit line structure comprises a first side surface, the semiconductor device further comprising a second bit line spacer that extends along a second side surface of the first bit line structure that is opposite the first side surface, wherein no plug insulator is provided adjacent to the second bit line spacer.

16. The semiconductor device of claim 15, further comprising:

a second bit line structure that extends along the semiconductor substrate in the first direction, the second bit line structure spaced apart from the first bit line structure;

a second bit line spacer that extends along a side surface of the second bit line structure in the first direction;

a first storage contact plug that is between the first bit line structure and the second bit line structure;

a second storage contact plug that is between the first bit line structure and the second bit line structure, the second storage contact plug spaced apart from the first storage contact plug along the first direction; and a plug isolation pattern that is between the first storage contact plug and the second storage contact plug, a first side of the plug isolation pattern being in direct contact with the second bit line spacer, wherein the first bit line structure includes a lower portion that extends upwardly along a vertical axis that is perpendicular to a plane defined by a bottom surface of the semiconductor substrate and an upper portion that leans toward the second bit line structure.

17. The semiconductor device of claim 16, wherein a second side of the plug isolation pattern that is opposite the first side directly contacts the plug insulator.

18. The semiconductor device of claim 15, wherein an air gap separates the plug isolation pattern from first storage contact plug, the second storage contact plug and the plug insulator.

* * * * *